(12) United States Patent
Yamazaki et al.

(10) Patent No.: US 9,496,330 B2
(45) Date of Patent: Nov. 15, 2016

(54) OXIDE SEMICONDUCTOR FILM AND SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Masashi Tsubuku, Atsugi (JP);
(Continued)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 81 days.

(21) Appl. No.: 14/444,789

(22) Filed: Jul. 28, 2014

(65) Prior Publication Data
US 2015/0034947 A1    Feb. 5, 2015

(30) Foreign Application Priority Data

Aug. 2, 2013  (JP) .................................. 2013-161427

(51) Int. Cl.
*H01L 29/12*  (2006.01)
*H01L 29/04*  (2006.01)
(Continued)

(52) U.S. Cl.
CPC ............. *H01L 29/045* (2013.01); *H01L 29/24* (2013.01); *H01L 29/66969* (2013.01);
(Continued)

(58) Field of Classification Search
CPC .................. H01L 29/045; H01L 29/24; H01L 29/66969; H01L 29/7869; H01L
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Thanh T Nguyen
(74) *Attorney, Agent, or Firm* — Robinson Intellectual Property Law Office; Eric J. Robinson

(57) ABSTRACT

A crystalline oxide semiconductor film which can be used as a semiconductor film of a transistor or the like is provided. In particular, a crystalline oxide semiconductor film with less defects such as grain boundaries is provided. One embodiment of the present invention is a crystalline oxide semiconductor film which is provided over a substrate and has a region including five or less areas where a transmission electron diffraction pattern showing discontinuous points is observed when an observation area is changed one-dimensionally within a range of 700 nm, using a transmission electron diffraction apparatus with an electron beam having a probe diameter of 1 nm.

20 Claims, 36 Drawing Sheets

(72) Inventors: Masashi Oota, Atsugi (JP); Koji Dairiki, Atsugi (JP); Masahiro Takahashi, Atsugi (JP)

(51) Int. Cl.
*H01L 29/24* (2006.01)
*H01L 29/786* (2006.01)
*H01L 29/66* (2006.01)
H01L 27/12 (2006.01)
H01L 21/02 (2006.01)

(52) U.S. Cl.
CPC ..... *H01L 29/7869* (2013.01); *H01L 21/02554* (2013.01); *H01L 21/02565* (2013.01); *H01L 21/02631* (2013.01); *H01L 27/1225* (2013.01); *H01L 29/78693* (2013.01)

(58) Field of Classification Search
CPC .................. 21/02554;H01L 21/02565; H01L 21/02631
USPC .......................................................... 257/43
See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,237,166 B2 | 8/2012 | Kumomi et al. |
| 8,669,556 B2 | 3/2014 | Yamazaki et al. |
| 8,680,522 B2 | 3/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280609 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2013/0009209 A1 | 1/2013 | Yamazaki |
| 2013/0075735 A1* | 3/2013 | Watanabe ......... H01L 29/78606 257/57 |
| 2014/0022480 A1* | 1/2014 | Yokoyama ........ G02F 1/133345 349/43 |
| 2014/0124776 A1 | 5/2014 | Takahashi et al. |
| 2015/0001533 A1 | 1/2015 | Kuwabara et al. |
| 2015/0008321 A1 | 1/2015 | Ohgarane et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2006-165528 A | 6/2006 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnOThin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn—Oxide TFT", SID Digest '09 SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT" AM-FPD '09 Digest of Technical Papers, Jul. 1, 2009, pp. 41-44.

Hayashi.R et al., "42.1: Invited Paper: Improved Amorphous In—Ga—Zn—O Tfts", SID Digest '08 : SID International Symposium Digest of Technical Papers, May 20, 2008, pp. 621-624.

Hirao.T et al., "Novel Top-Gate Zinc Oxide Thin-Film Transistors (ZnO TFTS) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 SID International Symposium Digest of Technical Papers, 2007, pp. 1830-1833.

Hsieh.H et al., "P-29:Modeling of Amorphous Oxide Semiconductor Thin Film Transistors and Subgap Density of States", SID Digest '08 SID International Symposium Digest of Technical Papers, May 20, 2008, pp. 1277-1280.

Ikeda.T et al., "Full-Functional System Liquid Crystal Display Using Cg-Silicon Technology", SID Digest '04 SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium—Gallium—Zinc—Oxide TFTs Array", SID Digest '08 SID International Symposium Digest of Technical Papers, May 20, 2008, vol. 39, pp. 1-4.

Jin.D et al., "65.2:Distinguished Paper:World-Largest (6.5") Flexible Full Color Top Emission AMOLED Display on Plastic Film and Its Bending Properties", SID Digest '09 SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 SID International Symposium Digest of Technical Papers, May 31, 2009, pp. 191-193.

Li.O et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

(56) References Cited

OTHER PUBLICATIONS

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev, B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 in. QVGA AMOLED Display Using In—Ga—Zn—Oxide Tfts With a Novel Passivation Layer", SID Digest '09 : SID International Symposium Digest of Technical Papers, May 31, 2009, pp. 284-287.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m <4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium—Gallium—Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-IN. AMOLED Display With Driver Circuit Using Amorphous In—Ga—Zn—Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on SrTiO3 With Sputtered A12O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kimizuka.N. et al., "Spinel,YBFE2O4, and YB2FE3O7 Types of Structures for Compounds in the In2O3 and Sc2O3—A2O3—Bo Systems [A; Fe; Ga; or Al; B: Mg, Mn, Fe, Ni, Cu,or Zn] At Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Yamazaki.S et al., "Research, Development, and Application of Crystalline Oxide Semiconductor", SID Digest '12 : SID International Symposium Digest of Technical Papers, Jun. 5, 2012, pp. 183-186.

* cited by examiner

FIG. 4A
FIG. 4B
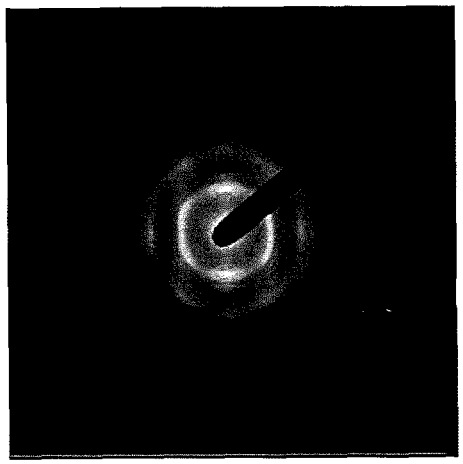 

XRD
out-of-plane method
CAAC-OS film

XRD
in-plane method
φ scan
CAAC-OS film

XRD
in-plane method
φ scan
single crystal OS film

FIG. 6A
FIG. 6B
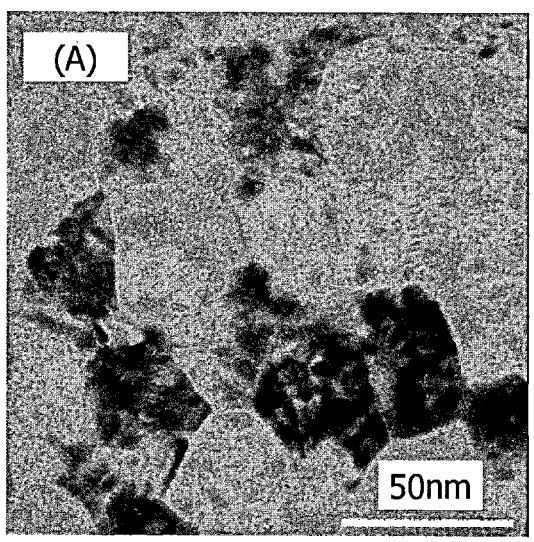
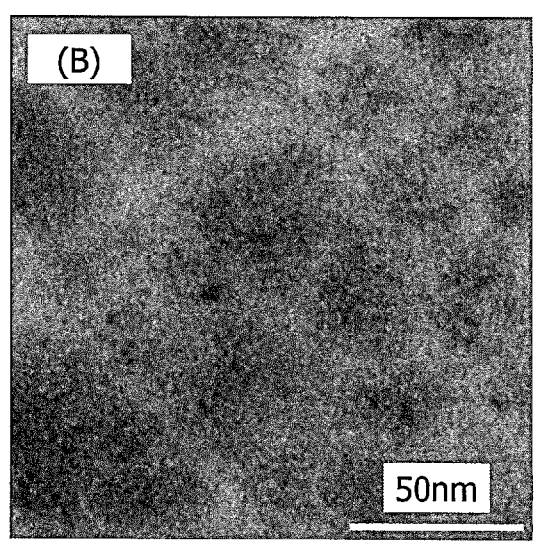

FIG. 7A1
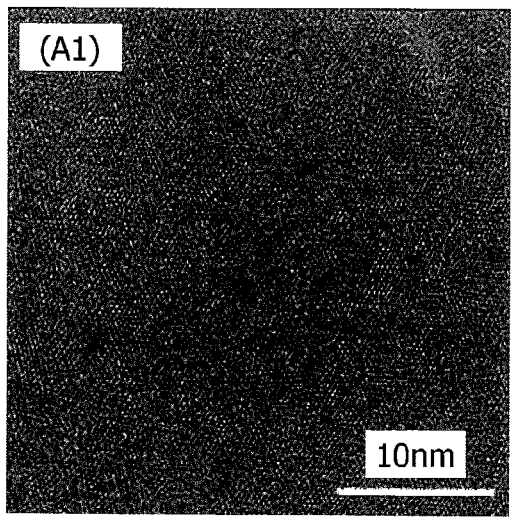
FIG. 7A2
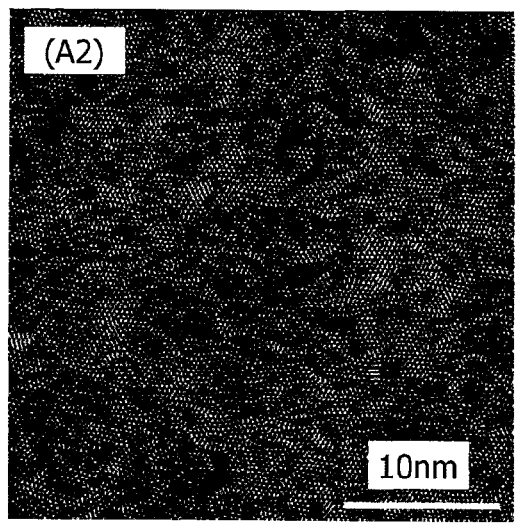
FIG. 7B1
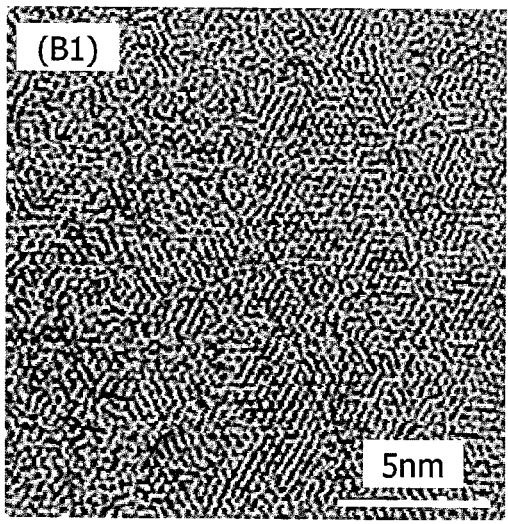
FIG. 7B2
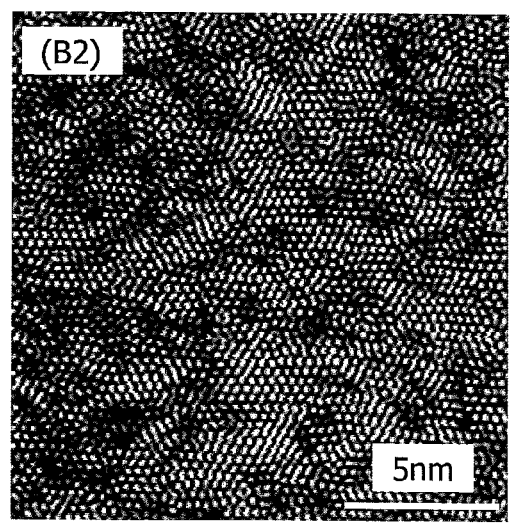

FIG. 10A1
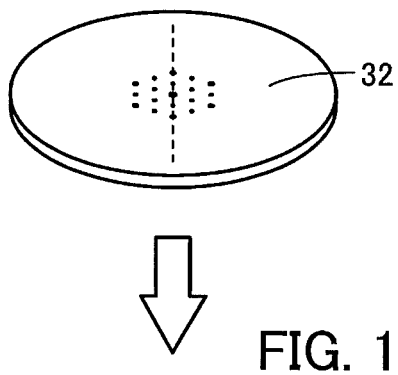
FIG. 10A2
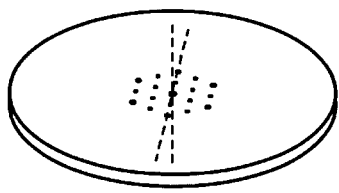
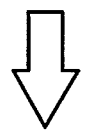
FIG. 10A3
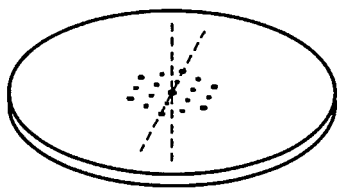
FIG. 10B
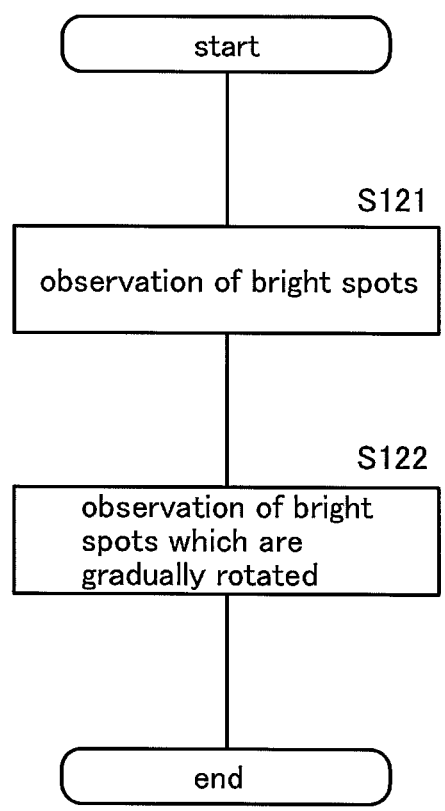

InGaZnO₄

FIG. 13A
FIG. 13B
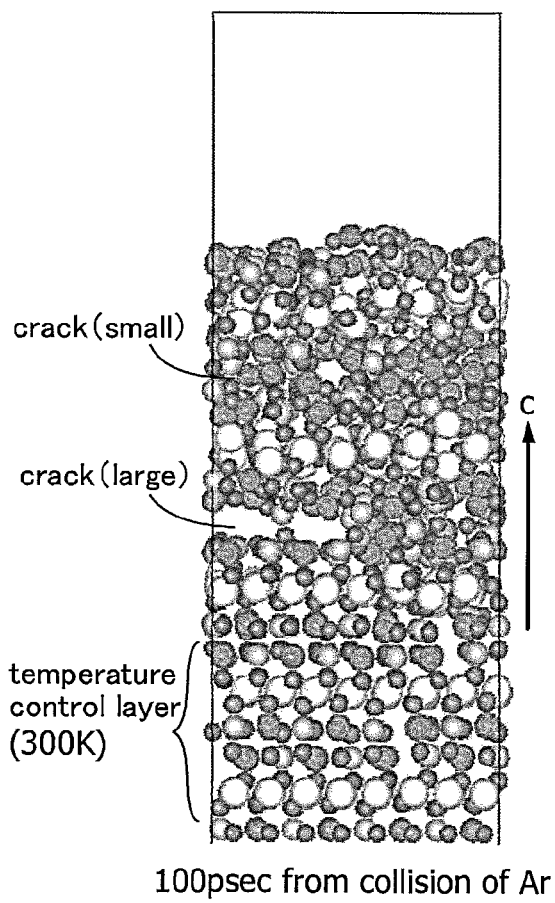
100psec from collision of Ar
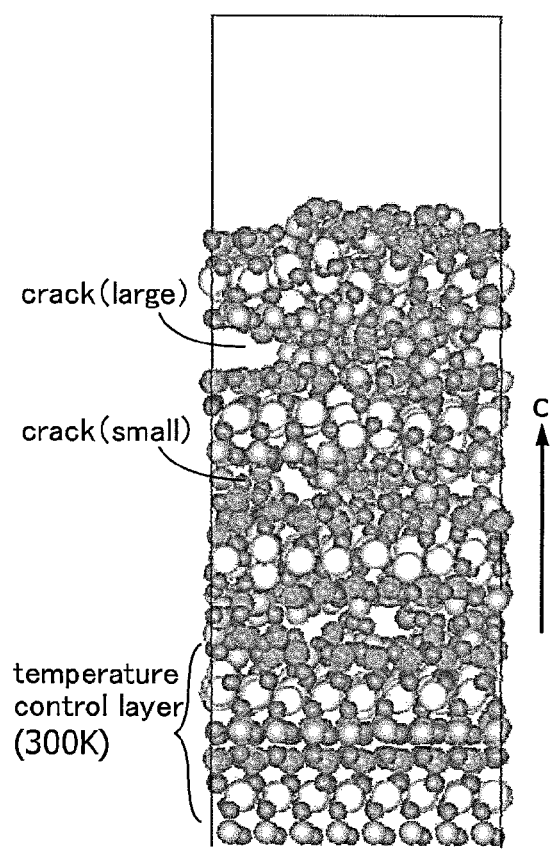
100psec from collision of O
In : ○  Ga : ○  Zn : ●  O : ●

Zn of the third layer (Ga-Zn-O layer) reaches the vicinity of the sixth layer (Ga-Zn-O layer)

Zn of the third layer (Ga-Zn-O layer) does not reach the fifth layer (In-O layer)

FIG. 18A
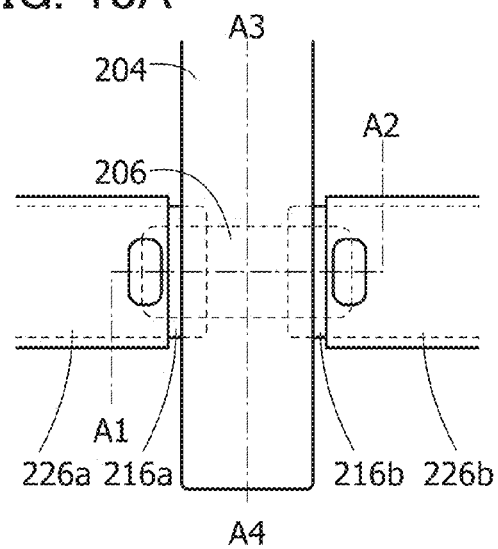
FIG. 18C
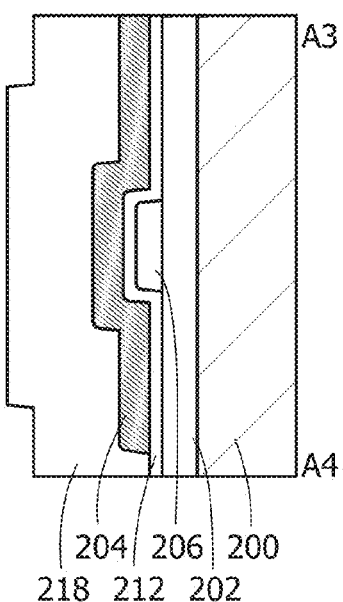
FIG. 18B1
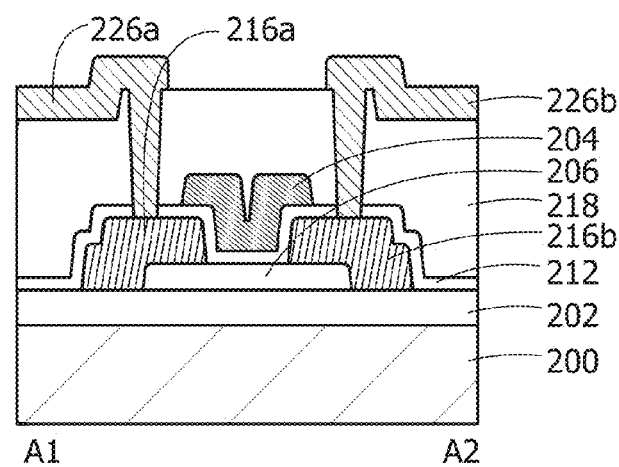
FIG. 18B2
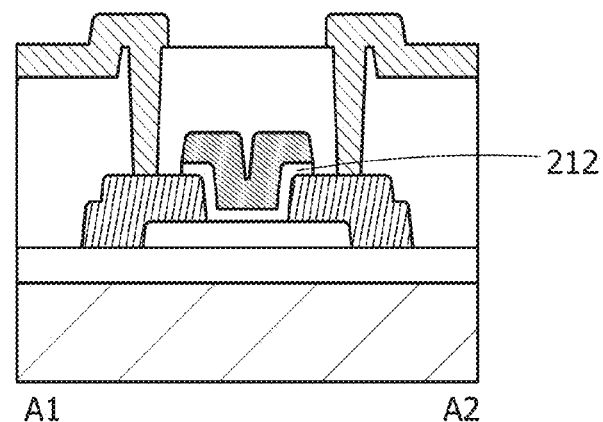

FIG. 20A
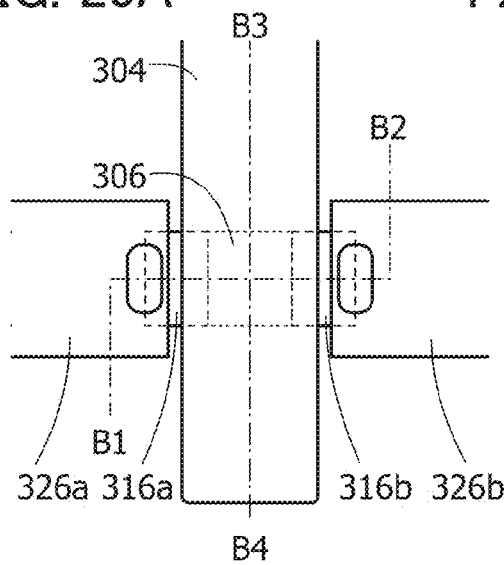
FIG. 20C
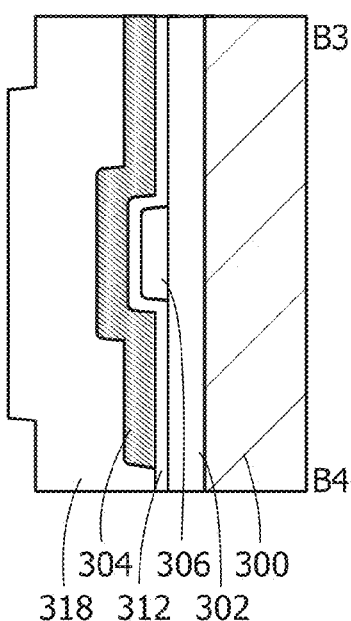
FIG. 20B1
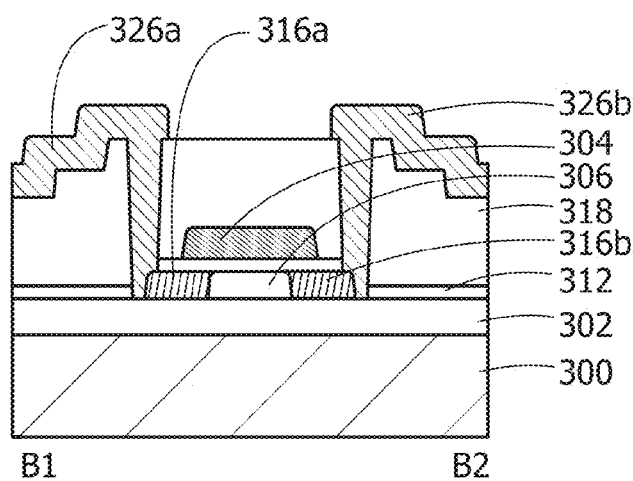
FIG. 20B2
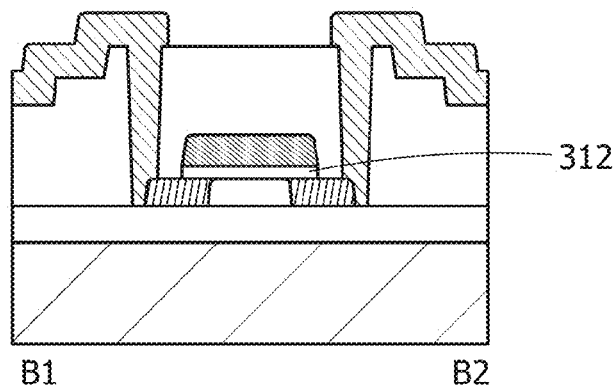

FIG. 28
| | 4000000 times | 8000000 times |
|---|---|---|
| Sample 1 | 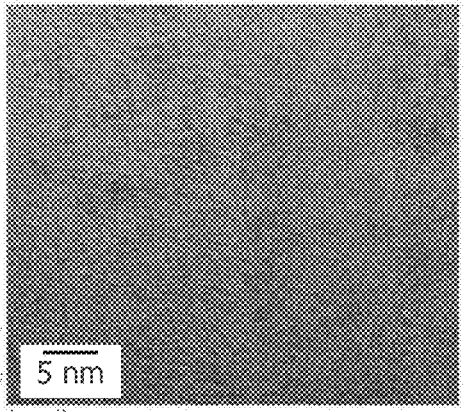 5 nm | 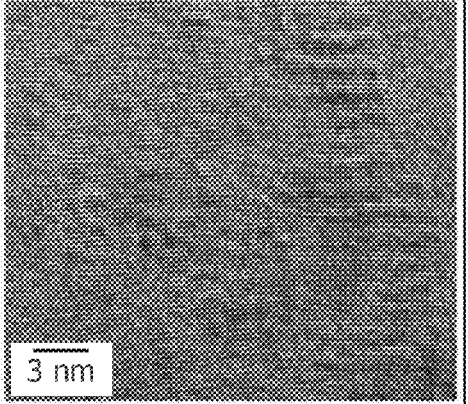 3 nm |
| Sample 2 | 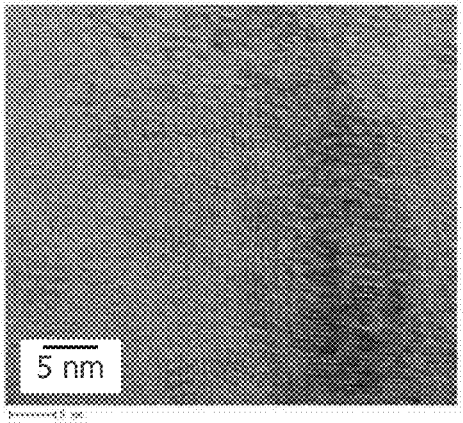 5 nm | 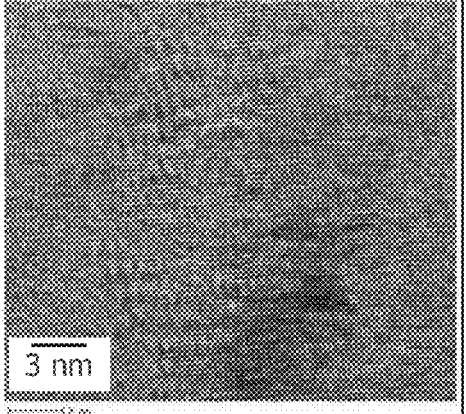 3 nm |
| Sample 3 | 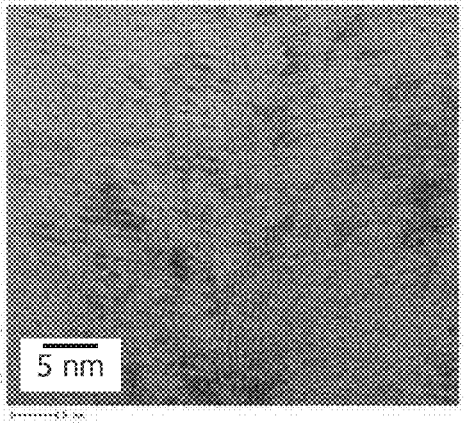 5 nm | 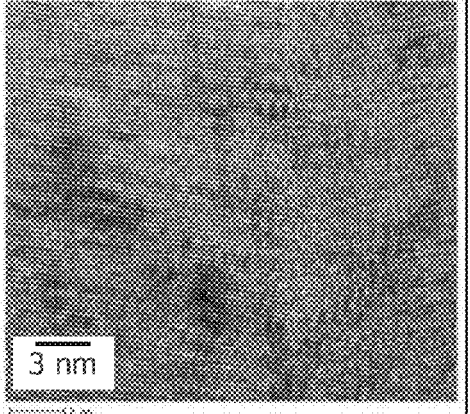 3 nm |

OXIDE SEMICONDUCTOR FILM AND SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, the present invention relates to, for example, a semiconductor film, a semiconductor device, a display device, a liquid crystal display device, a light-emitting device, or a memory device. Furthermore, the present invention relates to a method for manufacturing a semiconductor film, a semiconductor device, a display device, a liquid crystal display device, a light-emitting device, or a memory device. Alternatively, the present invention relates to a driving method of a semiconductor device, a display device, a liquid crystal display device, a light-emitting device, or a memory device.

Note that in this specification, a semiconductor device refers to any device that can function by utilizing semiconductor characteristics. An electro-optical device, a display device, a memory device, a semiconductor circuit, an electronic appliance, and the like may be included in or may include a semiconductor device.

2. Description of the Related Art

A technique for forming a transistor by using a semiconductor film over a substrate having an insulating surface has attracted attention. The transistor is applied to a wide range of semiconductor devices such as an integrated circuit and a display device. A silicon film is known as a semiconductor film applicable to a transistor.

As the silicon film used as a semiconductor film of a transistor, either an amorphous silicon film or a polycrystalline silicon film is used depending on the purpose. For example, in the case of a transistor included in a large-sized display device, it is preferred to use an amorphous silicon film, which can be formed using the established technique for forming a film on a large-sized substrate. On the other hand, in the case of a transistor included in a high-performance display device where driver circuits are formed over the same substrate, it is preferred to use a polycrystalline silicon film, which can form a transistor having a high field-effect mobility. As a method for forming a polycrystalline silicon film, high-temperature heat treatment or laser light treatment which is performed on an amorphous silicon film has been known.

In recent years, an oxide semiconductor film has attracted attention. For example, a transistor including an amorphous In—Ga—Zn oxide film is disclosed (see Patent Document 1). An oxide semiconductor film can be formed by a sputtering method or the like, and thus can be used for a semiconductor film of a transistor in a large display device. Moreover, a transistor including an oxide semiconductor film has a high field-effect mobility; therefore, a high-performance display device where driver circuits are formed over the same substrate can be obtained. In addition, there is an advantage that capital investment can be reduced because part of production equipment for a transistor including an amorphous silicon film can be retrofitted and utilized.

In 1985, synthesis of an In—Ga—Zn oxide crystal was reported (see Non-Patent Document 1). Furthermore, in 1995, it was reported that an In—Ga—Zn oxide has a homologous structure and is represented by a composition formula $InGaO_3(ZnO)_m$ (m is a natural number) (see Non-Patent Document 2).

In 2012, it was reported that a transistor including a crystalline In—Ga—Zn oxide film has more excellent electrical characteristics and higher reliability than a transistor including an amorphous In—Ga—Zn oxide film (see Non-Patent Document 3). Non-Patent Document 3 reports that a crystal boundary is not clearly observed in an In—Ga—Zn oxide film including a c-axis aligned crystal (CAAC).

REFERENCE

Patent Document

[Patent Document 1] Japanese Published Patent Application No. 2006-165528

Non-Patent Documents

[Non-Patent Document 1] N. Kimizuka, and T. Mohri, "Spinel, $YbFe_2O_4$, and $Yb_2Fe_3O_7$ Types of Structures for Compounds in the $In_2O_3$ and $Sc_2O_3$-$A_2O_3$—BO Systems (A; Fe, Ga, or Al; B: Mg, Mn, Fe, Ni, Cu, or Zn) at Temperatures over 1000° C.", *Journal of Solid State Chemistry*, Vol. 60, 1985, pp. 382-384

[Non-Patent Document 2] N. Kimizuka, M. Isobe, and M. Nakamura, "Syntheses and Single-Crystal Data of Homologous Compounds, $In_2O_3(ZnO)_m$ (m=3, 4, and 5). $InGaO_3(ZnO)_3$, and $Ga_2O_3(ZnO)_m$ (m=7, 8, 9, and 16) in the $In_2O_3$—$ZnGa_2O_4$—ZnO System", *Journal of Solid State Chemistry*, Vol. 116, 1995, pp. 170-178

[Non-Patent Document 3] S. Yamazaki, J. Koyama, Y. Yamamoto, and K. Okamoto, "Research, Development, and Application of Crystalline Oxide Semiconductor", *SID 2012 DIGEST*, pp. 183-186

SUMMARY OF THE INVENTION

An object of the present invention is to provide a crystalline oxide semiconductor film which can be used as a semiconductor film of a transistor or the like. In particular, an object is to provide a crystalline oxide semiconductor film having few defects such as grain boundaries.

Another object is to provide a semiconductor device using an oxide semiconductor film. Another object is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a crystalline oxide semiconductor film which is provided over a substrate and has a region including five or less areas where a transmission electron diffraction pattern showing discontinuous points is observed when an observation area is changed one-dimensionally within a range of 700 nm, using a transmission electron diffraction apparatus with an electron beam having a probe diameter of 1 nm.

Another embodiment of the present invention is a crystalline oxide semiconductor film which is provided over a substrate and has alignment at a (00x) plane (x is a natural number). The crystalline oxide semiconductor film includes a region having eight or less areas where a transmission electron diffraction pattern including a plane other than the (00x) plane with respect to an incident direction <010> is observed, when an electron beam with a probe diameter of 1 nm enters the oxide semiconductor film perpendicularly to a cross section of the oxide semiconductor film, using a transmission electron diffraction pattern, and an observation area is changed one-dimensionally within a range of 700 nm.

Note that the oxide semiconductor film preferably contains indium, gallium, and zinc.

Another embodiment of the present invention is a semiconductor device including the oxide semiconductor film.

It is possible to provide a crystalline oxide semiconductor film which can be used as a semiconductor film of a transistor or the like. In particular, it is possible to provide a crystalline oxide semiconductor film with less defects such as grain boundaries.

It is possible to provide a semiconductor device using the oxide semiconductor film.

BRIEF DESCRIPTION OF THE DRAWINGS

FIGS. 3A and 3B are cross-sectional views illustrating a CAAC-OS film and the like.

FIGS. 4A and 4B show transmission electron diffraction patterns of a CAAC-OS film.

FIGS. 6A and 6B are plan-view TEM images of a zinc oxide film and a CAAC-OS film.

FIGS. 7A1, 7A2, 7B1, and 7B2 are high-resolution plan-view TEM images of a CAAC-OS film and show image analysis results thereof.

FIGS. 10A1, 10A2, and 10A3 illustrate a method for measuring a transmission electron diffraction pattern, and FIG. 10B shows a flow chart.

FIGS. 12A and 12B show a structure of InGaZnO$_4$ before collision of an atom, and the like.

FIGS. 13A and 13B show a structure of InGaZnO$_4$ after collision of an atom, and the like.

FIGS. 18A, 18B1, 18B2, and 18C are a top view and cross-sectional views illustrating an example of a transistor of one embodiment of the present invention.

FIGS. 20A, 20B1, 20B2, and 20C are a top view and cross-sectional views illustrating an example of a transistor of one embodiment of the present invention.

FIG. 28 shows plan-view TEM images of samples.

DETAILED DESCRIPTION OF THE INVENTION

Figure 1A:
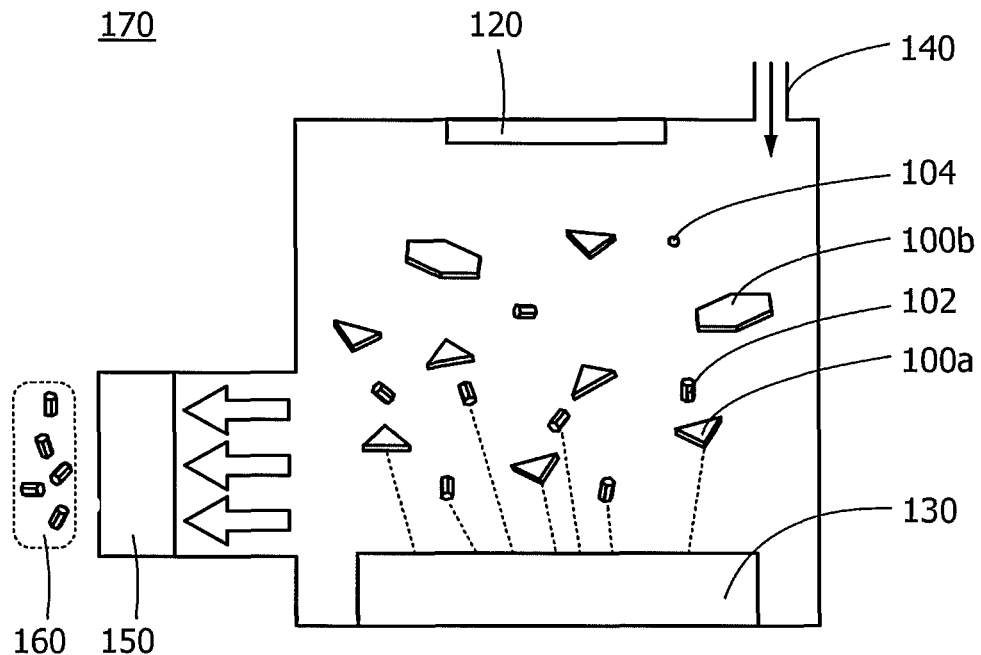
FIGS. 1A and 1B are schematic views illustrating a deposition chamber.

Hereinafter, an embodiment and an example of the present invention will be described in detail with the reference to the drawings. However, the present invention is not limited to the description below, and it is easily understood by those skilled in the art that modes and details disclosed herein can be modified in various ways. Furthermore, the present invention is not construed as being limited to description of the embodiment and the example. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa.

Note that the ordinal numbers such as "first" and "second" in this specification are used for convenience and do not denote the order of steps or the stacking order of layers. Therefore, for example, the term "first" can be replaced with the term "second", "third", or the like as appropriate. In addition, the ordinal numbers in this specification and the like are not necessarily the same as those which specify one embodiment of the present invention.

Note that a "semiconductor" includes characteristics of an "insulator" in some cases when the conductivity is sufficiently low, for example. Furthermore, a "semiconductor" and an "insulator" cannot be strictly distinguished from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Further, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

Note that an impurity in a semiconductor film refers to, for example, elements other than the main components of a semiconductor film. For example, an element with a concentration of lower than 0.1 atomic % is an impurity. When an impurity is contained, density of states (DOS) may be formed in the semiconductor film, the carrier mobility may be decreased, or the crystallinity may be lowered, for example. In the case where the semiconductor film is an oxide semiconductor film, examples of an impurity which changes characteristics of the semiconductor film include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. When the semiconductor film is an oxide semiconductor film, oxygen vacancies may be formed by entry of impurities such as hydrogen, for example. Further, when the semiconductor film is a silicon layer, examples of an impurity which changes the characteristics of the semiconductor film include oxygen, Group 1 elements except hydrogen, Group 2 elements, Group 13 elements, and Group 15 elements.

<Properties of CAAC-OS Film>

A c-axis aligned crystalline oxide semiconductor (CAAC-OS) film, which is a crystalline oxide semiconductor film of this embodiment, will be described below. The CAAC-OS film is an oxide semiconductor film which has c-axis alignment while the directions of a-axes and b-axes are different and in which c-axes are aligned in a direction parallel to a normal vector of a formation surface or a normal vector of a top surface.

FIG. 4A shows a diffraction pattern (also referred to as a selected-area transmission electron diffraction pattern) when an electron beam having a probe diameter of 300 nm enters an In—Ga—Zn oxide film that is a CAAC-OS film in a direction parallel to a sample surface. As in FIG. 4A, spots due to the (009) plane of an $InGaZnO_4$ crystal are observed. This indicates that crystals in the CAAC-OS film have c-axis alignment and that the c-axes are aligned in a direction substantially perpendicular to the formation surface or the top surface of the CAAC-OS film. Meanwhile, FIG. 4B shows a diffraction pattern when an electron beam having a probe diameter of 300 nm enters the same sample in a direction perpendicular to the sample surface. As in FIG. 4B, a ring-like diffraction pattern is observed.

In this specification, a term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, a term "perpendicular" indicates that the angle formed between two straight lines is greater than or equal to $80°$ and less than or equal to $100°$, and accordingly includes the case where the angle is greater than or equal to $85°$ and less than or equal to $95°$.

Figure 5A:
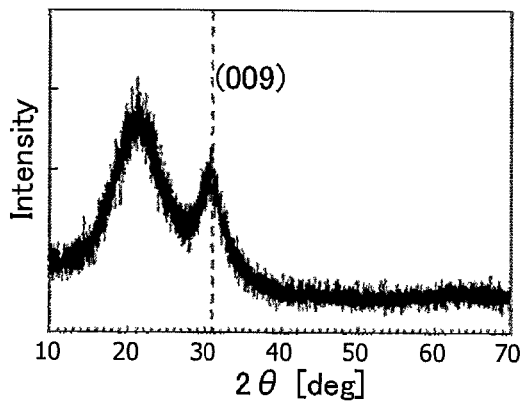
FIGS. 5A to 5C show analysis results of a CAAC-OS film and a target by an X-ray diffraction apparatus.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears when the diffraction angle ($2\theta$) is around $31°$ (see FIG. 5A). Since this peak is derived from the (009) plane of the $InGaZnO_4$ crystal, it can also be confirmed from the structural analysis with the XRD apparatus that crystals in the CAAC-OS film have c-axis alignment and that the c-axes are aligned in a direction substantially perpendicular to the formation surface or the top surface of the CAAC-OS film.

Figure 5B:
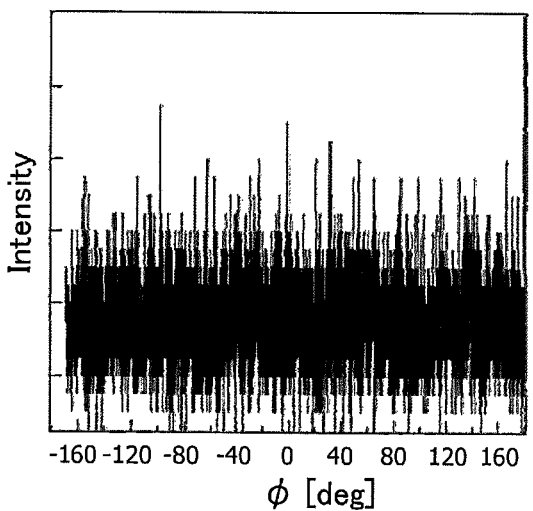
Figure 5C:
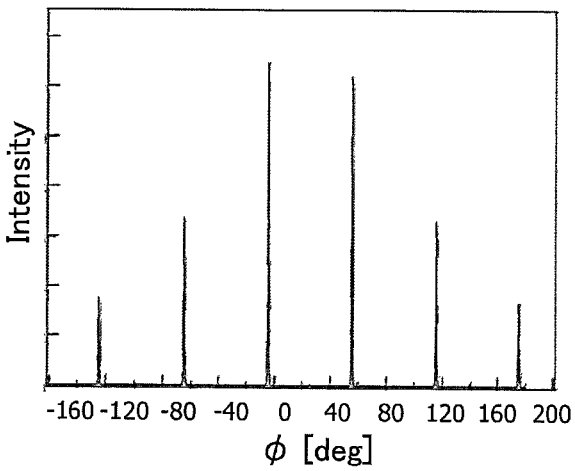

On the other hand, when the CAAC-OS film is analyzed by an in-plane method in which an X-ray enters a sample in a direction substantially perpendicular to the c-axis, a peak appears when $2\theta$ is around $56°$. This peak is derived from the (110) plane of the $InGaZnO_4$ crystal. In the case of the CAAC-OS film, when analysis ($\phi$ scan) is performed with $2\theta$ fixed at around $56°$ and with the sample rotated using a normal vector of the sample surface as an axis ($\phi$ axis), a peak is not clearly observed (see FIG. 5B). In contrast, in the case of a single crystal oxide semiconductor film of $InGaZnO_4$, when $\phi$ scan is performed with $2\theta$ fixed at around $56°$, six peaks appear (see FIG. 5C). The six peaks are derived from crystal planes equivalent to the (110) plane. Accordingly, from the structural analysis with the XRD apparatus, it can be confirmed that the directions of a-axes and b-axes are different in the CAAC-OS film.

In a transmission electron microscope (TEM) image of the CAAC-OS film, a boundary between crystal regions, that is, a grain boundary is not clearly observed. Thus, in the CAAC-OS film, a reduction in electron mobility due to the grain boundary is less likely to occur.

In general, according to the TEM image of a polycrystalline zinc oxide film observed in a direction substantially perpendicular to the sample surface (plan-view TEM image), a clear grain boundary can be seen as shown in FIG. 6A. On the other hand, according to the plan-view TEM image of the same measurement region in the CAAC-OS film, a grain boundary cannot be seen as shown in FIG. 6B.

Further, a combined analysis image of a bright-field image which is obtained by plan-view TEM analysis and a diffraction pattern of the CAAC-OS film (also referred to as a high-resolution plan-view TEM image) was obtained (see FIG. 7A1). Even in the high-resolution plan-view TEM image, a clear grain boundary cannot be seen in the CAAC-OS film.

Here, FIG. 7A2 is an image obtained in such a manner that the high-resolution plan-view TEM image in FIG. 7A1 is transferred by the Fourier transform, filtered, and then transferred by the inverse Fourier transform. By such image processing, a real space image can be obtained in which noises are removed from the high-resolution plan-view TEM image so that only periodic components are extracted. By the image processing, a crystal region can be easily observed, and arrangement of metal atoms in a triangular or hexagonal configuration can be clearly observed. Note that it is found that there is no regularity of arrangement of metal atoms between different crystal regions.

A further enlarged high-resolution plan-view TEM image of the CAAC-OS film is obtained (see FIG. 7B1). Even in the enlarged high-resolution plan-view TEM image, a clear grain boundary cannot be observed in the CAAC-OS film.

Here, FIG. 7B2 is an image obtained in such a manner that the enlarged high-resolution plan-view TEM image in FIG. 7B1 is transferred by the Fourier transform, filtered, and then transferred by the inverse Fourier transform. The enlarged high-resolution plan-view TEM image is subjected to the image processing; thus, arrangement of metal atoms can be observed more clearly. As in FIG. 7B2, metal atoms are arranged in a regular triangular configuration with interior angles of 60° or a regular hexagonal configuration with interior angles of 120°.

Figure 8A:
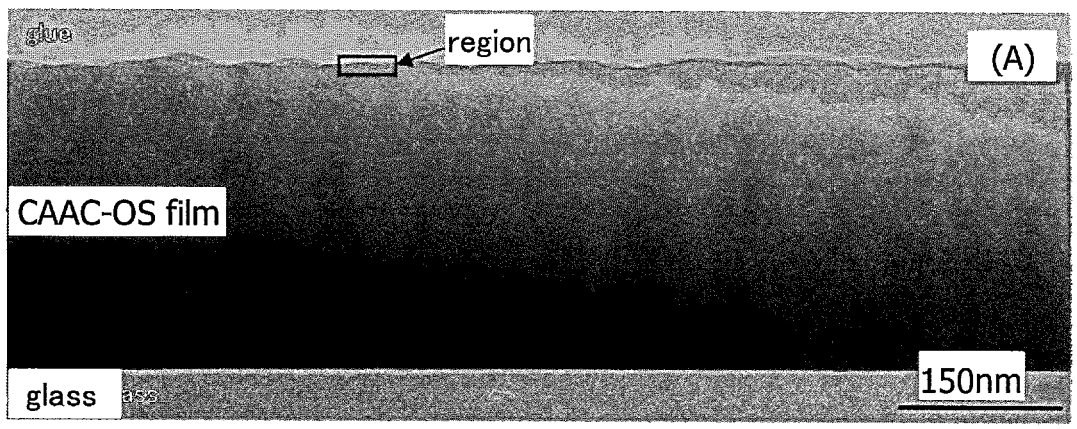
FIGS. 8A to 8C show a cross-sectional TEM image and a high-resolution cross-sectional TEM image of a CAAC-OS film, and an image analysis result of the high-resolution cross-sectional TEM image.

Next, the CAAC-OS film is observed with a TEM in a direction substantially parallel to the sample surface (a cross-sectional TEM image is obtained) (see FIG. 8A). A combined analysis image of a bright-field image which is obtained by cross-sectional TEM analysis and a diffraction pattern of a region surrounded by a frame (also referred to as a high-resolution cross-sectional TEM image) is obtained in the cross-sectional TEM image shown in FIG. 8A (see FIG. 8B).

Figure 8B:
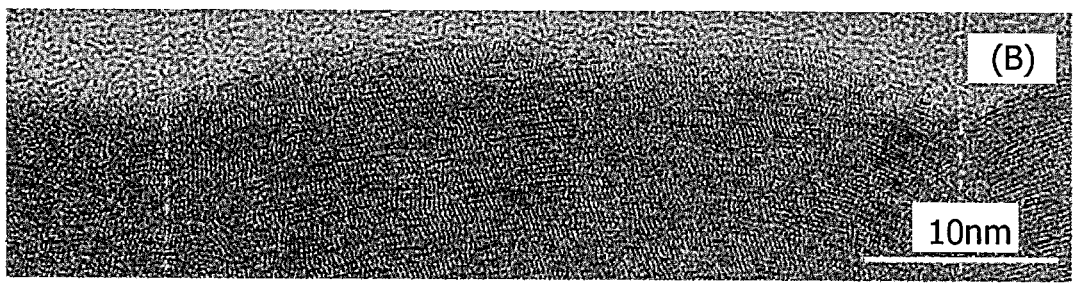
Figure 8C:
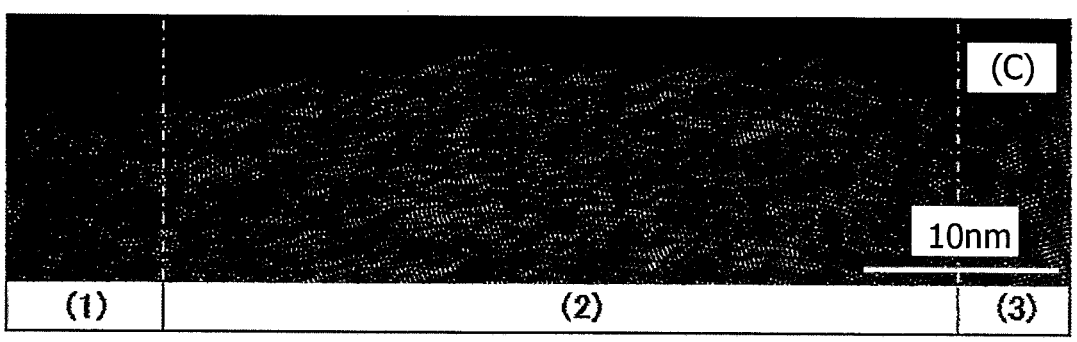

Here, FIG. 8C is an image obtained in such a manner that the high-resolution cross-sectional TEM image in FIG. 8B is transferred by the Fourier transform, filtered, and then transferred by the inverse Fourier transform. By such image processing, a real space image can be obtained in which noises are removed from the high-resolution cross-sectional TEM image so that only periodic components are extracted. By the image processing, a crystal region can be easily observed, and arrangement of metal atoms in a layered manner can be found. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

FIG. 8B can be divided into regions denoted by (1), (2), and (3) from the left. When each of the regions is regarded as one large crystal region, the size of each of the crystal regions is found to be approximately 50 nm. At this time, between (1) and (2) and between (2) and (3), a clear grain boundary cannot be found. In FIG. 8C, crystal regions are connected between (1) and (2) and between (2) and (3).

From the results of the cross-sectional TEM image and the plan-view TEM image, alignment is found in the crystal regions in the CAAC-OS film.

Even when a high-resolution TEM images are subjected to image analysis in this manner, it is difficult to observe a grain boundary in a favorable CAAC-OS film. Thus, a structure analysis method which can be performed on a CAAC-OS film with the use of a transmission electron diffraction measurement apparatus is described below.

Figure 9A:
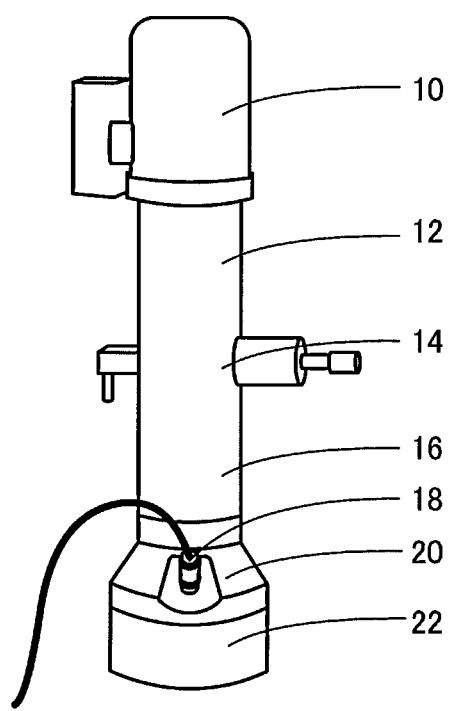
FIGS. 9A and 9B illustrate an example of a transmission electron diffraction measurement apparatus.

FIG. 9A illustrates a transmission electron diffraction measurement apparatus which includes an electron gun chamber 10, an optical system 12 under the electron gun chamber 10, a sample chamber 14 under the optical system 12, an optical system 16 under the sample chamber 14, an observation chamber 20 under the optical system 16, a camera 18 installed in the observation chamber 20, and a film chamber 22 under the observation chamber 20. The camera 18 is provided to face toward the inside of the observation chamber 20. Note that the film chamber 22 is not necessarily provided.

Figure 9B:
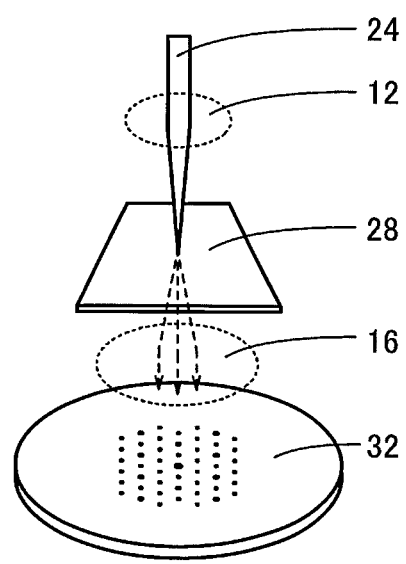

FIG. 9B illustrates an internal structure of the transmission electron diffraction measurement apparatus illustrated in FIG. 9A. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

The camera 18 can store a taken image in a storage medium. For example, the camera 18 may be connected to a computer so that the computer displays a taken image. When an image is displayed by a computer, a noise which is peculiar to a highly sensitive photographing can be removed. Furthermore, it is possible to display a transmission electron diffraction pattern from which distortion derived from an inclination of the camera 18 is removed. In addition, it is possible to analyze change in the transmission electron diffraction pattern on the spot; therefore, a high effect for analyzing a novel crystal structure can be obtained.

As the camera 18, a high sensitive camera such as a camera for astronomical observation may be used, for example. As the camera 18, for example, a camera which can take an image even when the illuminance is lower than or equal to 0.002 lux, preferably lower than or equal to 0.001 lux, further preferably lower than or equal to 0.0005 lux, still further preferably lower than or equal to 0.0002 lux is used. As the camera 18, a camera which includes a CCD image sensor with a size greater than or equal to ¼ inches, preferably greater than or equal to ⅓ inches, further preferably greater than or equal to 1/2.3 inches, still further preferably greater than or equal to ⅔ inches is used.

The camera 18 preferably has a backlight correction function, for example. A backlight correction function enables the camera to recognize a transmission electron diffraction pattern in some cases even when light emission derived from a transmitted wave of another transmission electron diffraction pattern is too bright. Furthermore, as the camera 18, it is preferable to use a camera in which burn-in due to light emission derived from a transmitted wave is less likely to occur.

The fluorescent plate 32 has a function of emitting light by receiving energy from electrons. Therefore, the fluorescent plate 32 is not limited to a plate to which a fluorescent material is applied as long as it has the above function, and can be replaced with a plate to which another illuminant is applied. For the fluorescent plate 32, a substance which emits light such as ultraviolet light, visible light (blue light, green light, red light, or the like), infrared light, or the like by receiving energy from electrons may be used.

A holder for fixing the substance 28 that is a sample is provided in the sample chamber 14. The holder transmits electrons passing through the substance 28. The holder may have a function of heating the substance 28, for example. Furthermore, the holder may have a function of rotating the substance 28, for example. Moreover, the holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 µm. The range is preferably determined to be an optimal range for the structure of the substance 28.

A focusing lens or the like may be used for the optical system 12. For example, the substance 28 in the sample chamber 14 may be irradiated with the electrons 24 which have passed through three or more kinds of focusing lenses and a focusing aperture, through an object lens.

An intermediate lens and a projector lens may be used for the optical system 16. For example, the electrons 24 which have passed through the substance 28 may pass through an object lens and three or more kinds of intermediate lenses to enter the fluorescent plate 32 of the observation chamber 20 through a projector lens.

A thermionic-emission electron gun or a field-emission electron gun can be used for the electron gun chamber 10. In particular, a field-emission electron gun is preferably used because it is capable of emitting a minute electron beam, which results in high current density. Tungsten (including an emitter of tungsten covered with zirconium oxide, and the like), lanthanum hexaboride ($LaB_6$), or the like may be used as an emitter of the electron gun.

A film or an imaging plate can be set in the film chamber 22.

Then, a method for measuring a transmission electron diffraction pattern of a substance with the use of the transmission electron diffraction measurement apparatus described above is described.

Figure 3A:
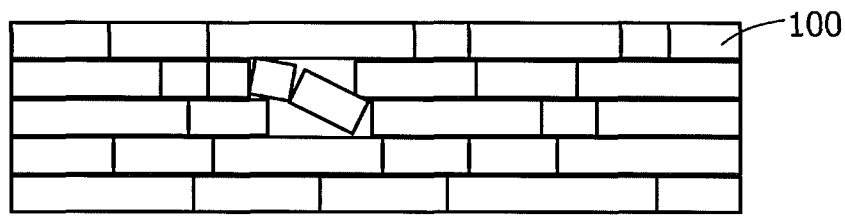

FIGS. 10A1 to 10A3 show changes in a transmission electron diffraction pattern appearing on the fluorescent plate 32. FIG. 10B is a flow chart showing changes in the transmission electron diffraction pattern.

First, a transmission electron diffraction pattern of bright spots shown in FIG. 10A1 is observed (see Step S121 in FIG. 10B).

Here, changes in the structure of a substance can be observed by changing an irradiation position of electrons on the substance. For example, a situation where a crystal orientation is rotated is observed as shown in FIGS. 10A1 and 10A2. The irradiation position of electrons on the substance is further changed, whereby, for example, a situation where the crystal orientation is further shifted is observed as shown in FIGS. 10A2 and 10A3 (see Step S122 in FIG. 10B).

That is, such results as shown in FIGS. 10A1 to 10B show that the substance has a structure like the structure of a CAAC-OS film with no grain boundary.

On the other hand, when the irradiation position of electrons on the substance is changed, a transmission electron diffraction pattern showing discontinuous points is observed in some cases. As examples of the discontinuous points, the case where transmission electron diffraction patterns having plural kinds of structures are observed at the same time, the case where transmission electron diffraction pattern showing plural kinds of crystal orientations are observed at the same time, and the like are given. Such a result probably indicates the existence of a grain boundary in the observed area. Therefore, in the case of a high-quality CAAC-OS film, for example, when the measurement is performed while the irradiation area is changed one-dimensionally within the range of 700 nm, the number of areas where a transmission electron diffraction pattern showing discontinuous points is observed is less than or equal to five, preferably less than or equal to three, further preferably less than or equal to two, still further preferably zero. Note that the measurement range is only an example and is not limited to 700 nm. For example, the measurement range may be 5 µm, 2 µm, 1 µm, or 200 nm. In this case, the number of areas where a transmission electron diffraction pattern showing discontinuous points is increased or decreased depending on the length of the measurement range. The measurement range may be less than 200 nm. In this case, the number of areas where a transmission electron diffraction pattern showing discontinuous points is less than or equal to one.

Furthermore, in the measurement, particularly in the case where electrons enter the film perpendicularly to the cross section, a transmission electron diffraction pattern including a plane other than a (00x) plane (x is a natural number) with respect to the incident direction <010> is observed in some cases. Specifically, the (009) plane with respect to the incident direction <210>, the (111) plane with respect to the incident direction <010>, or the like may be observed. Such a result probably indicates the existence of a structure which is different from the structure peculiar to a CAAC-OS film in the measurement area. Therefore, in the case of a high-quality CAAC-OS film, for example, when electrons enter the film perpendicularly to the cross section and the measurement is performed while the irradiation position is changed one-dimensionally within the range of 700 nm, the number of areas where a transmission electron diffraction pattern including a plane other than a (00x) plane with respect to the incident direction <010> is observed is less than or equal to eight, preferably less than or equal to five, further preferably less than or equal to three, still further preferably two.

Change in the structure of a minute region of a substance can be found by using such a method for measuring a transmission electron diffraction pattern. Therefore, it may be possible that a substance whose structure is difficult to analyze by TEM or the like, such as a CAAC-OS film, be evaluated.

The CAAC-OS film is an oxide semiconductor film having a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancy in the oxide semiconductor film serves as a carrier trap or serves as a carrier generation source when hydrogen is captured therein.

The state in which impurity concentration is low and density of defect states is low (the amount of oxygen vacancy is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

<Method for Forming CAAC-OS Film>

A method for forming a CAAC-OS film is described below.

Figure 11A:
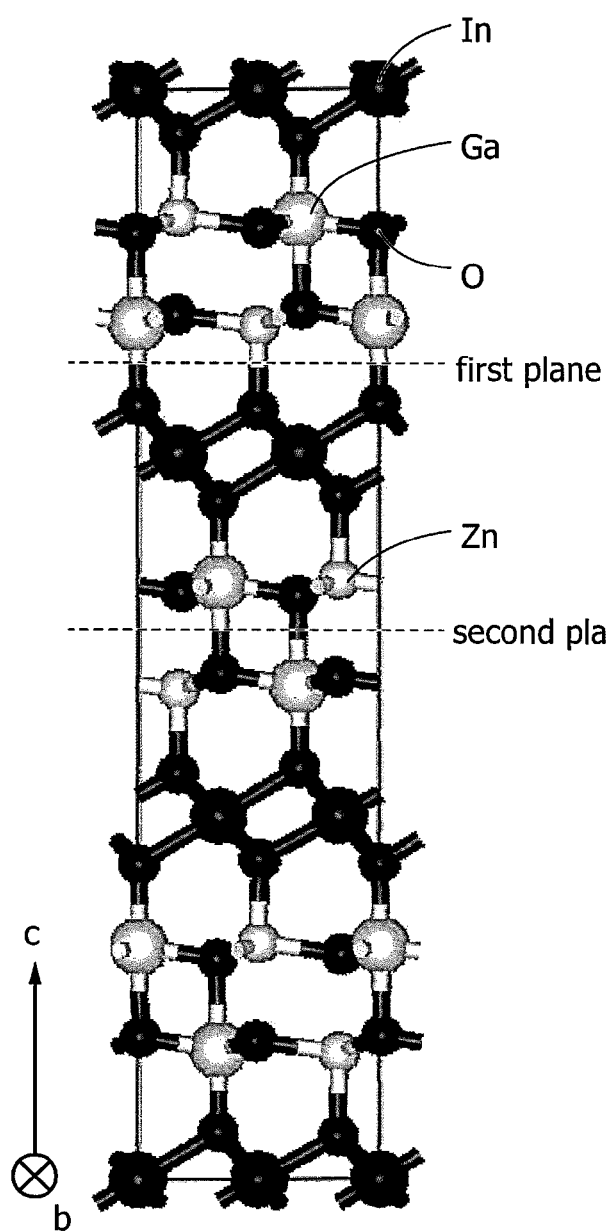
FIGS. 11A and 11B show an InGaZnO$_4$ crystal.
Figure 11B:
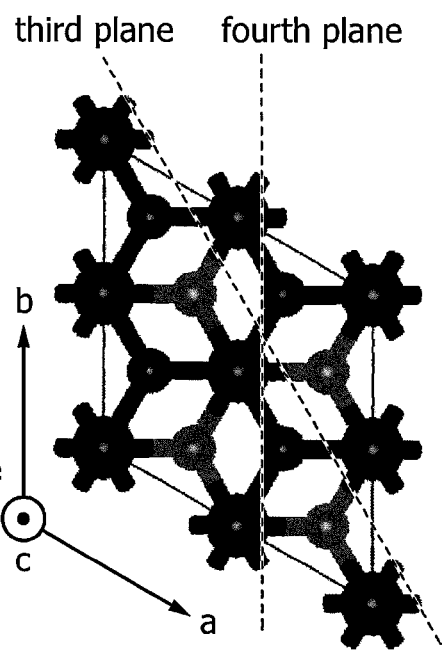

First, a cleavage plane of the target is described with reference to FIGS. 11A and 11B. FIGS. 11A and 11B show a structure of an InGaZnO$_4$ crystal. Note that FIG. 11A shows a structure of the case where the InGaZnO$_4$ crystal is observed from a direction parallel to the b-axis when the c-axis is in an upward direction. Further, FIG. 11B shows a structure of the case where the InGaZnO$_4$ crystal is observed from a direction parallel to the c-axis. Note that the target has a polycrystalline structure including an InGaZnO$_4$ crystal.

Energy needed for cleavage at each of crystal planes of the InGaZnO$_4$ crystal was calculated by the first principles calculation. Note that a pseudopotential and density functional theory program (CASTEP) using the plane wave basis were used for the calculation. Note that an ultrasoft type pseudopotential was used as the pseudopotential. GGA/PBE was used as the functional. Cut-off energy was 400 eV.

Energy of a structure in an initial state was obtained after structural optimization including a cell size was performed. Further, energy of a structure after the cleavage at each plane was obtained after structural optimization of atomic arrangement was performed in a state where the cell size was fixed.

On the basis of the structure of the InGaZnO$_4$ crystal shown in FIGS. 11A and 11B, a structure cleaved at any one of the first plane, the second plane, the third plane, and the fourth plane was formed and subjected to structural optimization calculation in which the cell size was fixed. Here, the first plane is a crystal plane between a Ga—Zn—O layer and an In—O layer and is parallel to the (001) plane (or the a-b plane) (see FIG. 11A). The second plane is a crystal plane between a Ga—Zn—O layer and a Ga—Zn—O layer and is parallel to the (001) plane (or the a-b plane) (see FIG. 11A). The third plane is a crystal plane parallel to the (110) plane (see FIG. 11B). The fourth plane is a crystal plane parallel to the (100) plane (or the b-c plane) (see FIG. 11B).

Under the above conditions, the energy of the structure after the cleavage at each plane was calculated. Next, a difference between the energy of the structure after the cleavage and the energy of the structure in the initial state was divided by the area of the cleavage plane; thus, cleavage energy which served as a measure of easiness of cleavage at each plane was calculated. Note that the energy of a structure is calculated based on atoms and electrons included in the structure. That is, kinetic energy of the electrons and interactions between the atoms, between the atom and the electron, and between the electrons are considered in the calculation.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

|  | Cleavage Energy [J/m$^2$] |
| --- | --- |
| First Plane | 2.60 |
| Second Plane | 0.68 |
| Third Plane | 2.18 |
| Fourth Plane | 2.12 |

From the calculations, in the structure of the InGaZnO$_4$ crystal shown in FIGS. 11A and 11B, the cleavage energy at the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between a Ga—Zn—O layer and a Ga—Zn—O layer, the InGaZnO$_4$ crystals shown in FIG. 11A can be separated at two planes equivalent to the second planes. Thus, the minimum unit of the InGaZnO$_4$ crystal is considered to include three layers, i.e., a Ga—Zn—O layer, an In—O layer, and a Ga—Zn—O layer.

<Deposition Model of CAAC-OS Film>

The CAAC-OS film can be deposited using a cleavage plane in a crystal. A deposition model of the CAAC-OS film using a sputtering method is described below.

Figure 12A:
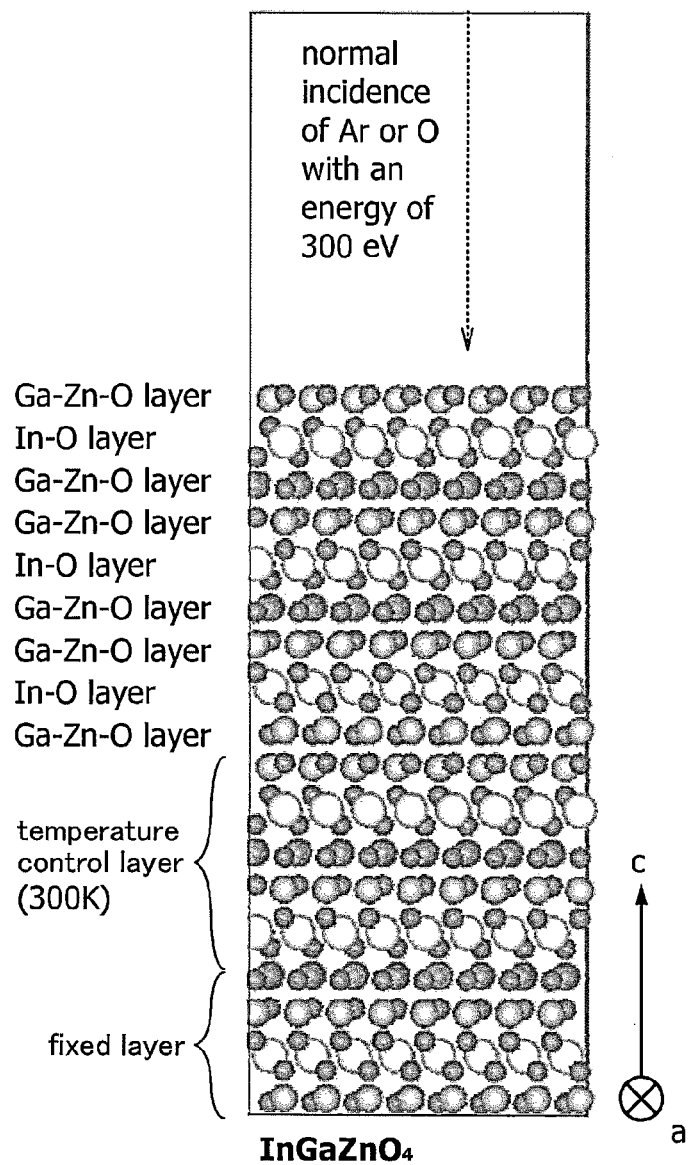
Figure 12B:
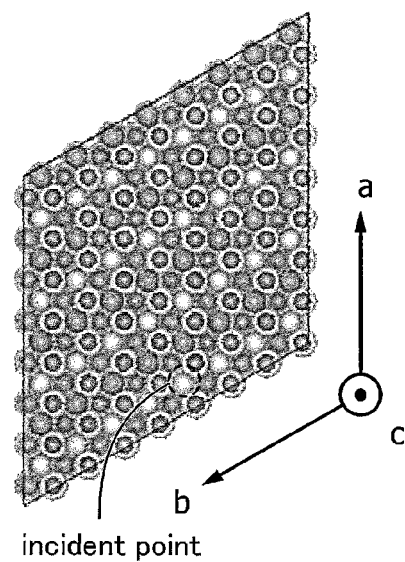

Here, through classical molecular dynamics calculation, on the assumption of an InGaZnO$_4$ crystal having a homologous structure as a target, a cleavage plane in the case where the target is sputtered using argon (Ar) or oxygen (O) was evaluated. FIG. 12A shows a cross-sectional structure of an InGaZnO$_4$ crystal (2688 atoms) used for the calculation, and FIG. 12B shows a top structure thereof. Note that a fixed layer in FIG. 12A is a layer which prevents the positions of the atoms from moving. A temperature control layer in FIG. 12A is a layer whose temperature is constantly set to a fixed temperature (300 K).

For the classical molecular dynamics calculation, Materials Explorer 5.0 manufactured by Fujitsu Limited was used. Note that the initial temperature, the cell size, the time step size, and the number of steps were set to be 300 K, a certain size, 0.01 fs, and ten million, respectively. In calculation, an atom to which an energy of 300 eV was applied was made to enter a cell from a direction perpendicular to the a-b plane of the InGaZnO$_4$ crystal under the conditions.

FIG. 13A shows an atomic arrangement when 99.9 picoseconds have passed after argon enters the cell including the InGaZnO$_4$ crystal shown in FIGS. 12A and 12B. FIG. 13B shows an atomic arrangement when 99.9 picoseconds have passed after oxygen enters the cell. Note that in FIGS. 13A and 13B, part of the fixed layer in FIG. 12A is omitted.

According to FIG. 13A, in a period from entry of argon into the cell to when 99.9 picoseconds have passed, a crack was formed from the cleavage plane corresponding to the second plane shown in FIG. 11A. Thus, in the case where argon collides with the InGaZnO$_4$ crystal and the uppermost surface is the second plane (the zero-th), a large crack was found to be formed in the second plane (the second).

On the other hand, according to FIG. 13B, in a period from entry of oxygen into the cell to when 99.9 picoseconds have passed, a crack was found to be formed from the cleavage plane corresponding to the second plane shown in FIG. 11A. Note that in the case where oxygen collides with the cell, a large crack was found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like particle (hereinafter referred to as a pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen. Repairing the damaged portion included in the pellet is described later.

Here, difference in size of the pellet depending on atoms which are made to collide was studied.

Figure 14A:
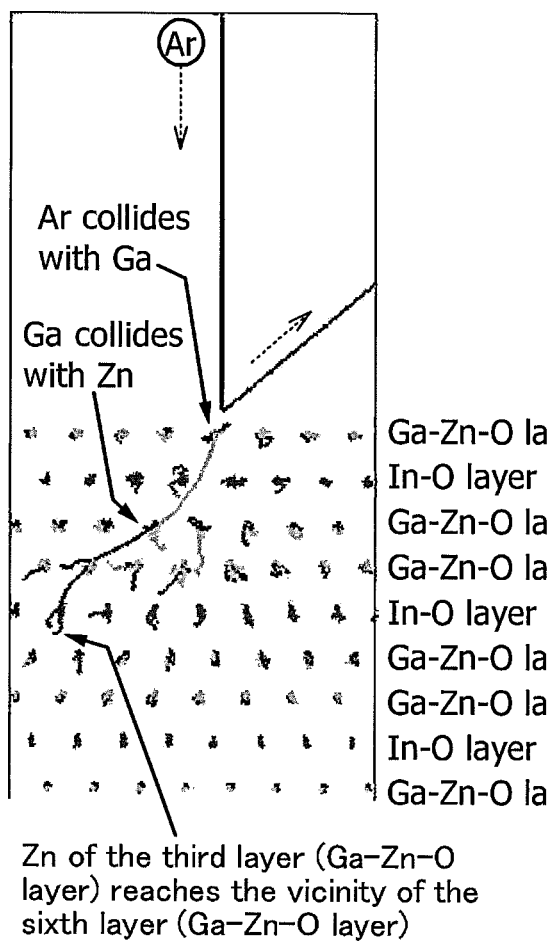
FIGS. 14A and 14B show trajectories of atoms after collision of atoms.

FIG. 14A shows trajectories of the atoms from 0 picosecond to 0.3 picoseconds after argon enters the cell including the InGaZnO$_4$ crystal shown in FIGS. 12A and 12B. Accordingly, FIG. 14A corresponds to a period from FIGS. 12A and 12B to FIG. 13A.

From FIG. 14A, when argon collides with gallium (Ga) of the first layer (Ga—Zn—O layer) counted from the top, the gallium collides with zinc (Zn) of the third layer (Ga—Zn—O layer) counted from the top and then, the zinc reaches the vicinity of the sixth layer (Ga—Zn—O layer) counted from the top. Note that the argon which collides with the gallium is sputtered to the outside. Accordingly, in the case where argon collides with the target including the InGaZnO$_4$ crystal, a crack is thought to be formed in the second plane (the second) in FIG. 12A.

Figure 14B:
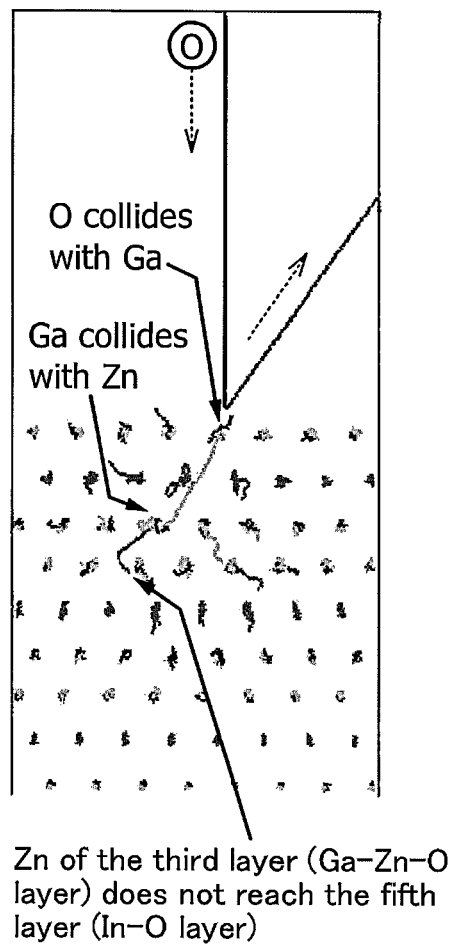

FIG. 14B shows trajectories of the atoms from 0 picosecond to 0.3 picoseconds after oxygen enters the cell including the InGaZnO$_4$ crystal shown in FIGS. 12A and 12B. Accordingly, FIG. 14B corresponds to a period from FIGS. 12A and 12B to FIG. 13A.

On the other hand, from FIG. 14B, when oxygen collides with gallium (Ga) of the first layer (Ga—Zn—O layer), the gallium collides with zinc (Zn) of the third layer (Ga—Zn—O layer) and then, the zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 12A.

This calculation also shows that the InGaZnO$_4$ crystal with which an atom (ion) collides is separated from the cleavage plane.

In addition, difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $v'_A$ represents the speed of argon or oxygen after collision, $m_{Ga}$ represents mass of gallium, $v_{Ga}$ represents the speed of gallium before collision, and $v'_{Ga}$ represents the speed of gallium after collision.

[Formula 1]
$$E = \frac{1}{2}m_A v_A^2 + \frac{1}{2}m_{Ga} v_{Ga}^2 \quad (1)$$

[Formula 2]
$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $v'_A$, $v_{Ga}$, and $v'_{Ga}$ can be represented by the following formula (3).

[Formula 3]
$$v'_A - v'_{Ga} = -(v_A - v_{Ga}) \quad (3)$$

From the formulae (1), (2), (3), on the assumption that $v_{Ga}$ is 0, the speed of gallium $v'_{Ga}$ after collision of argon or oxygen can be represented by the following formula (4).

[Formula 4]
$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds of gallium after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium was found to be higher than that in the case where oxygen collides with the gallium. Accordingly, it is considered that a crack is formed at a deeper position in the case where argon collides with the gallium than in the case where oxygen collides with the gallium.

The above calculation shows that when a target including the InGaZnO$_4$ crystal having a homologous structure is sputtered, separation occurs from the cleavage plane to form a pellet. Next, a model in which sputtered pellets are deposited to form the CAAC-OS film is described with reference to FIG. 2A.

Figure 2A:
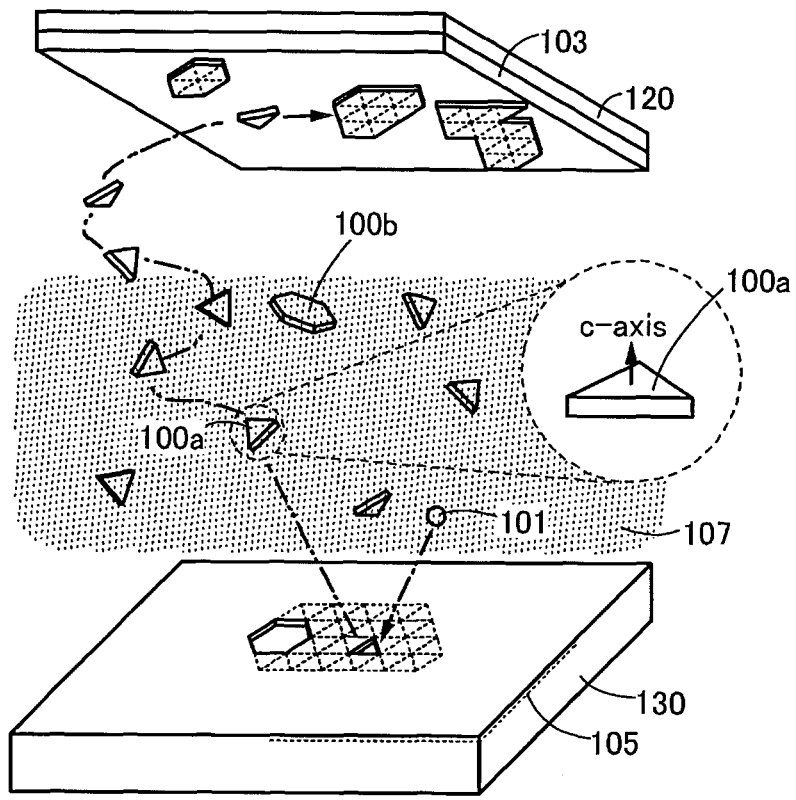
FIG. 2A is a schematic view showing a deposition model of a CAAC-OS film and FIGS. 2B and 2C illustrate a pellet.

FIG. 2A is a schematic view of an inside of a deposition chamber illustrating a state where the CAAC-OS film is formed by a sputtering method.

A target 130 is attached to a backing plate. Under the target 130 and the backing plate, a plurality of magnets are placed. The plurality of magnets generate a magnetic field over the target 130.

The target 130 has a cleavage plane 105. Although the target 130 has a plurality of cleavage planes 105, only one cleavage plane is shown here for easy understanding.

A substrate 120 is placed to face the target 130, and the distance d (also referred to as target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to be higher than or equal to 0.01 Pa and lower than or equal to 100 Pa, preferably higher than or equal to 0.1 Pa and lower than or equal to 10 Pa. Here, discharge starts by application of a voltage at a constant value or higher to the target 130, and plasma 107 is observed. Note that the magnetic field over the target 130 makes the vicinity of the target 130 to be a high-density plasma region. In the high-density plasma region, the deposition gas is ionized, so that an ion 101 is formed. Examples of the ion 101 include an oxygen cation ($O^+$) and an argon cation ($Ar^+$).

The ion 101 is accelerated toward the target 130 side by an electric field, and collides with the target 130 eventually. At this time, a pellet 100a and a pellet 100b which are flat-plate-like (pellet-like) sputtered particles are separated and sputtered from the cleavage plane 105. Note that structures of the pellet 100a and the pellet 100b may be distorted by an impact of collision of the ion 101.

Figure 2B:
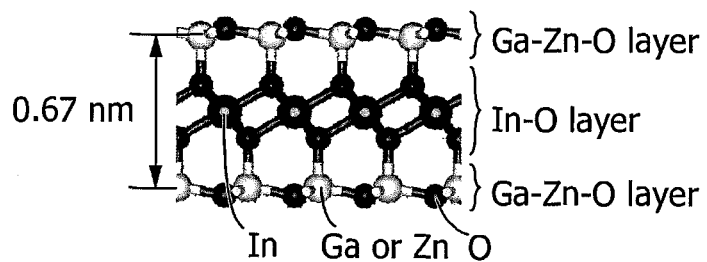
Figure 2C:
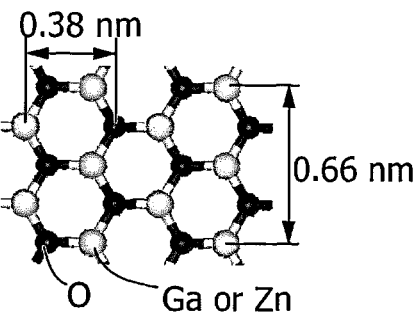

The pellet 100a is a flat-plate-like (pellet-like) sputtered particle having a triangle plane, in particular, regular triangle plane. The pellet 100b is a flat-plate-like (pellet-like) sputtered particle having a hexagon plane, in particular, regular hexagon plane. Note that a flat-plate-like (pellet-like) sputtered particle such as the pellet 100a and the pellet 100b is collectively called a pellet 100. The shape of a flat plane of the pellet 100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases. A cross section of the pellet 100 is shown in FIG. 2B and a top surface thereof is shown in FIG. 2C The thickness of the pellet 100 is determined depending on the kind of the deposition gas and the like. Although the reasons are described later, the thicknesses of the pellets 100 are preferably uniform. In addition, the sputtered particle preferably has a pellet shape with a small thickness as compared to a dice shape with a large thickness.

The pellet 100 receives a charge from the plasma 107 when passing through the high-density plasma region, so that end portions thereof are negatively or positively charged in some cases. The end portions of the pellet 100 are terminated with oxygen and there is a possibility that the oxygen is negatively charged. The end portions of the pellet 100 are charged in the same polarity, so that charges repel each other; thus, the pellet 100 can maintain a flat-plate shape.

For example, the pellet 100 flies like a kite in the plasma 107 and then flutters up over the substrate 120. Since the pellets 100 are charged, when the pellet 100 gets close to a region where another pellet 100 has already been deposited, repulsion is generated. Here, in the case where the substrate 120 is heated to a high temperature (e.g., approximately 150° C. to 400° C.), the pellet 100 glides (migrates) over the substrate 120 like a hang glider. The glide of the pellet 100 is caused in a state where the flat plane faces the substrate 120. After that, when the pellet 100 reaches a side surface of another pellet 100 which has already been deposited, the side surfaces of the pellets 100 are weakly bonded to each other by intermolecular force. When water exists between the side surfaces of the pellets 100, the water might inhibit bonding.

Further, the pellet 100 is heated over the substrate 120, whereby the structure distortion caused by the collision of the ion 101 can be reduced. The pellet 100 whose structure distortion is reduced is substantially a single crystal. Even when the pellets 100 are heated after being bonded, expansion and contraction of the pellet 100 itself hardly occur, which is caused by turning the pellet 100 to be substantially a single crystal. Thus, formation of defects such as a grain boundary due to expansion of a space between the pellets 100 can be prevented, and accordingly, generation of crevasses can be prevented. Further, the space is filled with elastic metal atoms and the like, whereby the elastic metal atoms and the like connect the pellets 100 which are not aligned with each other as a highway.

It is considered that as shown in such a model, the pellets 100 are deposited over the substrate 120. The pellets 100 are arranged so that flat planes parallel to the a-b plane face downwards; thus, a layer with a uniform thickness, flatness, and high crystallinity is formed. By stacking n layers (n is a natural number), a CAAC-OS film 103 can be obtained (see FIG. 3A).

Accordingly, the CAAC-OS film 103 does not need laser crystallization, and deposition can be uniformly performed even in the case of a large-sized glass substrate.

Since the CAAC-OS film 103 is deposited by such a model, the sputtered particle preferably has a pellet shape with a small thickness. Note that in the case where the sputtered particles have a dice shape with a large thickness, planes of the particles facing the substrate 120 are not the same and thus, the thickness and the orientation of the crystals cannot be uniform in some cases.

Note that an In—Ga—Zn oxide film formed by a sputtering method has a smaller proportion of zinc atoms than a target. This might be because zinc oxide is more likely to be vaporized than indium oxide or gallium oxide. When an In—Ga—Zn oxide film has a composition ratio which is significantly different from the stoichiometric composition, e.g., $In_xGa_{2-x}O_3(ZnO)_m$ (0<x<2, m is a natural number), the film to be formed has lower crystallinity or is partly polycrystallized in some cases.

For example, the proportion of zinc atoms in the target may be increased in advance to form a CAAC-OS film having high crystallinity. By controlling the atomic ratio of the target, the atomic ratio of the In—Ga—Zn oxide film to be formed can have a value closer to the stoichiometric composition, e.g., $In_xGa_{2-x}O_3(ZnO)_m$ (0<x<2, m is a natural number).

However, depending on the atomic ratio, plural kinds of structures might be formed when the target is formed, and generation of a crack or a break might make it difficult to form the target. Therefore, adjustment for obtaining an In—Ga—Zn oxide film having a desired atomic ratio cannot be performed only by the atomic ratio of the target in some cases. For example, in the case where the atomic ratio of the target falls within the range where a crack or a break is hardly caused, the proportion of Zn atoms in the deposited In—Ga—Zn oxide film may be lower or higher than that in the stoichiometric composition.

Figure 1B:
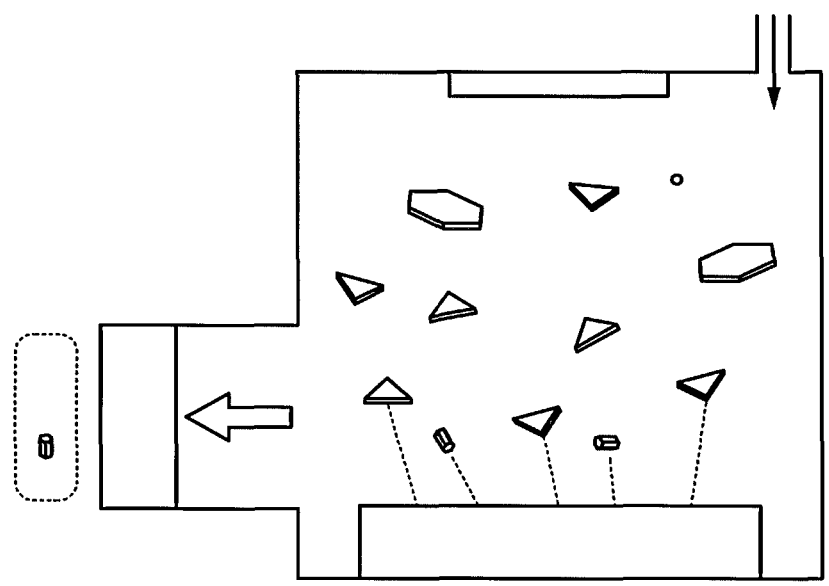

Thus, a method for depositing a CAAC-OS film having high crystallinity, in which optimal deposition conditions are set in accordance with the atomic ratio of the target, is described using FIGS. 1A and 1B.

A deposition chamber 170 illustrated in FIGS. 1A and 1B includes a target 130, a substrate 120, an exhaust port 150, a gas supply port 140. For example, the exhaust port 150 is connected to a vacuum pump via an orifice or the like and has a function of discharging substances in the deposition chamber 170 as emissions 160.

FIG. 1A shows the deposition chamber 170 at the time of deposition in the case where the proportion of zinc atoms in the target 130 is high. When the proportion of zinc atoms in the target 130 is high, pellets 100a and pellets 100b are separated, and columnar zinc oxide clusters 102, zinc oxide molecules 104, and the like are sputtered from the target 130.

After the zinc oxide molecule 104 reaches the substrate 120, crystal growth proceeds preferentially in the horizontal direction on the surface of the substrate 120 to form a zinc oxide layer. The zinc oxide layer has c-axis alignment. Note that c-axes of crystals in the zinc oxide layer are aligned in the direction parallel to a normal vector of the substrate 120. The zinc oxide layer serves as a seed layer for forming a CAAC-OS film and thus has a function of increasing the crystallinity of the CAAC-OS film. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Figure 3B:
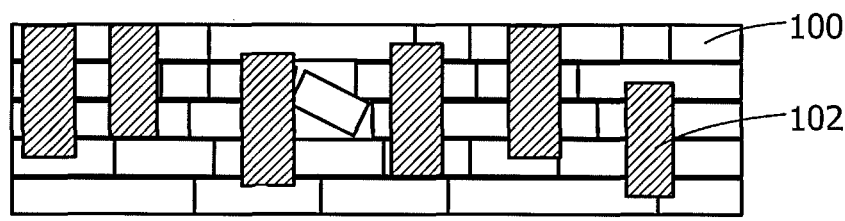

On the other hand, after the columnar zinc oxide cluster 102 reaches the substrate 120, crystal growth proceeds preferentially in the perpendicular direction on the surface of the substrate 120 to form a crystal grain. The crystal grain has a vertically long shape obtained as a result of crystal growth in the perpendicular direction, and therefore, inhibits bonding between the pellets 100, which might cause a defect such as a grain boundary. Therefore, when the columnar zinc oxide clusters 102 are attached to the substrate 120, it might be difficult to deposit a CAAC-OS film. FIG. 3B is a cross-sectional view of an In—Ga—Zn oxide film into which the columnar zinc oxide clusters 102 are mixed.

Therefore, in the case where the proportion of zinc atoms in the target 130 is high, in order to deposit a high-quality CAAC-OS film, attachment of the columnar zinc oxide clusters 102 to the substrate 120 is preferably prevented. Specifically, the number of discharged columnar zinc oxide clusters 102 is increased.

For example, the product of a pressure p of the deposition chamber 170 and a distance d between the target 130 and the substrate 120 is adjusted to less than 0.096 Pa·m, whereby the number of discharged columnar zinc oxide clusters 102 can be increased. As the pressure p becomes lower, the columnar zinc oxide clusters 102 are less likely to be formed. In addition, the columnar zinc oxide cluster 102 has a smaller volume and a longer mean free path than the pellet 100. Therefore, as the distance d is increased, the proportion of columnar zinc oxide clusters 102 which are attached to the substrate 120 is increased. Accordingly, it is preferable that the distance d be small.

Furthermore, to deposit a high-quality CAAC-OS film, one or more of the following methods and the like are preferably performed: the amount of emissions from exhaust port 150 is increased to increase the emissions 160; the amount of a gas supplied from the gas supply port 140 is reduced; the proportion of an oxygen gas supplied from the gas supply port 140 is increased; and the power at the time of deposition is increased. For example, it is preferable that the power at the time of deposition be increased because the deposited In—Ga—Zn oxide film has high density.

FIG. 1B shows the deposition chamber 170 at the time of deposition in the case where the proportion of zinc atoms in the target 130 is low. When the proportion of zinc atoms in the target 130 is low, the number of columnar zinc oxide clusters 102 which are sputtered from the target 130 at the same time as the pellets 100a and the pellets 100b are separated can be reduced.

Therefore, in the case where the proportion of zinc atoms in the target 130 is low, the number of discharged columnar zinc oxide clusters 102 is not necessarily increased. To deposit a high-quality CAAC-OS film, components containing zinc, such as zinc oxide included in the pellets 100a and the pellets 100b, are discharged as little as possible.

For example, the product of the pressure p of the deposition chamber 170 and the distance d between the target 130 and the substrate 120 is adjusted to greater than or equal to 0.096 Pa·m, whereby the amount of discharged zinc oxide can be reduced. In addition, the zinc oxide has a smaller volume and a longer mean free path than the pellet 100. Therefore, as the distance d is reduced, the proportion of zinc oxide which is attached to the substrate 120 is increased. Accordingly, it is preferable that the distance d be large.

Furthermore, to deposit a high-quality CAAC-OS film, one or more of the following methods and the like are preferably performed: the amount of emissions from exhaust port 150 is reduced to reduce the emissions 160; the amount of a gas supplied from the gas supply port 140 is increased; the proportion of an oxygen gas supplied from the gas supply port 140 is increased; and the power at the time of deposition is increased.

As described above, optimal deposition conditions are set in accordance with the atomic ratio of the target, whereby a high-quality CAAC-OS film can be deposited.

According to the deposition model described above, a high-quality CAAC-OS film can be obtained.

The CAAC-OS film formed in this manner has substantially the same density as a single crystal OS film. For example, the density of the single crystal OS film having a homologous structure of $InGaZnO_4$ is 6.36 $g/cm^3$, and the density of the CAAC-OS film having substantially the same atomic ratio is approximately 6.3 $g/cm^3$.

Figure 15A:
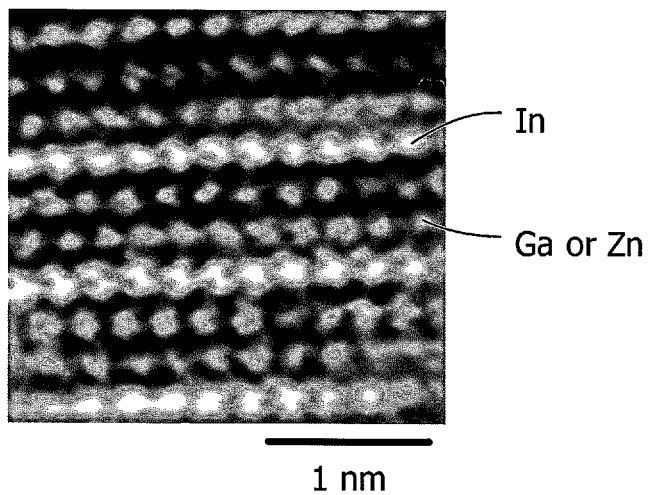
FIGS. 15A and 15B are cross-sectional HAADF-STEM images of a CAAC-OS film and a target.
Figure 15B:
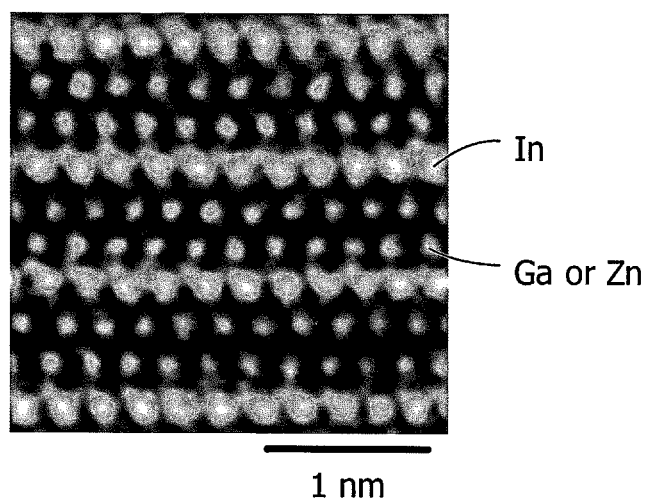

FIGS. 15A and 15B show atomic arrangements of cross sections of an In—Ga—Zn oxide film (see FIG. 15A) that is a CAAC-OS film deposited by a sputtering method and a target thereof (see FIG. 15B). For observation of the atomic arrangement, a high-angle annular dark field scanning transmission electron microscopy (HAADF-STEM) was used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 was used for the HAADF-STEM.

When FIG. 15A and FIG. 15B are compared, it is found that the CAAC-OS film and the target each have a homologous structure and arrangements of atoms in the CAAC-OS film correspond to those in the target.

<Deposition Apparatus>

A deposition apparatus with which the above-described CAAC-OS film can be deposited is described below.

First, a structure of a deposition apparatus which allows the entry of few impurities into a film at the time of the deposition is described with reference to FIG. 16 and FIGS. 17A to 17C.

Figure 16:
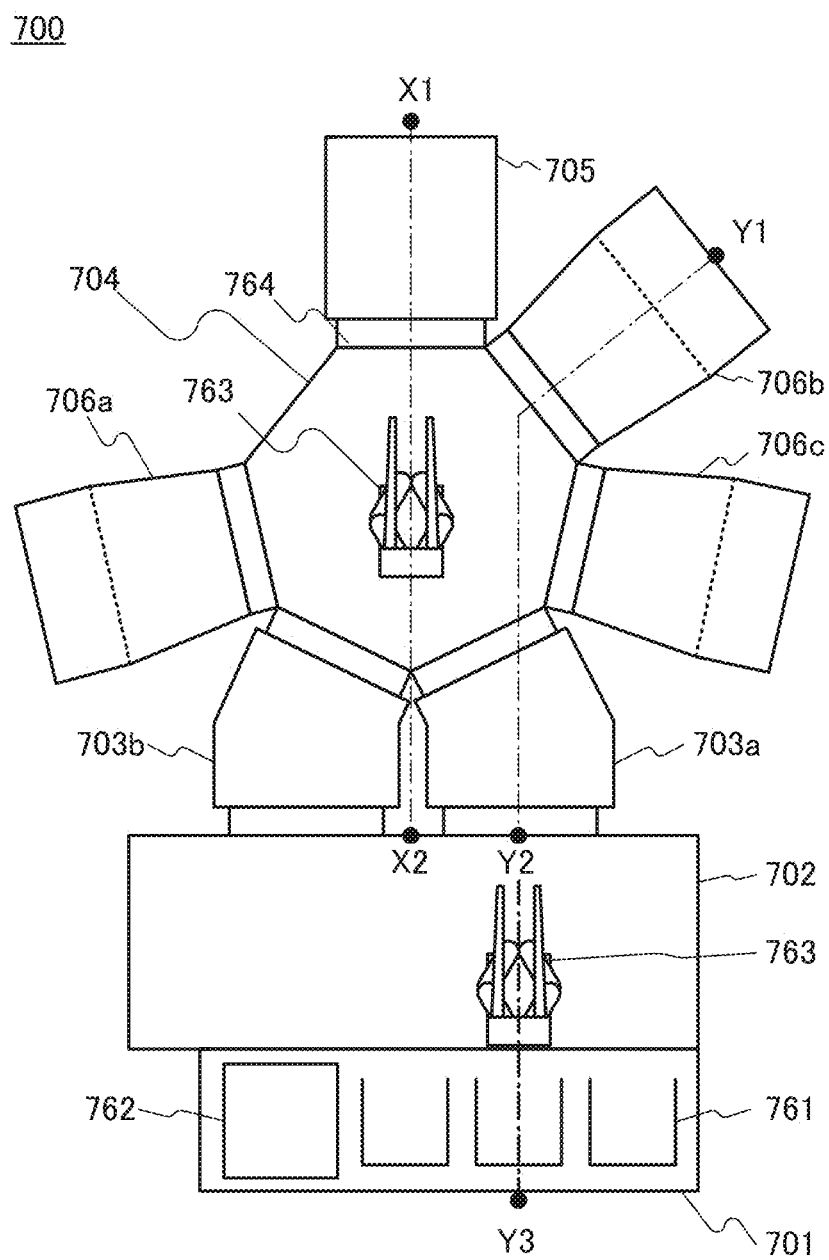
FIG. 16 is a top view illustrating an example of a deposition apparatus.

FIG. 16 is a top view schematically illustrating a single wafer multi-chamber deposition apparatus 700. The deposition apparatus 700 includes an atmosphere-side substrate supply chamber 701 including a cassette port 761 for holding a substrate and an alignment port 762 for performing alignment of a substrate, an atmosphere-side substrate transfer chamber 702 through which a substrate is transferred from the atmosphere-side substrate supply chamber 701, a load lock chamber 703a where a substrate is carried and the pressure inside the chamber is switched from atmospheric pressure to reduced pressure or from reduced pressure to atmospheric pressure, an unload lock chamber 703b where a substrate is carried out and the pressure inside the chamber is switched from reduced pressure to atmospheric pressure or from atmospheric pressure to reduced pressure, a transfer chamber 704 through which a substrate is transferred in a vacuum, a substrate heating chamber 705 where a substrate is heated, and deposition chambers 706a, 706b, and 706c in each of which a target is placed for deposition.

Note that a plurality of cassette ports 761 may be provided as illustrated in FIG. 16 (in FIG. 16, three cassette ports 761 are provided).

The atmosphere-side substrate transfer chamber 702 is connected to the load lock chamber 703a and the unload lock chamber 703b, the load lock chamber 703a and the unload lock chamber 703b are connected to the transfer chamber 704, and the transfer chamber 704 is connected to the substrate heating chamber 705 and the deposition chambers 706a, 706b, and 706c.

Gate valves 764 are provided for connecting portions between chambers so that each chamber except the atmosphere-side substrate supply chamber 701 and the atmosphere-side substrate transfer chamber 702 can be independently kept under vacuum. Moreover, the atmosphere-side substrate transfer chamber 702 and the transfer chamber 704 each include a transfer robot 763, with which a glass substrate can be transferred.

It is preferable that the substrate heating chamber 705 also serve as a plasma treatment chamber. In the deposition apparatus 700, it is possible to transfer a substrate without exposure to the air between treatment and treatment; therefore, adsorption of impurities on a substrate can be suppressed. In addition, the order of deposition, heat treatment, or the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 17A:
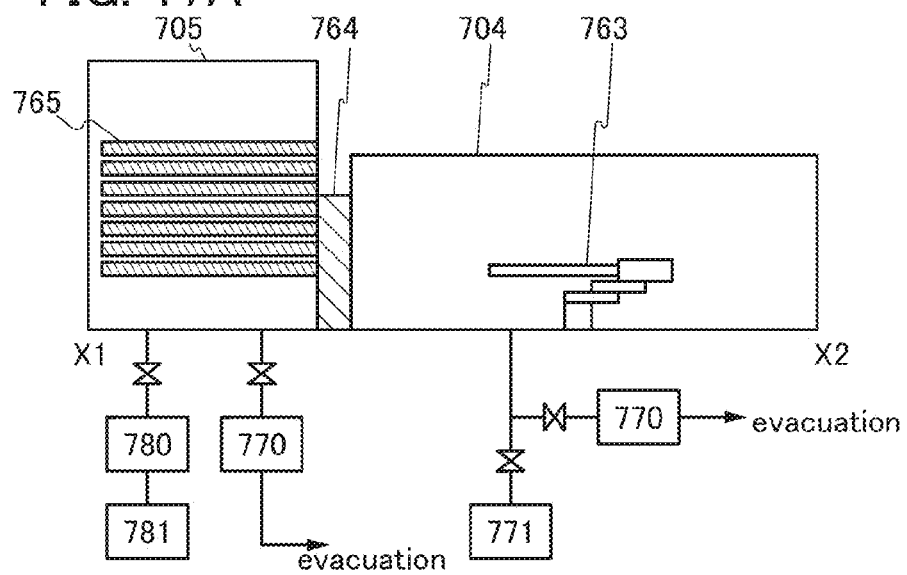
FIGS. 17A to 17C illustrate an example of the structure of a deposition apparatus.
Figure 17B:
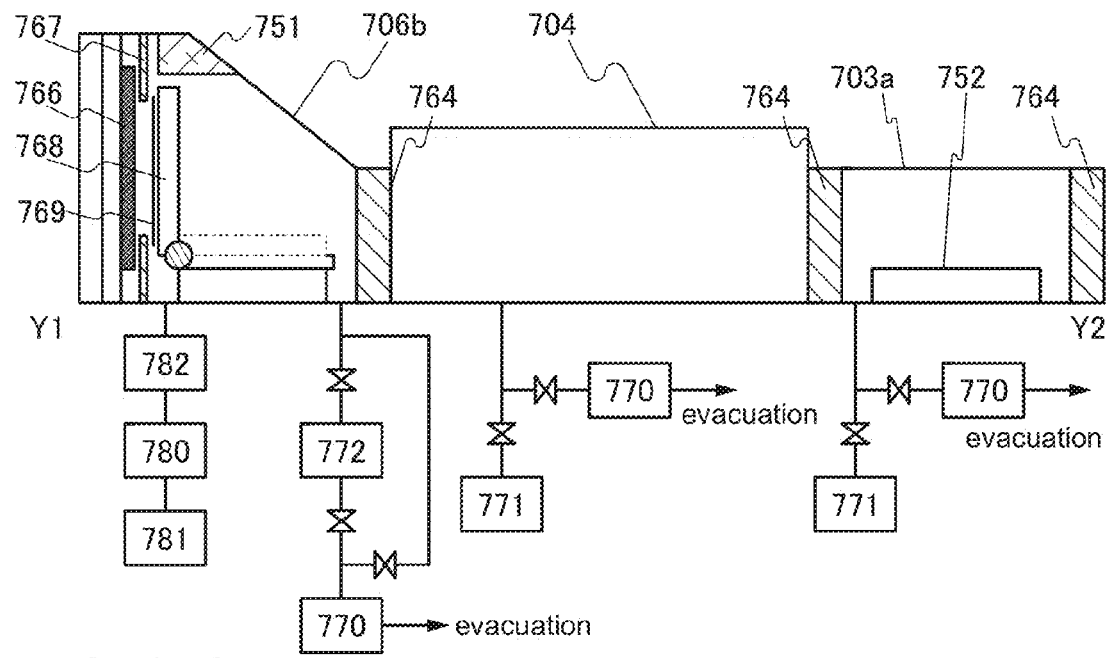
Figure 17C:
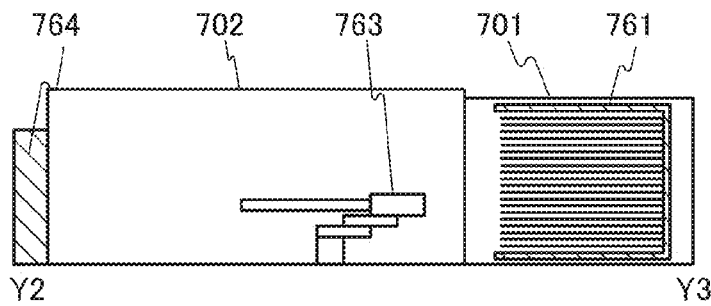

Next, FIG. 17A, FIG. 17B, and FIG. 17C are a cross-sectional view taken along dashed-dotted line X1-X2, a cross-sectional view taken along dashed-dotted line Y1-Y2, and a cross-sectional view taken along dashed-dotted line Y2-Y3, respectively, in the deposition apparatus 700 illustrated in FIG. 16.

FIG. 17A is a cross section of the substrate heating chamber 705 and the transfer chamber 704, and the substrate heating chamber 705 includes a plurality of heating stages 765 which can hold a substrate. Note that although the number of heating stages 765 illustrated in FIG. 17A is seven, it is not limited thereto and may be greater than or equal to one and less than seven, or greater than or equal to eight. It is preferable to increase the number of the heating stages 765 because a plurality of substrates can be subjected to heat treatment at the same time, which leads to an increase in productivity. In addition, the substrate heating chamber 705 is connected to a vacuum pump 770 through a valve. As the vacuum pump 770, a dry pump and a mechanical booster pump can be used, for example.

As heating mechanism which can be used for the substrate heating chamber 705, a resistance heater may be used for heating, for example. Alternatively, heat conduction or heat radiation from a medium such as a heated gas may be used as the heating mechanism. For example, rapid thermal annealing (RTA) such as gas rapid thermal annealing (GRTA) or lamp rapid thermal annealing (LRTA) can be used. The LRTA is a method for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA, heat treatment is performed using a high-temperature gas. An inert gas is used as the gas.

Moreover, the substrate heating chamber 705 is connected to a refiner 781 through a mass flow controller 780. Note that although the mass flow controller 780 and the refiner 781 can be provided for each of a plurality of kinds of gases, only one mass flow controller 780 and one refiner 781 are provided for easy understanding. As the gas introduced to the substrate heating chamber 705, a gas whose dew point is −80° C. or lower, preferably −100° C. or lower can be used; for example, an oxygen gas, a nitrogen gas, and a rare gas (e.g., an argon gas) are used.

The transfer chamber 704 includes the transfer robot 763. The transfer robot 763 includes a plurality of movable portions and an arm for holding a substrate and can transfer a substrate to each chamber. In addition, the transfer chamber 704 is connected to the vacuum pump 770 and a cryopump 771 through valves. With such a structure, evacuation can be performed using the vacuum pump 770 when the pressure inside the transfer chamber 704 is in the range of atmospheric pressure to low or medium vacuum (about 0.1 Pa to several hundred Pa) and then, by switching the valves, evacuation can be performed using the cryopump 771 when the pressure inside the transfer chamber 704 is in the range of middle vacuum to high or ultra-high vacuum (0.1 Pa to $1 \times 10^{-7}$ Pa).

Alternatively, two or more cryopumps 771 may be connected in parallel to the transfer chamber 704. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 17B is a cross section of the deposition chamber 706b, the transfer chamber 704, and the load lock chamber 703a.

Here, the details of the deposition chamber (sputtering chamber) are described with reference to FIG. 17B. The deposition chamber 706b illustrated in FIG. 17B includes a target 766, an attachment protection plate 767, and a substrate stage 768. Note that here, a substrate 769 is provided on the substrate stage 768. Although not illustrated, the substrate stage 768 may include a substrate holding mechanism which holds the substrate 769, a rear heater which heats the substrate 769 from the back surface, or the like.

Note that the substrate stage 768 is held substantially vertically to a floor during deposition and is held substantially parallel to the floor when the substrate is delivered. In FIG. 17B, the position where the substrate stage 768 is held when the substrate is delivered is denoted by a dashed line. With such a structure, the probability that dust or a particle which might be mixed into a film during the deposition is attached to the substrate 769 can be suppressed as compared with the case where the substrate stage 768 is held parallel to the floor. However, there is a possibility that the substrate 769 falls when the substrate stage 768 is held vertically (90°)

to the floor; therefore, the angle of the substrate stage 768 to the floor is preferably wider than or equal to 80° and narrower than 90°.

The attachment protection plate 767 can suppress deposition of a particle which is sputtered from the target 766 on a region where deposition is not needed. Moreover, the attachment protection plate 767 is preferably processed to prevent accumulated sputtered particles from being separated. For example, blasting treatment which increases surface roughness may be performed, or roughness may be formed on the surface of the attachment protection plate 767.

The deposition chamber 706b is connected to a mass flow controller 780 through a gas heating system 782, and the gas heating system 782 is connected to a refiner 781 through the mass flow controller 780. With the gas heating system 782, a gas which is introduced to the deposition chamber 706b can be heated to a temperature higher than or equal to 40° C. and lower than or equal to 400° C., preferably higher than or equal to 50° C. and lower than or equal to 200° C. Note that although the gas heating system 782, the mass flow controller 780, and the refiner 781 can be provided for each of a plurality of kinds of gases, only one gas heating system 782, one mass flow controller 780, and one refiner 781 are provided for easy understanding. As the gas introduced to the deposition chamber 706b, a gas whose dew point is −80° C. or lower, preferably −100° C. or lower can be used; for example, an oxygen gas, a nitrogen gas, and a rare gas (e.g., an argon gas) are used.

A facing-target-type sputtering apparatus may be provided in the deposition chamber 706b. In a facing-target-type sputtering apparatus, plasma is confined between targets; therefore, plasma damage to a substrate can be reduced. Moreover, step coverage can be improved because an incident angle of a sputtered particle to the substrate can be made smaller depending on the inclination of the target.

Note that a parallel-plate-type sputtering apparatus or an ion beam sputtering apparatus may be provided in the deposition chamber 706b.

In the case where the refiner is provided just before the gas is introduced, the length of a pipe between the refiner and the deposition chamber 706b is less than or equal to 10 m, preferably less than or equal to 5 m, more preferably less than or equal to 1 m. When the length of the pipe is less than or equal to 10 m, less than or equal to 5 m, or less than or equal to 1 m, the effect of the release of gas from the pipe can be reduced accordingly. As the pipe for the gas, a metal pipe the inside of which is covered with iron fluoride, aluminum oxide, chromium oxide, or the like can be used. With the above pipe, the amount of released gas containing impurities is made small and the entry of impurities into the gas can be reduced as compared with a SUS316L-EP pipe, for example. In addition, a high-performance ultra-compact metal gasket joint (UPG joint) may be used as a joint of the pipe. A structure where all the materials of the pipe are metals is preferable because the effect of the generated released gas or the external leakage can be reduced as compared with a structure where resin or the like is used.

The deposition chamber 706b is connected to a turbo molecular pump 772 and a vacuum pump 770 through valves.

In addition, the deposition chamber 706b is provided with a cryotrap 751.

The cryotrap 751 is a mechanism which can adsorb a molecule (or an atom) having a relatively high melting point, such as water. The turbo molecular pump 772 is capable of stably evacuating a large-sized molecule (or atom), needs low frequency of maintenance, and thus enables high productivity, whereas it has a low capability in evacuating hydrogen and water. Hence, the cryotrap 751 is connected to the deposition chamber 706b so as to have a high capability in evacuating water or the like. The temperature of a refrigerator of the cryotrap 751 is set to be lower than or equal to 100 K, preferably lower than or equal to 80 K. In the case where the cryotrap 751 includes a plurality of refrigerators, it is preferable to set the temperature of each refrigerator at a different temperature because efficient evacuation is possible. For example, the temperature of a first-stage refrigerator may be set to be lower than or equal to 100 K and the temperature of a second-stage refrigerator may be set to be lower than or equal to 20 K.

Note that the evacuation method of the deposition chamber 706b is not limited to the above, and a structure similar to that in the evacuation method described in the transfer chamber 704 (the evacuation method using the cryopump and the vacuum pump) may be employed. Needless to say, the evacuation method of the transfer chamber 704 may have a structure similar to that of the deposition chamber 706b (the evacuation method using the turbo molecular pump and the vacuum pump).

Note that in each of the transfer chamber 704, the substrate heating chamber 705, and the deposition chamber 706b which are described above, the back pressure (total pressure) and the partial pressure of each gas molecule (atom) are preferably set as follows. In particular, the back pressure and the partial pressure of each gas molecule (atom) in the deposition chamber 706b need to be noted because impurities might enter a film to be formed.

In each of the above chambers, the back pressure (total pressure) is less than or equal to $1\times10^{-4}$ Pa, preferably less than or equal to $3\times10^{-5}$ Pa, more preferably less than or equal to $1\times10^{-5}$ Pa. In each of the above chambers, the partial pressure of a gas molecule (atom) having a mass-to-charge ratio (m/z) of 18 is less than or equal to $3\times10^{-5}$ Pa, preferably less than or equal to $1\times10^{-5}$ Pa, more preferably less than or equal to $3\times10^{-6}$ Pa. Moreover, in each of the above chambers, the partial pressure of a gas molecule (atom) having a mass-to-charge ratio (m/z) of 28 is less than or equal to $3\times10^{-5}$ Pa, preferably less than or equal to $1\times10^{-5}$ Pa, more preferably less than or equal to $3\times10^{-6}$ Pa. Furthermore, in each of the above chambers, the partial pressure of a gas molecule (atom) having a mass-to-charge ratio (m/z) of 44 is less than or equal to $3\times10^{-5}$ Pa, preferably less than or equal to $1\times10^{-5}$ Pa, more preferably less than or equal to $3\times10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. may be used.

Moreover, the transfer chamber 704, the substrate heating chamber 705, and the deposition chamber 706b which are described above preferably have a small amount of external leakage or internal leakage.

For example, in each of the transfer chamber 704, the substrate heating chamber 705, and the deposition chamber 706b which are described above, the leakage rate is less than or equal to $3\times10^{-6}$ Pa·m³/s, preferably less than or equal to $1\times10^{-6}$ Pa·m³/s. The leakage rate of a gas molecule (atom) having a mass-to-charge ratio (m/z) of 18 is less than or equal to $1\times10^{-7}$ Pa·m³/s, preferably less than or equal to $3\times10^{-8}$ Pa·m³/s. The leakage rate of a gas molecule (atom) having a mass-to-charge ratio (m/z) of 28 is less than or equal to $1\times10^{-5}$ Pa·m³/s, preferably less than or equal to $1\times10^{-6}$ Pa·m³/s. The leakage rate of a gas molecule (atom)

having a mass-to-charge ratio (m/z) of 44 is less than or equal to $3\times10^{-6}$ Pa·m³/s, preferably less than or equal to $1\times10^{-6}$ Pa·m³/s.

Note that a leakage rate can be derived from the total pressure and partial pressure measured using the mass analyzer.

The leakage rate depends on external leakage and internal leakage. The external leakage refers to inflow of gas from the outside of a vacuum system through a minute hole, a sealing defect, or the like. The internal leakage is due to leakage through a partition, such as a valve, in a vacuum system or due to released gas from an internal member. Measures need to be taken from both aspects of external leakage and internal leakage in order that the leakage rate is set to be less than or equal to the above value.

For example, an open/close portion of the deposition chamber 706b can be sealed with a metal gasket. For the metal gasket, metal covered with iron fluoride, aluminum oxide, or chromium oxide is preferably used. The metal gasket realizes higher adhesion than an O-ring, and can reduce the external leakage. Furthermore, with the use of the metal covered with iron fluoride, aluminum oxide, chromium oxide, or the like, which is in the passive state, the release of gas containing impurities released from the metal gasket is suppressed, so that the internal leakage can be reduced.

For a member of the deposition apparatus 700, aluminum, chromium, titanium, zirconium, nickel, or vanadium, which releases a smaller amount of gas containing impurities, is used. Alternatively, for the above member, an alloy containing iron, chromium, nickel, and the like covered with the above material may be used. The alloy containing iron, chromium, nickel, and the like is rigid, resistant to heat, and suitable for processing. Here, when surface unevenness of the member is decreased by polishing or the like to reduce the surface area, the release of gas can be reduced.

Alternatively, the above member of the deposition apparatus 700 may be covered with iron fluoride, aluminum oxide, chromium oxide, or the like.

The member of the deposition apparatus 700 is preferably formed with only metal as much as possible. For example, in the case where a viewing window formed with quartz or the like is provided, it is preferable that the surface of the viewing window be thinly covered with iron fluoride, aluminum oxide, chromium oxide, or the like so as to suppress release of gas.

When an adsorbed substance is present in the deposition chamber, the adsorbed substance does not affect the pressure in the deposition chamber because it is adsorbed onto an inner wall or the like; however, the adsorbed substance causes gas to be released when the inside of the deposition chamber is evacuated. Therefore, although there is no correlation between the leakage rate and the evacuation rate, it is important that the adsorbed substance present in the deposition chamber be desorbed as much as possible and evacuation be performed in advance with the use of a pump with high evacuation capability. Note that the deposition chamber may be subjected to baking to promote desorption of the adsorbed substance. By the baking, the desorption rate of the adsorbed substance can be increased about tenfold. The baking can be performed at a temperature in the range of 100° C. to 450° C. At this time, when the adsorbed substance is removed while an inert gas is introduced to the deposition chamber, the desorption rate of water or the like, which is difficult to be desorbed simply by evacuation, can be further increased. Note that when the inert gas which is introduced is heated to substantially the same temperature as the baking temperature of the deposition chamber, the desorption rate of the adsorbed substance can be further increased. Here, a rare gas is preferably used as an inert gas. Depending on the kind of a film to be deposited, oxygen or the like may be used instead of an inert gas. For example, in the case of depositing an oxide, the use of oxygen which is the main component of the oxide is preferable in some cases.

Alternatively, treatment for evacuating the inside of the deposition chamber is preferably performed a certain period of time after heated oxygen, a heated inert gas such as a heated rare gas, or the like is introduced to increase a pressure in the deposition chamber. The introduction of the heated gas can desorb the adsorbed substance in the deposition chamber, and the impurities present in the deposition chamber can be reduced. Note that an advantageous effect can be achieved when this treatment is repeated more than or equal to 2 times and less than or equal to 30 times, preferably more than or equal to 5 times and less than or equal to 15 times. Specifically, an inert gas, oxygen, or the like with a temperature higher than or equal to 40° C. and lower than or equal to 400° C., preferably higher than or equal to 50° C. and lower than or equal to 200° C. is introduced to the deposition chamber, so that the pressure therein can be kept to be greater than or equal to 0.1 Pa and less than or equal to 10 kPa, preferably greater than or equal to 1 Pa and less than or equal to 1 kPa, more preferably greater than or equal to 5 Pa and less than or equal to 100 Pa in the time range of 1 minute to 300 minutes, preferably 5 minutes to 120 minutes. After that, the inside of the deposition chamber is evacuated in the time range of 5 minutes to 300 minutes, preferably 10 minutes to 120 minutes.

The desorption rate of the adsorbed substance can be further increased also by dummy deposition. Here, the dummy deposition refers to deposition on a dummy substrate by a sputtering method or the like, in which a film is deposited on the dummy substrate and the inner wall of the deposition chamber so that impurities in the deposition chamber and an adsorbed substance on the inner wall of the deposition chamber are confined in the film. For a dummy substrate, a substrate which releases a smaller amount of gas is preferably used. By performing dummy deposition, the concentration of impurities in a film which will be deposited later can be reduced. Note that the dummy deposition may be performed at the same time as the baking of the deposition chamber.

Next, the details of the transfer chamber 704 and the load lock chamber 703a illustrated in FIG. 17B and the atmosphere-side substrate transfer chamber 702 and the atmosphere-side substrate supply chamber 701 illustrated in FIG. 17C are described. Note that FIG. 17C is a cross section of the atmosphere-side substrate transfer chamber 702 and the atmosphere-side substrate supply chamber 701.

For the transfer chamber 704 illustrated in FIG. 17B, the description of the transfer chamber 704 illustrated in FIG. 17A can be referred to.

The load lock chamber 703a includes a substrate delivery stage 752. When a pressure in the load lock chamber 703a becomes atmospheric pressure by being increased from reduced pressure, the substrate delivery stage 752 receives a substrate from the transfer robot 763 provided in the atmosphere-side substrate transfer chamber 702. After that, the load lock chamber 703a is evacuated into vacuum so that the pressure therein becomes reduced pressure and then the transfer robot 763 provided in the transfer chamber 704 receives the substrate from the substrate delivery stage 752.

Furthermore, the load lock chamber 703a is connected to the vacuum pump 770 and the cryopump 771 through valves. For a method for connecting evacuation systems such as the vacuum pump 770 and the cryopump 771, the description of the method for connecting the transfer chamber 704 can be referred to, and the description thereof is omitted here. Note that the unload lock chamber 703b illustrated in FIG. 16 can have a structure similar to that in the load lock chamber 703a.

The atmosphere-side substrate transfer chamber 702 includes the transfer robot 763. The transfer robot 763 can deliver a substrate from the cassette port 761 to the load lock chamber 703a or deliver a substrate from the load lock chamber 703a to the cassette port 761. Furthermore, a mechanism for suppressing entry of dust or a particle, such as high efficiency particulate air (HEPA) filter, may be provided above the atmosphere-side substrate transfer chamber 702 and the atmosphere-side substrate supply chamber 701.

The atmosphere-side substrate supply chamber 701 includes a plurality of cassette ports 761. The cassette port 761 can hold a plurality of substrates.

The surface temperature of the target is set to be lower than or equal to 100° C., preferably lower than or equal to 50° C., more preferably about room temperature (typically, 25° C.). In a sputtering apparatus for a large substrate, a large target is often used. However, it is difficult to form a target for a large substrate without a juncture. In fact, a plurality of targets are arranged so that there is as little space as possible therebetween to obtain a large shape; however, a slight space is inevitably generated. When the surface temperature of the target increases, in some cases, zinc or the like is volatilized from such a slight space and the space might be expanded gradually. When the space expands, a metal of a backing plate or a metal used for adhesion might be sputtered and might cause an increase in impurity concentration. Thus, it is preferable that the target be cooled sufficiently.

Specifically, for the backing plate, a metal having high conductivity and a high heat dissipation property (specifically copper) is used. The target can be cooled efficiently by making a sufficient amount of cooling water flow through a water channel which is formed in the backing plate.

Note that in the case where the target includes zinc, plasma damage is alleviated by the deposition in an oxygen gas atmosphere; thus, an oxide film in which zinc is unlikely to be volatilized can be obtained.

Specifically, the concentration of hydrogen in the CAAC-OS film, which is measured by secondary ion mass spectrometry (SIMS), can be set to be lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$.

The concentration of nitrogen in the CAAC-OS film, which is measured by SIMS, can be set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The concentration of carbon in the CAAC-OS film, which is measured by SIMS, can be set to be lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The amount of each of the following gas molecules (atoms) released from the CAAC-OS film can be less than or equal to $1\times10^{19}$/cm$^3$, preferably less than or equal to $1\times10^{18}$/cm$^3$, which is measured by thermal desorption spectroscopy (TDS) analysis: a gas molecule (atom) having a mass-to-charge ratio (m/z) of 2 (e.g., hydrogen molecule), a gas molecule (atom) having a mass-to-charge ratio (m/z) of 18, a gas molecule (atom) having a mass-to-charge ratio (m/z) of 28, and a gas molecule (atom) having a mass-to-charge ratio (m/z) of 44.

With the above deposition apparatus, entry of impurities into the CAAC-OS film can be suppressed. Further, when a film in contact with the CAAC-OS film is formed with the use of the above deposition apparatus, the entry of impurities into the CAAC-OS film from the film in contact therewith can be suppressed.

<Application of CAAC-OS Film>

The CAAC-OS film can be used as a semiconductor film of a transistor, for example.

<Transistor Including CAAC-OS Film>

The structure of the transistor of one embodiment of the present invention and a manufacturing method thereof are described below.

<Transistor Structure (1)>

An example of a top-gate and top-contact transistor is described first.

FIGS. 18A to 18C are a top view and cross-sectional views of the transistor. FIG. 18A is a top view of the transistor. FIGS. 18B1 and 18B2 are each a cross-sectional view taken along dashed-dotted line A1-A2 in FIG. 18A. FIG. 18C is a cross-sectional view taken along dashed-dotted line A3-A4 in FIG. 18A.

In FIGS. 18B1 and 18B2, the transistor includes a base insulating film 202 over a substrate 200; an oxide semiconductor film 206 over the base insulating film 202; a source electrode 216a and a drain electrode 216b over the oxide semiconductor film 206; a gate insulating film 212 over the oxide semiconductor film 206, the source electrode 216a, and the drain electrode 216b; and a gate electrode 204 over the gate insulating film 212. Note that it is preferable that the transistor include a protective insulating film 218 over the source electrode 216a, the drain electrode 216b, the gate insulating film 212, and the gate electrode 204; and a wiring 226a and a wiring 226b over the protective insulating film 218. The gate insulating film 212 and the protective insulating film 218 have opening portions reaching the source electrode 216a and the drain electrode 216b, and the wiring 226a and the wiring 226b are in contact with the source electrode 216a and the drain electrode 216b, respectively through the openings. Note that the transistor does not necessarily include the base insulating film 202.

In FIG. 18A which is the top view, the distance between the source electrode 216a and the drain electrode 216b in a region where the oxide semiconductor film 206 and the gate electrode 204 overlap each other is called a channel length. Moreover, in the region where the oxide semiconductor film 206 and the gate electrode 204 overlap each other, a line connecting the center points in the region between the source electrode 216a and the drain electrode 216b is called a channel width. Note that a channel formation region refers to a region of the oxide semiconductor film 206 which is located between the source electrode 216a and the drain electrode 216b and over which the gate electrode 204 is located. Furthermore, a channel refers to a region of the oxide semiconductor film 206 through which current mainly flows.

Note that as illustrated in FIG. 18A, the gate electrode 204 is provided such that the channel formation region in the oxide semiconductor film 206 is located on the inner side of the gate electrode 204 in the top view. With such a structure, when light irradiation is performed from the gate electrode 204 side, generation of carriers in the oxide semiconductor film 206 due to light can be suppressed. In other words, the gate electrode 204 functions as a light-blocking film. Note that the channel formation region in the oxide semiconductor film 206 may be provided to extend to the outside the gate electrode 204.

The oxide semiconductor film 206 is described below. The CAAC-OS film can be used as the oxide semiconductor film 206.

The oxide semiconductor film 206 is an oxide containing indium. An oxide can have a high carrier mobility (electron mobility) by containing indium, for example. Furthermore, the oxide semiconductor film 206 preferably contains an element M. The element M is aluminum, gallium, yttrium, or tin, for example. The element M is an element having a high bonding energy with oxygen, for example. The element M is an element that can increase the energy gap of the oxide, for example. In addition, the oxide semiconductor film 206 preferably contains zinc. When the oxide contains zinc, the oxide is easily to be crystallized, for example. The energy at the top of the valence band of the oxide can be controlled with the atomic ratio of zinc, for example.

Note that the oxide semiconductor film 206 is not limited to the oxide containing indium. The oxide semiconductor film 206 may be a Zn—Sn oxide or a Ga—Sn oxide, for example.

A first oxide semiconductor film and a second oxide semiconductor film may be provided over and under the channel formation region of the oxide semiconductor film 206. Note that the second oxide semiconductor film is provided between the oxide semiconductor film 206 and the gate insulating film 212.

Note that it is preferable that the first oxide semiconductor film and/or the second oxide semiconductor film be a CAAC-OS film. Atoms are arranged orderly in a CAAC-OS film, and thus a CAAC-OS film has high density and a function of blocking diffusion of copper. Therefore, use of a conductive film containing copper for the source electrode 216a and the drain electrode 216b described later does not cause deterioration of the electrical characteristics of a transistor. The conductive film containing copper, which has low electrical resistance, makes it possible to obtain a transistor having excellent electrical characteristics.

The first oxide semiconductor film includes one or more elements other than oxygen included in the oxide semiconductor film 206. Since the first oxide semiconductor film includes one or more kinds of elements other than oxygen included in the oxide semiconductor film 206, an interface state is less likely to be formed at the interface between the oxide semiconductor film 206 and the first oxide semiconductor film.

The second oxide semiconductor film includes one or more elements other than oxygen included in the oxide semiconductor film 206. Since the second oxide semiconductor film includes one or more kinds of elements other than oxygen included in the oxide semiconductor film 206, an interface state is less likely to be formed at the interface between the oxide semiconductor film 206 and the second oxide semiconductor film.

In the case where the first oxide semiconductor film is an In-M-Zn oxide, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. In the case where the oxide semiconductor film 206 is an In-M-Zn oxide, when summation of In and M is assumed to be 100 atomic %, the proportions of In and M are preferably set to be greater than or equal to 25 atomic % and less than 75 atomic %, respectively, and further preferably greater than or equal to 34 atomic % and less than 66 atomic %, respectively. In the case where the second oxide semiconductor film is an In-M-Zn oxide, when summation of In and M is assumed to be 100 atomic %, the proportions of In and M are preferably set to be less than 50 atomic % and greater than or equal to 50 atomic %, respectively, and further preferably less than 25 atomic % and greater than or equal to 75 atomic %, respectively. Note that the second oxide semiconductor film may be formed using the same kind of oxide as that of the first oxide semiconductor film.

Here, a mixed region of the first oxide semiconductor film and the oxide semiconductor film 206 might exist between the first oxide semiconductor film and the oxide semiconductor film 206. Furthermore, a mixed region of the oxide semiconductor film 206 and the second oxide semiconductor film might exist between the oxide semiconductor film 206 and the second oxide semiconductor film. The mixed region has a low density of interface states. Therefore, the stack including the first oxide semiconductor film, the oxide semiconductor film 206, and the second oxide semiconductor film has a band structure in which the energy continuously changes at the interfaces of the films (also referred to as continuous junction).

As the oxide semiconductor film 206, an oxide with a wide energy gap is used. For example, the energy gap of the oxide semiconductor film 206 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV. Furthermore, the energy gap of the second oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the first oxide semiconductor film, an oxide with a wide energy gap is used. For example, the energy gap of the first oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV.

As the second oxide semiconductor film, an oxide with a wide energy gap is used. The energy gap of the second oxide semiconductor film is greater than or equal to 2.7 eV and less than or equal to 4.9 eV, preferably greater than or equal to 3 eV and less than or equal to 4.7 eV, further preferably greater than or equal to 3.2 eV and less than or equal to 4.4 eV. Note that the first oxide semiconductor film and the second oxide semiconductor film have wider energy gaps than the oxide semiconductor film 206.

As the oxide semiconductor film 206, an oxide having an electron affinity higher than that of the first oxide semiconductor film is used. For example, as the oxide semiconductor film 206, an oxide having higher electron affinity than the first oxide semiconductor film by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy gap between the vacuum level and the bottom of the conduction band.

As the oxide semiconductor film 206, an oxide having an electron affinity higher than that of the second oxide semiconductor film is used. For example, as the oxide semiconductor film 206, an oxide having higher electron affinity than the second oxide semiconductor film by 0.07 eV or higher and 1.3 eV or lower, preferably 0.1 eV or higher and 0.7 eV or lower, further preferably 0.15 eV or higher and 0.5 eV or lower is used. Note that the electron affinity refers to an energy gap between the vacuum level and the bottom of the conduction band.

At this time, when an electric field is applied to the gate electrode 204, a channel is formed in the oxide semiconductor film 206, which has the highest electron affinity among the first oxide semiconductor film, the oxide semiconductor film 206, and the second oxide semiconductor film.

To increase the on-state current of the transistor, the thickness of the second oxide semiconductor film is preferably as small as possible. For example, the thickness of the second oxide semiconductor film is less than 10 nm, preferably less than or equal to 5 nm, further preferably less than or equal to 3 nm. Meanwhile, the second oxide semiconductor film has a function of blocking elements other than oxygen (such as silicon) included in the gate insulating film 212 from entering the oxide semiconductor film 206 where the channel is formed. Thus, the second oxide semiconductor film preferably has a certain thickness. For example, the thickness of the second oxide semiconductor film is greater than or equal to 0.3 nm, preferably greater than or equal to 1 nm, further preferably greater than or equal to 2 nm.

To improve reliability, preferably, the thickness of the first oxide semiconductor film is large, the thickness of the oxide semiconductor film 206 is small, and the thickness of the second oxide semiconductor film is small. Specifically, the thickness of the first oxide semiconductor film is greater than or equal to 20 nm, preferably greater than or equal to 30 nm, further preferably greater than or equal to 40 nm, still further preferably greater than or equal to 60 nm. With the first oxide semiconductor film having a thickness greater than or equal to 20 nm, preferably greater than or equal to 30 nm, further preferably greater than or equal to 40 nm, still further preferably greater than or equal to 60 nm, the distance from the interface between the base insulating film 202 and the first oxide semiconductor film to the oxide semiconductor film 206 where the channel is formed can be greater than or equal to 20 nm, preferably greater than or equal to 30 nm, further preferably greater than or equal to 40 nm, still further preferably greater than or equal to 60 nm. To prevent the productivity of the semiconductor device from being lowered, the thickness of the first oxide semiconductor film is less than or equal to 200 nm, preferably less than or equal to 120 nm, further preferably less than or equal to 80 nm. The thickness of the oxide semiconductor film 206 is greater than or equal to 3 nm and less than or equal to 100 nm, preferably greater than or equal to 3 nm and less than or equal to 80 nm, more preferably greater than or equal to 3 nm and less than or equal to 50 nm.

For example, the first oxide semiconductor film may be thicker than the oxide semiconductor film 206, and the oxide semiconductor film 206 may be thicker than the second oxide semiconductor film.

Influence of impurities in the oxide semiconductor film 206 is described below. In order to obtain stable electrical characteristics of a transistor, it is effective to reduce the concentration of impurities in the oxide semiconductor film 206 to have lower carrier density so that the oxide semiconductor film 206 is highly purified. The carrier density of the oxide semiconductor film 206 is lower than $1\times10^{17}/cm^3$, lower than $1\times10^{15}/cm^3$, or lower than $1\times10^{13}/cm^3$. In order to reduce the concentration of impurities in the oxide semiconductor film 206, the concentration of impurities in a film which is adjacent to the oxide semiconductor film 206 is preferably reduced.

For example, silicon in the oxide semiconductor film 206 might serve as a carrier trap or a carrier generation source. Therefore, the concentration of silicon in a region between the oxide semiconductor film 206 and the first oxide semiconductor film measured by secondary ion mass spectrometry (SIMS) is lower than $1\times10^{19}$ atoms/cm$^3$, preferably lower than $5\times10^{18}$ atoms/cm$^3$, further preferably lower than $2\times10^{18}$ atoms/cm$^3$. The concentration of silicon in a region between the oxide semiconductor film 206 and the second oxide semiconductor film measured by SIMS is lower than $1\times10^{19}$ atoms/cm$^3$, preferably lower than $5\times10^{18}$ atoms/cm$^3$, further preferably lower than $2\times10^{18}$ atoms/cm$^3$.

Furthermore, when hydrogen is contained in the oxide semiconductor film 206, the carrier density is increased in some cases. Thus, the concentration of hydrogen in the oxide semiconductor film 206, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{18}$ atoms/cm$^3$, still further preferably lower than or equal to $5\times10^{18}$ atoms/cm$^3$. When nitrogen is contained in the oxide semiconductor film 206, the carrier density is increased in some cases. The concentration of nitrogen in the oxide semiconductor film 206, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the first oxide semiconductor film in order to reduce the concentration of hydrogen in the oxide semiconductor film 206. Thus, the concentration of hydrogen in the first oxide semiconductor film, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the first oxide semiconductor film in order to reduce the concentration of nitrogen in the oxide semiconductor film 206. The concentration of nitrogen in the first oxide semiconductor film, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

It is preferable to reduce the concentration of hydrogen in the second oxide semiconductor film in order to reduce the concentration of hydrogen in the oxide semiconductor film 206. Thus, the concentration of hydrogen in the second oxide semiconductor film, which is measured by SIMS, is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. It is preferable to reduce the concentration of nitrogen in the second oxide semiconductor film in order to reduce the concentration of nitrogen in the oxide semiconductor film 206. The concentration of nitrogen in the second oxide semiconductor film, which is measured by SIMS, is lower than $5\times10^{19}$ atoms/

$cm^3$, preferably lower than or equal to $5\times10^{18}$ atoms/$cm^3$, further preferably lower than or equal to $1\times10^{18}$ atoms/$cm^3$, still further preferably lower than or equal to $5\times10^{17}$ atoms/$cm^3$.

For example, the base insulating film 202 illustrated in FIGS. 18A to 18C may be formed with a single layer or a stack using an insulating film including silicon oxide or silicon oxynitride. Furthermore, the base insulating film 202 is preferably an insulating film containing excess oxygen. For example, the thickness of the base insulating film 202 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The base insulating film 202 may be, for example, a stacked film including a silicon nitride film as a first layer and a silicon oxide film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in electron spin resonance (ESR) is lower than or equal to $3\times10^{17}$ spins/$cm^3$, preferably lower than or equal to $5\times10^{16}$ spins/$cm^3$ is used. As the silicon nitride film, a silicon nitride film from which hydrogen and ammonia are less released is used. The amount of released hydrogen and ammonia can be measured by TDS. Further, as the silicon nitride film, a silicon nitride film which does not transmit or hardly transmits hydrogen, water, and oxygen is used.

The base insulating film 202 may be, for example, a stacked film including a silicon nitride film as a first layer, a first silicon oxide film as a second layer, and a second silicon oxide film as a third layer. In that case, the first and/or second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3\times10^{17}$ spins/$cm^3$, preferably lower than or equal to $5\times10^{16}$ spins/$cm^3$ is used. As the second silicon oxide film, a silicon oxide film containing excess oxygen is used. As the silicon nitride film, a silicon nitride film from which hydrogen and ammonia are less released is used. Further, as the silicon nitride film, a silicon nitride film which does not transmit or hardly transmits hydrogen, water, and oxygen is used.

For example, the source electrode 216a and the drain electrode 216b may be formed with a single layer or a stacked layer of a conductive film containing one or more kinds of aluminum, titanium, chromium, cobalt, nickel, copper, yttrium, zirconium, molybdenum, ruthenium, silver, tantalum, and tungsten.

When the conductive film to be the source electrode 216a and the drain electrode 216b is deposited over the oxide semiconductor film 206, a defect might be generated in the oxide semiconductor film 206. Therefore, it is preferable that deposition of the conductive film to be the source electrode 216a and the drain electrode 216b be performed under the conditions where a defect is not generated. For example, in the case where the conductive film to be the source electrode 216a and the drain electrode 216b is deposited by a sputtering method, the power density at the time of deposition is set low (approximately 3 W/$cm^2$ or lower).

Figure 19A:
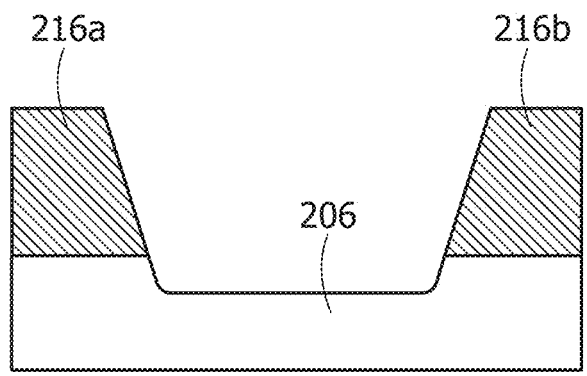
FIGS. 19A and 19B are cross-sectional views each illustrating part of a transistor of one embodiment of the present invention.
Figure 19B:
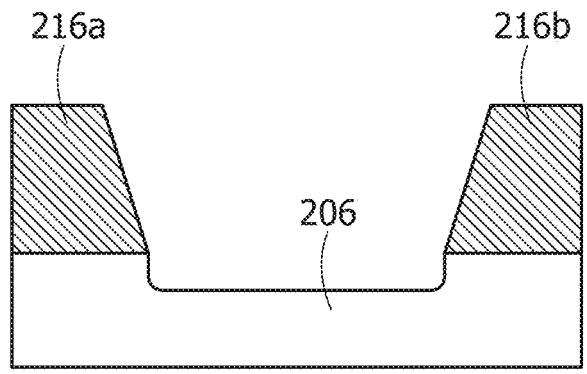

In forming the source electrode 216a and the drain electrode 216b, part of the oxide semiconductor film 206 might be etched to form a groove. FIGS. 19A and 19B each illustrate an example in which a groove is formed in a region of the oxide semiconductor film 206 over which neither the source electrode 216a nor the drain electrode 216b is provided.

FIG. 19A illustrates an example in which a groove is formed in the oxide semiconductor film 206 by anisotropic etching or the like. The side surface of the groove formed in the oxide semiconductor film 206 has a tapered shape. The shape illustrated in FIG. 19A can increase step coverage with the gate insulating film 212 or the like formed later. Therefore, the use of the transistor with the groove having the above shape can increase the yield of the semiconductor device.

FIG. 19B illustrates an example in which a groove is formed in the oxide semiconductor film 206 by anisotropic etching or the like. The groove having the shape illustrated in FIG. 19B can be obtained in such a manner that the oxide semiconductor film 206 is etched at a high etching rate as compared to that of the case where the groove having the shape illustrated in FIG. 19A is formed. The groove formed in the oxide semiconductor film 206 has a shape whose side surface has a steep angle. The shape illustrated in FIG. 19B is suitable for reduction in the size of the transistor. Therefore, the use of the transistor with the groove having the above shape can increase the degree of integration of the semiconductor device.

For example, the gate insulating film 212 may be formed using a single layer or a stacked layer of an insulating film containing one or more kinds of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The gate insulating film 212 is preferably formed using an insulating film containing excess oxygen. The thickness (or equivalent oxide thickness) of the gate insulating film 212 is, for example, greater than or equal to 1 nm and less than or equal to 500 nm, preferably greater than or equal to 3 nm and less than or equal to 300 nm, further preferably greater than or equal to 5 nm and less than or equal to 100 nm, still further preferably greater than or equal to 5 nm and less than or equal to 50 nm.

The gate insulating film 212 may be, for example, a stacked film including a silicon nitride film as a first layer and a silicon oxide film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3\times10^{17}$ spins/$cm^3$, preferably lower than or equal to $5\times10^{16}$ spins/$cm^3$ is used. As the silicon oxide film, a silicon oxide film containing excess oxygen is preferably used. As the silicon nitride film, a silicon nitride film from which a hydrogen gas and an ammonia gas are less released is used. The amount of released hydrogen gas and ammonia gas can be measured by TDS.

For example, the gate electrode 204 may be formed of a single layer or a stacked layer of a conductive film containing one or more kinds of aluminum, titanium, chromium, cobalt, nickel, copper, yttrium, zirconium, molybdenum, ruthenium, silver, tantalum, and tungsten.

The protective insulating film 218 may be formed with a single layer or a stacked layer of an insulating film containing one or more kinds of silicon oxide, silicon oxynitride, germanium oxide, yttrium oxide, zirconium oxide, lanthanum oxide, neodymium oxide, hafnium oxide, and tantalum oxide, for example. The protective insulating film 218 is preferably used using an insulating film containing excess oxygen. An insulating film which blocks oxygen may be used as the protective insulating film 218. For example, the thickness of the protective insulating film 218 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The wiring 226a and the wiring 226b may be formed using a single layer or a stacked layer of a conductive film containing one or more kinds of aluminum, titanium, chromium, cobalt, nickel, copper, yttrium, zirconium, molybdenum, ruthenium, silver, tantalum, and tungsten, for example.

There is no particular limitation on the substrate 200. For example, a glass substrate, a ceramic substrate, a quartz substrate, a sapphire substrate, or the like may be used as the substrate 200. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 200. Still alternatively, any of these substrates provided with a semiconductor element may be used as the substrate 200.

Further alternatively, a flexible substrate may be used as the substrate 200. Note that as a method for forming a transistor over a flexible substrate, there is also a method in which, after a transistor is formed over a non-flexible substrate, the transistor is separated from the non-flexible substrate and transferred to a flexible substrate corresponding to the substrate 200. In that case, a separation layer is preferably provided between the non-flexible substrate and the transistor.

<Transistor Structure (1)>

Next, an example which is different from the top-gate top-contact transistor having the transistor structure (1) is described as an example.

FIGS. 20A to 20C are a top view and cross-sectional views of a transistor. FIG. 20A is a top view of the transistor. FIGS. 20B1 and 20B2 are cross-sectional views taken along dashed-dotted line B1-B2 in FIG. 20A. FIG. 20C is a cross-sectional view taken along dashed-dotted line B3-B4 in FIG. 20A.

In FIGS. 20B1 and 20B2, the transistor includes a base insulating film 302 over a substrate 300; an oxide semiconductor film 306 over the base insulating film 302; a source electrode 316a and a drain electrode 316b which are in contact with the side surface of the oxide semiconductor film 306; a gate insulating film 312 over the oxide semiconductor film 306, the source electrode 316a, and the drain electrode 316b; and a gate electrode 304 over the gate insulating film 312. Note that it is preferable that the transistor include a protective insulating film 318 over the source electrode 316a, the drain electrode 316b, the gate insulating film 312, and the gate electrode 304; and a wiring 326a and a wiring 326b over the protective insulating film 318. Furthermore, the gate insulating film 312 and the protective insulating film 318 include openings reaching the source electrode 316a and the drain electrode 316b, and the wiring 326a and the wiring 326b are in contact with the source electrode 316a and the drain electrode 316b, respectively, through the openings. Note that the transistor does not necessarily include the base insulating film 302.

In the top view of FIG. 20A, the distance between the source electrode 316a and the drain electrode 316b in a region where the oxide semiconductor film 306 and the gate electrode 304 overlap each other is called a channel length. Moreover, in the region where the oxide semiconductor film 306 and the gate electrode 304 overlap each other, a line connecting the center points in the region between the source electrode 316a and the drain electrode 316b is called a channel width. Note that a channel formation region refers to a region of the oxide semiconductor film 306 which overlaps the gate electrode 304 and is located between the source electrode 316a and the drain electrode 316b. Furthermore, a channel refers to a region of the oxide semiconductor film 306 through which a current mainly flows.

Note that as illustrated in FIG. 20A, the gate electrode 304 is provided such that the channel formation region in the oxide semiconductor film 306 is located on the inner side of the gate electrode 304 in the top view. This structure can inhibit generation of carriers in the oxide semiconductor film 306 due to incident light from the gate electrode 304 side. In other words, the gate electrode 304 functions as a light-blocking film. Note that the channel formation region in the oxide semiconductor film 306 may be provided so as to extend to the outside of the gate electrode 304.

For example, the description of the substrate 200 is referred to for the substrate 300. The description of the base insulating film 202 is referred to for the base insulating film 302. The description of the oxide semiconductor film 206 is referred to for the oxide semiconductor film 306. The description of the source electrode 216a and the drain electrode 216b is referred to for the source electrode 316a and the drain electrode 316b. The description of the gate insulating film 212 is referred to for the gate insulating film 312. The description of the gate electrode 204 is referred to for the gate electrode 304. The description of the protective insulating film 218 is referred to for the protective insulating film 318. The description of the wiring 226a and the wiring 226b is referred to for the wiring 326a and the wiring 326b.

<Transistor Structure (3)>

Next, an example of a bottom-gate and top-contact transistor is described.

Figure 21A:
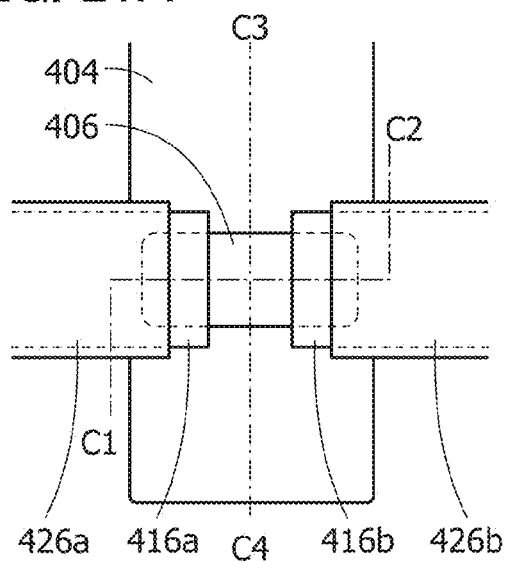
FIGS. 21A to 21C are a top view and cross-sectional views illustrating an example of a transistor of one embodiment of the present invention.
Figure 21C:
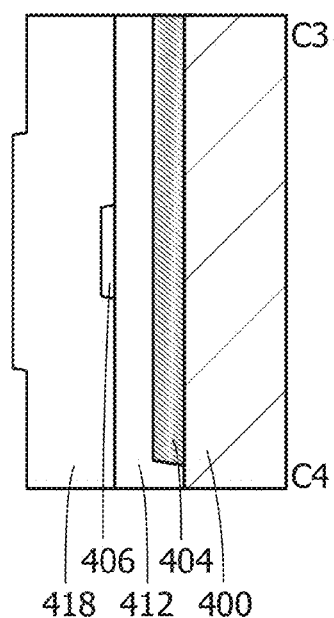
Figure 21B:
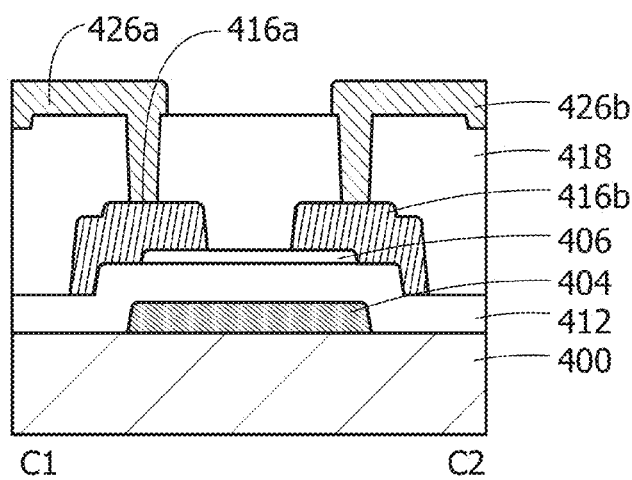

FIGS. 21A to 21C are a top view and cross-sectional views of the transistor. FIG. 21A is a top view of the transistor. FIG. 21B is a cross-sectional view taken along dashed-dotted line C1-C2 in FIG. 21A. FIG. 21C is a cross-sectional view taken along dashed-dotted line C3-C4 in FIG. 21A.

In FIG. 21B, the transistor includes a gate electrode 404 over a substrate 400, a gate insulating film 412 over the gate electrode 404, an oxide semiconductor film 406 over the gate insulating film 412, and a source electrode 416a and a drain electrode 416b over the oxide semiconductor film 406. Note that it is preferable that the transistor include a protective insulating film 418 over the source electrode 416a, the drain electrode 416b, the gate insulating film 412, and the oxide semiconductor film 406; and a wiring 426a and a wiring 426b over the protective insulating film 418. Furthermore, the protective insulating film 418 includes opening portions reaching the source electrode 416a and the drain electrode 416b, and the wiring 426a and the wiring 426b are in contact with the source electrode 416a and the drain electrode 416b, respectively, through the openings. Note that the transistor may include a base insulating film between the substrate 400 and the gate electrode 404.

The description of the transistor illustrated in FIGS. 18A to 18C is referred to for part of the description of the transistor illustrated in FIGS. 21A to 21C.

For example, the description of the substrate 200 is referred to for the substrate 400. The description of the oxide semiconductor film 206 is referred to for the oxide semiconductor film 406. The description of the source electrode 216a and the drain electrode 216b is referred to for the source electrode 416a and the drain electrode 416b. The description of the gate insulating film 212 is referred to for the gate insulating film 412. The description of the gate electrode 204 is referred to for the gate electrode 404. The description of the wiring 226a and the wiring 226b is referred to for the wiring 426a and the wiring 426b.

Note that as illustrated in FIG. 21A, the gate electrode 404 is provided such that the channel formation region in the oxide semiconductor film 406 is located on the inner side of the gate electrode 404 in the top view. With such a structure, when light irradiation is performed from the gate electrode 404 side, generation of carriers in the oxide semiconductor film 406 due to light can be suppressed. In other words, the gate electrode 404 functions as a light-blocking film. Note that the channel formation region in the oxide semiconductor film 406 may be provided to extend to the outside of the gate electrode 404.

For example, the protective insulating film 418 illustrated in FIGS. 21A to 21C may be formed with a single layer or a stack using an insulating film including silicon oxide or silicon oxynitride. Furthermore, the protective insulating film 418 is preferably an insulating film containing excess oxygen. For example, the thickness of the protective insulating film 418 is greater than or equal to 20 nm and less than or equal to 1000 nm, preferably greater than or equal to 50 nm and less than or equal to 1000 nm, further preferably greater than or equal to 100 nm and less than or equal to 1000 nm, still further preferably greater than or equal to 200 nm and less than or equal to 1000 nm.

The protective insulating film 418 may be, for example, a stacked film including a silicon oxide film as a first layer and a silicon nitride film as a second layer. Note that the silicon oxide film may be a silicon oxynitride film. A silicon nitride oxide film may be used instead of the silicon nitride film. It is preferable to use a silicon oxide film whose defect density is small as the silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the silicon nitride film, a silicon nitride film from which hydrogen and ammonia are less released is used. The amount of released hydrogen and ammonia can be measured by TDS. Further, as the silicon nitride film, a silicon nitride film which does not transmit or hardly transmits hydrogen, water, and oxygen is used.

The protective insulating film 418 may be, for example, a stacked film including a first silicon oxide film as a first layer, a second silicon oxide film as a second layer, and a silicon nitride film as a third layer. In that case, the first and/or second silicon oxide film may be a silicon oxynitride film. A silicon nitride oxide film may be used instead of the silicon nitride film. It is preferable to use a silicon oxide film whose defect density is small as the first silicon oxide film. Specifically, a silicon oxide film whose spin density attributed to a signal with a g factor of 2.001 in ESR is lower than or equal to $3\times10^{17}$ spins/cm$^3$, preferably lower than or equal to $5\times10^{16}$ spins/cm$^3$ is used. As the second silicon oxide film, a silicon oxide film containing excess oxygen is used. As the silicon nitride film, a silicon nitride film from which hydrogen and ammonia are less released is used. Further, as the silicon nitride film, a silicon nitride film which does not transmit or hardly transmits hydrogen, water, and oxygen is used.

The above transistor can be used for various purposes such as a memory, a CPU, and a display device, for example.

<Display Device>

A display device including any of the above transistors is described below.

Figure 22A:
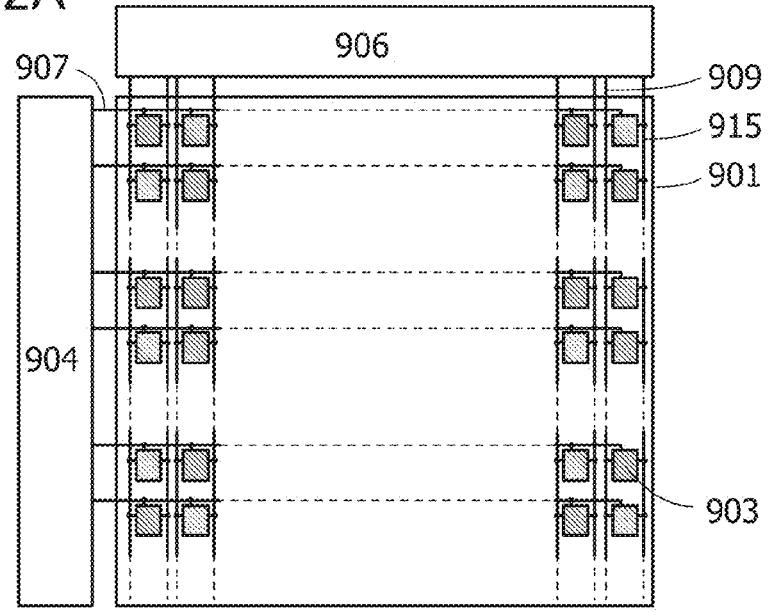
FIGS. 22A to 22C are a block diagram and circuit diagrams illustrating an example of a display device of one embodiment of the present invention.

FIG. 22A illustrates an example of the display device. The display device in FIG. 22A includes a pixel portion 901, a scan line driver circuit 904, a signal line driver circuit 906, m scan lines 907 which are arranged in parallel or substantially in parallel and whose potentials are controlled by the scan line driver circuit 904, and n signal lines 909 which are arranged in parallel or substantially in parallel and whose potentials are controlled by the signal line driver circuit 906. The pixel portion 901 includes a plurality of pixels 903 arranged in matrix. Capacitor lines 915 which are arranged in parallel or almost in parallel to the signal lines 909 are also provided. The capacitor lines 915 may be arranged in parallel or almost in parallel to the scan lines 907. Note that the scan line driver circuit 904 and the signal line driver circuit 906 are collectively referred to as a driver circuit portion in some cases.

Each scan line 907 is electrically connected to the n pixels 903 in the corresponding row among the pixels 903 arranged in m rows and n columns in the pixel portion 901. Each signal line 909 is electrically connected to the m pixels 903 in the corresponding column among the pixels 903 arranged in m rows and n columns. Note that m and n are natural numbers. Each capacitor line 915 is electrically connected to the n pixels 903 in the corresponding row among the pixels 903 arranged in m rows and n columns. Note that in the case where the capacitor lines 915 are arranged in parallel or substantially in parallel along the signal lines 909, each capacitor line 915 is electrically connected to the m pixels 903 in the corresponding column among the pixels 903 arranged in m rows and n columns.

Figure 22B:
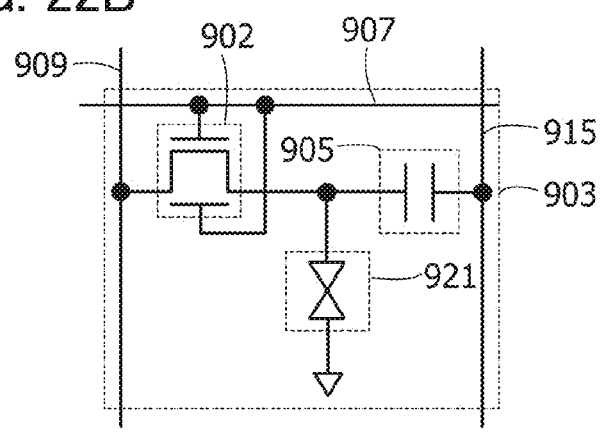
Figure 22C:
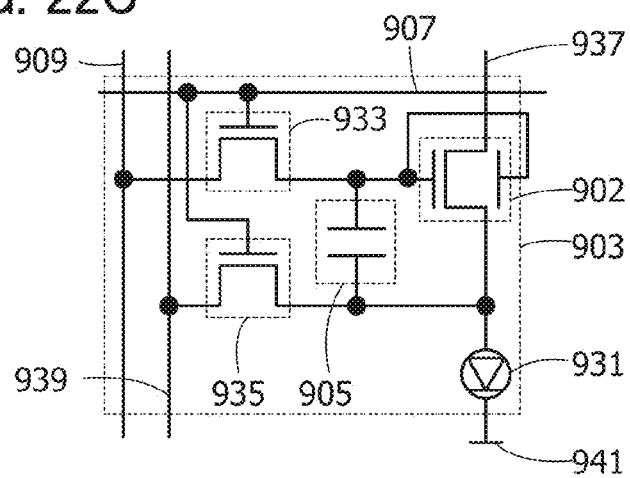

FIGS. 22B and 22C illustrate examples of circuit configurations that can be used for the pixels 903 in the display device illustrated in FIG. 22A.

The pixel 903 in FIG. 22B includes a liquid crystal element 921, a transistor 902, and a capacitor 905.

The potential of one of a pair of electrodes of the liquid crystal element 921 is set in accordance with the specifications of the pixel 903 as appropriate. The alignment state of the liquid crystal element 921 depends on written data. A common potential may be supplied to one of the pair of electrodes of the liquid crystal element 921 included in each of the plurality of pixels 903. Further, the potential supplied to one of a pair of electrodes of the liquid crystal element 921 in the pixel 903 in one row may be different from the potential supplied to one of a pair of electrodes of the liquid crystal element 921 in the pixel 903 in another row.

The liquid crystal element 921 is an element which controls transmission or non-transmission of light utilizing an optical modulation action of liquid crystal. The optical modulation action of a liquid crystal is controlled by an electric field applied to the liquid crystal (including a horizontal electric field, a vertical electric field, and an oblique electric field). Note that examples of the liquid crystal used for the liquid crystal element 921 include nematic liquid crystal, cholesteric liquid crystal, smectic liquid crystal, thermotropic liquid crystal, lyotropic liquid crystal, ferroelectric liquid crystal, and anti-ferroelectric liquid crystal.

Examples of a display mode which can be used for the display device including the liquid crystal element 921 include a TN mode, a VA mode, an axially symmetric aligned micro-cell (ASM) mode, an optically compensated birefringence (OCB) mode, an MVA mode, a patterned vertical alignment (PVA) mode, an IPS mode, an FFS mode, and a transverse bend alignment (TBA) mode. However, the display mode is not limited thereto.

A liquid crystal element including a liquid crystal composition including liquid crystal exhibiting a blue phase and a chiral material may be used. The liquid crystal exhibiting a blue phase has a short response time of 1 msec or less and is optically isotropic; therefore, alignment treatment is not necessary and the viewing angle dependence is small.

In the configuration of the pixel 903 in FIG. 22B, one of a source electrode and a drain electrode of the transistor 902 is electrically connected to the signal line 909, and the other thereof is electrically connected to the other of the pair of electrodes of the liquid crystal element 921. A gate of the transistor 902 is electrically connected to the scan line 907. The transistor 902 has a function of controlling whether to write a data signal by being turned on or off. Note that any of the transistors described above can be used as the transistor 902.

In the configuration of the pixel 903 in FIG. 22B, one of a pair of electrodes of the capacitor 905 is electrically connected to the capacitor line 915 supplied with potential, and the other thereof is electrically connected to the other of the pair of electrodes of the liquid crystal element 921. The potential of the capacitor line 915 is set in accordance with the specifications of the pixel 903 as appropriate. The capacitor 905 functions as a storage capacitor for holding written data.

For example, in the display device including the pixel 903 in FIG. 22B, the pixels 903 are sequentially selected row by row by the scan line driver circuit 904, whereby the transistors 902 are turned on and a data signal is written.

When the transistors 902 are turned off, the pixels 903 in which the data has been written are brought into a holding state. This operation is sequentially performed row by row; thus, an image is displayed.

The pixel 903 in FIG. 22C includes a transistor 933 which switches the display element, the transistor 902 which controls driving of the pixel, a transistor 935, the capacitor 905, and a light-emitting element 931.

One of a source electrode and a drain electrode of the transistor 933 is electrically connected to the signal line 909 supplied with a data signal. Furthermore, a gate electrode of the transistor 933 is electrically connected to a scan line 907 supplied with a gate signal.

The transistor 933 has a function of controlling whether to write a data signal by being turned on or off.

One of the source electrode and the drain electrode of the transistor 902 is electrically connected to a wiring 937 functioning as an anode line, and the other of the source electrode and the drain electrode of the transistor 902 is electrically connected to one of the electrodes of the light-emitting element 931. Furthermore, the gate electrode of the transistor 902 is electrically connected to the other of the source electrode and the drain electrode of the transistor 933 and one of the electrodes of the capacitor 905.

The transistor 902 has a function of controlling current flowing in the light-emitting element 931 by being turned on or off. Note that any of the transistors described above can be used as the transistor 902.

One of a source electrode and a drain electrode of the transistor 935 is connected to a wiring 939 supplied with a reference potential of data and the other of the source electrode and the drain electrode of the transistor 935 is electrically connected to the one of the electrodes of the light-emitting element 931 and the other of the electrodes of the capacitor 905. Furthermore, a gate electrode of the transistor 935 is electrically connected to the scan line 907 supplied with a gate signal.

The transistor 935 has a function of adjusting current flowing in the light-emitting element 931. For example, in the case where the inner resistance of the light-emitting element 931 is increased owing to deterioration of the light-emitting element 931 or the like, by monitoring current flowing in the wiring 939 to which the one of the source electrode and the drain electrode of the transistor 935 is connected, current flowing in the light-emitting element 931 can be corrected.

One of the pair of electrodes of the capacitor 905 is electrically connected to the other of the source electrode and the drain electrode of the transistor 933 and a gate electrode of the transistor 902. The other of the pair of electrodes of the capacitor 905 is electrically connected to the other of the source electrode and the drain electrode of the transistor 935 and the one of the electrodes of the light-emitting element 931.

In the configuration of the pixel 903 in FIG. 22C, the capacitor 905 functions as a storage capacitor which holds written data.

The one of the pair of electrodes of the light-emitting element 931 is electrically connected to the other of the source electrode and the drain electrode of the transistor 935, the other of the pair of electrodes of the capacitor 905, and the other of the source electrode and the drain electrode of the transistor 902. In addition, the other of the pair of electrodes of the light-emitting element 931 is electrically connected to a wiring 941 which functions as a cathode.

As the light-emitting element 931, an organic electroluminescent element (also referred to as an organic EL element) or the like can be used, for example. Note that the light-emitting element 931 is not limited to organic EL elements; an inorganic EL element including an inorganic material can be used.

A high power supply potential VDD is supplied to one of the wiring 937 and the wiring 941, and a low power supply potential VSS is supplied to the other thereof. In the configuration in FIG. 22C, the high power supply potential VDD is supplied to the wiring 937, and the low power supply potential VSS is supplied to the wiring 941.

In the display device including the pixel 903 in FIG. 22C, the pixels 903 are sequentially selected row by row by the scan line driver circuit 904, whereby the transistors 902 are turned on and a data signal is written.

When the transistors 933 are turned off, the pixels 903 in which the data has been written are brought into a holding state. The transistor 933 is connected to the capacitor 905; the written data can be held for a long time. The transistor 902 controls the amount of the current flowing between the source electrode and the drain electrode, and the light-emitting element 931 emits light with luminance in accordance with the amount of the flowing current. This operation is sequentially performed row by row; thus, an image is displayed.

Figure 23A:
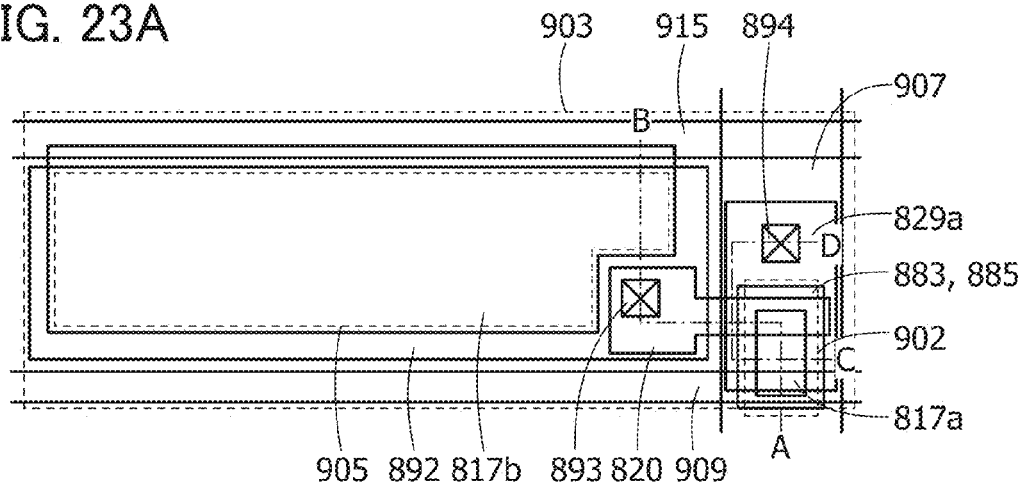
FIGS. 23A to 23C are a top view and cross-sectional views illustrating an example of a display device of one embodiment of the present invention.

Next, a specific configuration of an element substrate included in the display device is described. Here, a specific example of a liquid crystal display device including a liquid crystal element in the pixel 903 is described. FIG. 23A is a top view of the pixel 903 illustrated in FIG. 22B.

In the FIG. 23A, the scan line 907 extends in a direction substantially perpendicular to the signal line 909 (in the vertical direction in the figure). The signal line 909 extends in a direction substantially perpendicular to the scan line (in the horizontal direction in the figure). The capacitor line 915 extends in a direction parallel to the signal line. Note that the scan line 907 is electrically connected to the scan line driver circuit 904 (see FIG. 22A), and the signal line 909 and the capacitor line 915 are electrically connected to the signal line driver circuit 906 (see FIG. 22A).

The transistor 902 is provided in a region where the scan line 907 and the signal line 909 cross each other. The transistor 902 can have a structure similar to that of the transistor described above. Note that a region of the scan line 907 which overlaps an oxide semiconductor film 817*a* functions as the gate electrode of the transistor 902, which is represented as a gate electrode 813 in FIGS. 23B and 23C. Furthermore, a region of the signal line 909 which overlaps the oxide semiconductor film 817*a* functions as the source electrode or the drain electrode of the transistor 902, which is represented as an electrode 819 in FIG. 23B. Furthermore, in FIG. 23A, an end portion of the scan line 907 is located on the outer side than an end portion of the oxide semiconductor film 817*a* when seen from the above. Thus, the scan line 907 functions as a light-blocking film for blocking light from a light source such as a backlight. For this reason, the oxide semiconductor film 817*a* included in the transistor is not irradiated with light, so that a variation in the electrical characteristics of the transistor can be suppressed.

An electrode 820 is connected to an electrode 892 in an opening 893. The electrode 892 is formed using a light-transmitting conductive film and functions as a pixel electrode.

The capacitor 905 is connected to the capacitor line 915. The capacitor 905 is formed using a conductive film 817*b* positioned over a gate insulating film, a dielectric film provided over the transistor 902, and the electrode 892. The dielectric film is formed of a nitride insulating film. The conductive film 817*b*, the nitride insulating film, and the electrode 892 each have a light-transmitting property; therefore, the capacitor 905 has a light-transmitting property.

Owing to the light-transmitting property of the capacitor 905, the capacitor 905 can be formed large (covers a large area) in the pixel 903. Thus, a display device having an increased charge capacity as well as the aperture ratio increased (typically, 55% or more, preferably 60% or more) can be provided. For example, in a display device with a high resolution, as the area of a pixel becomes smaller, the area of a capacitor needs to be smaller. For this reason, the charge capacity which can be stored in the capacitor is small in the high-resolution display device. However, since the capacitor 905 of the above-described display device has a light-transmitting property, sufficient charge capacity can be obtained and the aperture ratio can be increased in each pixel. Typically, the capacitor 905 can be favorably used for a high-resolution display device with a pixel density of 200 pixels per inch (ppi) or more, 300 ppi or more, or further, 500 ppi or more.

Further, according to an embodiment of the present invention, the aperture ratio can be improved even in a display device with a high resolution, which makes it possible to use light from a light source such as a backlight efficiently, so that power consumption of the display device can be reduced.

Figure 23B:
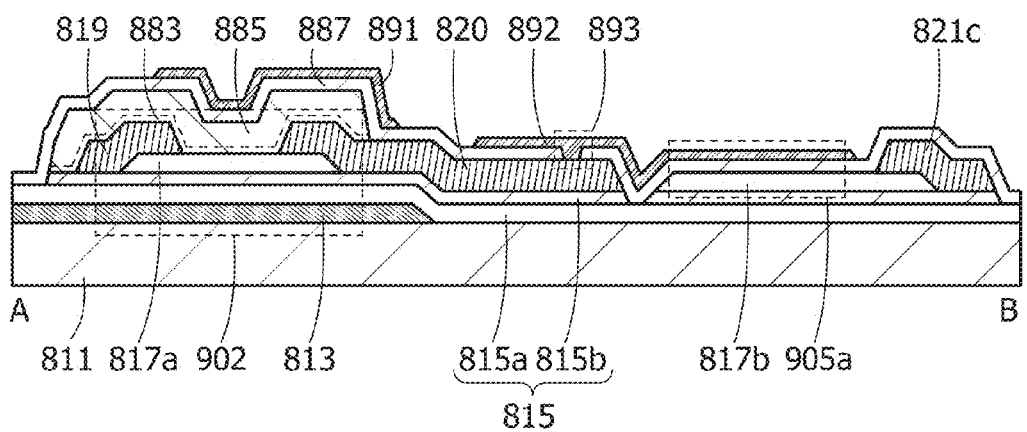
Figure 23C:
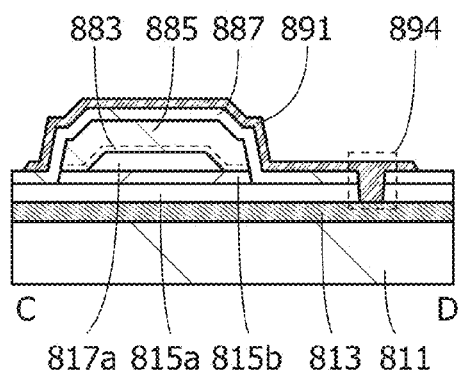

Next, cross-sectional views along dashed dotted lines A-B and C-D in FIG. 23A are illustrated in FIGS. 23B and 23C, respectively. Note that the cross-sectional view along the dashed dotted line A-B shows a cross section of the transistor 902 in the channel length direction, a cross section of a connection portion between the transistor 902 and the electrode 892 functioning as a pixel electrode, and a cross section of a capacitor 905*a*; the cross-sectional view along the dashed dotted line C-D shows a cross section of the transistor 902 in the channel width direction and a cross section of a connection portion between the gate electrode 813 and a gate electrode 891.

The transistor 902 illustrated in FIGS. 23B and 23C is a channel-etched transistor, including the gate electrode 813 provided over a substrate 811, a gate insulating film 815 provided over the substrate 811 and the gate electrode 813, the oxide semiconductor film 817*a* overlapping the gate electrode 813 with the gate insulating film 815 positioned therebetween, and the electrodes 819 and 820 in contact with the oxide semiconductor film 817*a*. Furthermore, an oxide insulating film 883 is provided over the gate insulating film 815, the oxide semiconductor film 817*a*, the electrode 819, and the electrode 820, and an oxide insulating film 885 is provided over the oxide insulating film 883. A nitride insulating film 887 is provided over the gate insulating film 815, the oxide insulating film 883, the oxide insulating film 885, and the electrode 820. The gate electrode 891 and the electrode 892 that is connected to one of the electrode 819 and the electrode 820 (here, the electrode 820) are provided over the nitride insulating film 887. Note that the electrode 892 functions as a pixel electrode.

The gate insulating film 815 is formed of a nitride insulating film 815*a* and an oxide insulating film 815*b*. The oxide insulating film 815*b* is provided so that the oxide semiconductor film 817*a*, the electrode 819, the electrode 820, and the oxide insulating film 883 are positioned over the oxide insulating film 815*b*.

As shown in the cross-sectional view along the line C-D, the gate electrode 891 is connected to the gate electrode 813 in an opening 894 provided in the nitride insulating film 815*a* and the nitride insulating film 887. That is, the gate electrode 813 has the same potential as the gate electrode 891.

The oxide insulating film 883 and the oxide insulating film 885 which are each separated for each transistor are provided over the transistor 902. The separated oxide insulating films 883 and 885 overlap the oxide semiconductor film 817*a*. In the cross-sectional view along the line C-D in the channel width direction, end portions of the oxide insulating film 883 and the oxide insulating film 885 are positioned on the outside of the oxide semiconductor film 817*a*. In the channel width direction, on the outside of each of one side surface and the other side surface of the oxide semiconductor film 817*a*, the gate electrode 891 faces the side surface of the oxide semiconductor film 817*a* with the oxide insulating film 883, the oxide insulating film 885, and the nitride insulating film 887 positioned therebetween. Furthermore, the nitride insulating film 887 is provided to cover the top surfaces and side surfaces of the oxide insulating film 883 and the oxide insulating film 885 and in contact with the nitride insulating film 815*a*.

In the transistor 902, the oxide semiconductor film 817*a* and the oxide insulating film 885 are provided on the inside of the nitride insulating film 815*a* and the nitride insulating film 887, and the nitride insulating film 815a and the nitride insulating film 887 are in contact with each other. The nitride insulating film 815a and the nitride insulating film 887 have a small oxygen diffusion coefficient and have a barrier property against oxygen; therefore, part of oxygen included in the oxide insulating film 885 can be moved to the oxide semiconductor film 817a, so that the amount of oxygen vacancy of the oxide semiconductor film 817a can be reduced. In addition, the nitride insulating film 815a and the nitride insulating film 887 have a barrier property against water, hydrogen, and the like; therefore, water, hydrogen, and the like can be prevented from entering the oxide semiconductor film 817a from the outside. As a result, the transistor 902 becomes a highly reliable transistor.

The capacitor 905a includes the conductive film 817b provided over the gate insulating film 815, the nitride insulating film 887, and the electrode 892. The conductive film 817b in the capacitor 905a is formed at the same time as the oxide semiconductor film 817a and has increased conductivity by containing an impurity. Alternatively, the conductive film 817b is formed at the same time as the oxide semiconductor film 817a and has increased conductivity by containing an impurity and including oxygen vacancy which is generated owing to plasma damage.

The oxide semiconductor film 817a and the conductive film 817b are provided over the gate insulating film 815 and have different impurity concentrations. Specifically, the conductive film 817b has a higher impurity concentration than the oxide semiconductor film 817a. For example, the concentration of hydrogen contained in the oxide semiconductor film 817a is lower than $5\times10^{19}$ atoms/cm$^3$, preferably lower than $5\times10^{18}$ atoms/cm$^3$, more preferably lower than or equal to $1\times10^{18}$ atoms/cm$^3$, further preferably lower than or equal to $5\times10^{17}$ atoms/cm$^3$, still further preferably lower than or equal to $1\times10^{16}$ atoms/cm$^3$. The concentration of hydrogen contained in the conductive film 817b is higher than or equal to $8\times10^{19}$ atoms/cm$^3$, preferably higher than or equal to $1\times10^{20}$ atoms/cm$^3$, further preferably higher than or equal to $5\times10^{20}$ atoms/cm$^3$. The concentration of hydrogen contained in the conductive film 817b is greater than or equal to 2 times, preferably greater than or equal to 10 times that in the oxide semiconductor film 817a.

The conductive film 817b has lower resistivity than the oxide semiconductor film 817a. The resistivity of the conductive film 817b is preferably greater than or equal to $1\times10^{-8}$ times and less than $1\times10^{-1}$ times the resistivity of the oxide semiconductor film 817a. The resistivity of the conductive film 817b is typically greater than or equal to $1\times10^{-3}$ Ωcm and less than $1\times10^{4}$ Ωcm, preferably greater than or equal to $1\times10^{-3}$ Ωcm and less than $1\times10^{-1}$ Ωcm.

For example, the conductive film 817b may be formed by plasma damage at the time of forming the nitride insulating film 887. Note that the nitride insulating film 887 has a high hydrogen concentration; therefore, the hydrogen concentration of the conductive film 817b is increased by being subjected to plasma damage. When hydrogen enters the oxide semiconductor film or hydrogen enters a site of oxygen vacancy, carriers might be generated in the oxide semiconductor film. Therefore, the carrier density of the oxide semiconductor film can be increased owing to the function of the nitride insulating film 887, and thus the conductive film 817b can be formed in some cases.

One electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of manufacturing steps can be reduced. Further, since the pair of electrodes has a light-transmitting property, the capacitor has a light-transmitting property. As a result, the area occupied by the capacitor can be increased and the aperture ratio in a pixel can be increased.

In the above manner, a display device having excellent display performance can be obtained.

<Memory 1>

In the description below, a circuit configuration and operation of a memory cell that is a semiconductor memory device including the above transistor are described with reference to FIGS. 24A and 24B.

Note that the semiconductor memory device may include a driver circuit, a power supply circuit, or the like provided over another substrate, in addition to the memory cell.

Figure 24A:
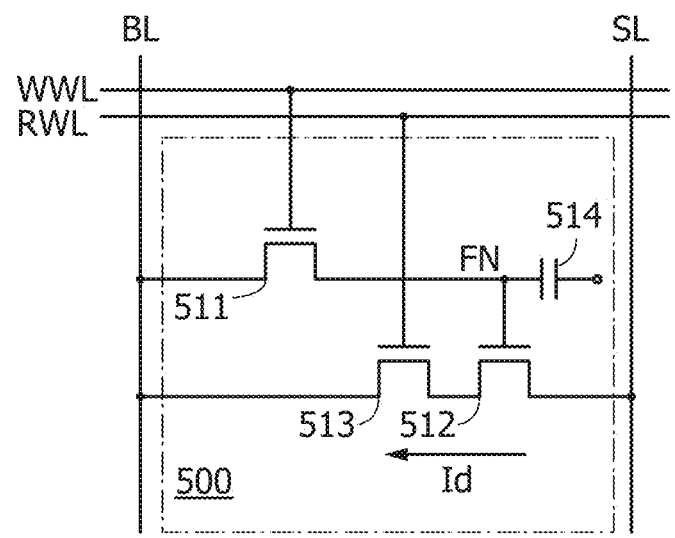
FIGS. 24A and 24B are a circuit diagram and a timing chart illustrating an example of a semiconductor memory device of one embodiment of the present invention.

FIG. 24A is a circuit diagram showing an example of a memory cell 500.

The memory cell 500 shown in FIG. 24A includes a transistor 511, a transistor 512, a transistor 513, and a capacitor 514. Note that in the actual case, a plurality of memory cells 500 is arranged in a matrix, though not shown in FIG. 24A.

A gate of the transistor 511 is connected to a write word line WWL. One of a source and a drain of the transistor 511 is connected to a bit line BL. The other of the source and the drain of the transistor 511 is connected to a floating node FN.

A gate of the transistor 512 is connected to the floating node FN. One of a source and a drain of the transistor 512 is connected to one of a source and a drain of the transistor 513. The other of the source and the drain of the transistor 512 is connected to a power supply line SL.

A gate of the transistor 513 is connected to a read word line RWL. The other of the source and the drain of the transistor 513 is connected to the bit line BL.

One electrode of the capacitor 514 is connected to the floating node FN. The other electrode of the capacitor 514 is supplied with a constant potential.

A word signal is supplied to the write word line WWL.

The word signal is a signal which turns on the transistor 511 so that the voltage of the bit line BL is supplied to the floating node FN.

Note that "writing of data to the memory cell" means that a word signal supplied to the write word line WWL is controlled so that the potential of the floating node FN reaches a potential corresponding to the voltage of the bit line BL. Further, "reading of data from the memory cell" means that a read signal supplied to the read word line RWL is controlled so that the voltage of the bit line BL reaches a voltage corresponding to the potential of the floating node FN.

Multilevel data is supplied to the bit line BL. Further, a discharge voltage $V_{discharge}$ for reading data is supplied to the bit line BL.

The multilevel data is k-bit (k is an integer of 2 or more) data. Specifically, 2-bit data is 4-level data, namely, a signal having any one of the four levels of voltages.

The discharge voltage $V_{discharge}$ is a voltage which is supplied to the bit line BL to perform reading of data. After the discharge voltage $V_{discharge}$ is supplied, the bit line BL is brought into an electrically floating state. The discharge voltage $V_{discharge}$ is a voltage which is supplied to initialize the bit line BL.

A read signal is supplied to the read word line RWL.

The read signal is a signal which is supplied to the gate of the transistor 513 to perform reading of data from the memory cell in a selective manner.

The floating node FN corresponds to any node on a wiring which connects one electrode of the capacitor 514, the other of the source and the drain of the transistor 511, and the gate of the transistor 512.

Note that the potential of the floating node FN is based on the multilevel data supplied to the bit line BL. The floating node FN is in an electrically floating state when the transistor 511 is turned off.

The power supply line SL is supplied with a precharge voltage $V_{precharge}$ which is higher than a discharge voltage $V_{discharge}$ supplied to the bit line BL.

Note that the voltage of the power supply line SL needs to be the precharge voltage $V_{precharge}$ at least in a period in which data is read from the memory cell 500. Thus, in a period in which data is written to the memory cell 500 and/or in a period in which data is not read or written, the power supply line SL can be supplied with the discharge voltage $V_{discharge}$, so that the bit line BL and the power supply line SL have the same potential. With such a structure, a slight amount of through current that flows between the bit line BL and the power supply line SL can be reduced.

As another structure, the power supply line SL may be supplied with a constant voltage that is equal to the precharge voltage $V_{precharge}$. With such a structure, it is not necessary to switch the voltage of the power supply line SL between the precharge voltage $V_{discharge}$ and the discharge voltage $V_{discharge}$, and thus, power consumed in charging and discharging of the potential of the power supply line SL can be reduced.

The precharge voltage $V_{precharge}$ is supplied to the power supply line SL to change the discharge voltage $V_{discharge}$ supplied to the bit line BL by charging via the transistor 512 and the transistor 513.

The transistor 511 has a function of a switch for controlling writing of data by being switched between a conducting state and a non-conducting state. The transistor 511 also has a function of holding a potential based on written data by keeping a non-conducting state. Note that the transistor 511 is an n-channel transistor in the description.

As the transistor 511, a transistor having a low current (low off-state current) which flows between the source and the drain in a non-conducting state is preferably used.

In the configuration of the memory cell 500 shown in FIG. 24A, a potential based on written data is held by keeping the non-conducting state. Thus, it is particularly preferable to use a transistor with a low off-state current as a switch for suppressing change in the potential in the floating node FN which is accompanied by the transfer of electrical charge. Note that a method for estimating the off-state current of a transistor with low off-state current is described later.

When a transistor having a low off-state current is used as the transistor 511 and the transistor 511 is kept turned off, the memory cell 500 can be a non-volatile memory. Thus, once data is written to the memory cell 500, the data can be held in the floating node FN until the transistor 511 is turned on again.

In the transistor 512, a drain current $I_d$ flows between the source and the drain in accordance with the potential of the floating node FN. Note that in the memory cell 500 shown in FIG. 24A, the drain current $I_d$ that flows between the source and the drain of the transistor 512 is a current that flows between the bit line BL and the power supply line SL. Note that the transistor 512 is also referred to as a second transistor. Note that the transistor 512 is an n-channel transistor in the description.

In the transistor 513, the drain current $I_d$ flows between the source and the drain in accordance with the potential of the read word line RWL. Note that in the memory cell 500 shown in FIG. 24A, the drain current $I_d$ that flows between the source and the drain of the transistor 513 is a current that flows between the bit line BL and the power supply line SL. Note that the transistor 513 is also referred to as a third transistor. Note that the transistor 513 is an n-channel transistor in the description.

The transistor 512 and the transistor 513 preferably have small variation in threshold voltage. Here, transistors with small variation in threshold voltage mean transistors that are produced in the same process and have an acceptable difference in threshold voltage of 20 mV or lower; a specific example of the transistors is transistors formed using single crystal silicon in channels. It is needless to say that the variation in threshold voltage is preferably as small as possible; however, even the transistors including single crystal silicon may have a difference in threshold voltage of approximately 20 mV.

Next, operation of the memory cell 500 illustrated in FIG. 24A is described.

Figure 24B:
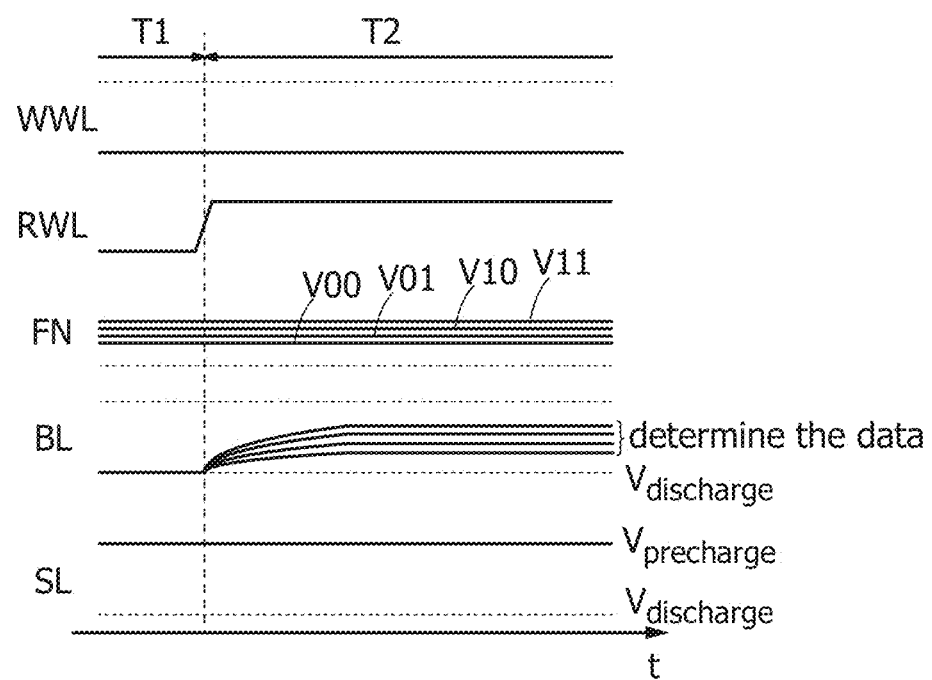

FIG. 24B is a timing chart illustrating change of signals supplied to the write word line WWL, the read word line RWL, the floating node FN, the bit line BL, and the power supply line SL which are shown in FIG. 24A.

The following periods are shown in the timing chart of FIG. 24B: a period T1 which is in an initial state; and a period T2 in which the potential of the bit line BL is charged to perform reading of data.

In the period T1 of FIG. 24B, the electric charge of the bit line BL is discharged. At this time, the write word line WWL is supplied with a low-level potential. The read word line RWL is supplied with the low-level potential. The floating node FN holds a potential corresponding to the multilevel data. The bit line BL is supplied with a discharge voltage $V_{discharge}$. The power supply line SL is supplied with a precharge voltage $V_{precharge}$.

Note that as an example of the multilevel data, 2-bit data, i.e., 4-level data is shown in FIG. 24B. Specifically, 4-level data ($V_{00}$, $V_{01}$, $V_{10}$, and $V_{11}$) are shown in FIG. 24B, and the data can be represented by four levels of potentials.

The bit line BL is brought into an electrically floating state after the discharge voltage $V_{discharge}$ is supplied. That is, the bit line BL is brought into a state in which the potential is changed by the charging or discharging of electrical charge. The floating state can be achieved by turning off a switch for supplying a potential to the bit line BL.

Next, in the period T2 of FIG. 24B, the potential of the bit line BL is charged to perform reading of data. At this time, the write word line WWL is supplied with the low-level potential as in the previous period. The read word line RWL is supplied with a high-level potential. In the floating node FN, the potential corresponding to the multilevel data is held as in the previous period. In the bit line BL, the discharge voltage $V_{discharge}$ is increased in accordance with the potential of the floating node FN. The power supply line SL is supplied with the precharge voltage $V_{precharge}$ as in the previous period.

The transistor 513 is turned on in accordance with the change in the potential of the read word line RWL. Thus, the potential of one of the source and the drain of the transistor 512 is lowered to be the discharge voltage $V_{discharge}$.

The transistor 512 is an n-channel transistor. When the potential of one of the source and the drain of the transistor 512 is lowered to be the discharge voltage $V_{discharge}$, the absolute value of a voltage between the gate and the source (gate voltage) is increased. With the increase in the gate voltage, the drain current $I_d$ flows between the source and the drain of each of the transistors 512 and 513.

When the drain current $I_d$ flows in each of the transistor 512 and the transistor 513, the electrical charge of the power supply line SL is stored to the bit line BL. The potential of the source of the transistor 512 and the potential of the bit line BL are raised by the charging. The raising of the potential in the source of the transistor 512 leads to a gradual decrease in gate voltage of the transistor 512.

When gate voltage reaches the threshold voltage of the transistor 512 in the period T2, the drain current $I_d$ stops flowing. Therefore, the raising of the potential in the bit line BL proceeds, and when the gate voltage of the transistor 512 reaches the threshold voltage, the charging is completed and the bit line BL has a constant potential. The potential of the bit line BL at this time is approximately a difference between the potential of the floating node FN and the threshold voltage.

That is, the potential of the floating node FN can be reflected in the potential of the bit line BL which is changed by the charging. The difference in the potential is used to determine the multilevel data. In this manner, the multilevel data written to the memory cell 500 can be read.

Accordingly, the multilevel data can be read from the memory cell without switching a signal for reading data in accordance with the number of levels of the multilevel data.

<Memory 2>

A circuit configuration of a semiconductor memory device that is different from that of Memory 1 and operation of the semiconductor memory device are described with reference to FIGS. 25A and 25B.

Figure 25A:
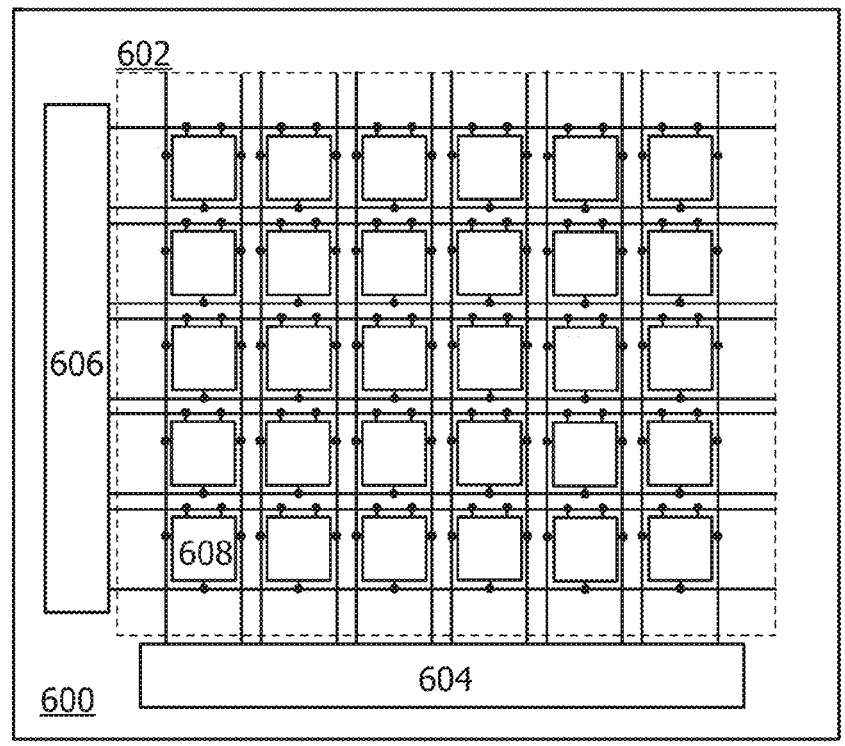
FIGS. 25A and 25B are a block diagram and a circuit diagram illustrating an example of a semiconductor memory device of one embodiment of the present invention.

As the semiconductor memory device that is one embodiment of the present invention, a storage device 600 is illustrated in FIG. 25A. The memory device 600 illustrated in FIG. 25A includes a memory element portion 602, a first driver circuit 604, and a second driver circuit 606.

A plurality of memory elements 608 are arranged in matrix in the memory element portion 602. In the example illustrated in FIG. 25A, the memory elements 608 are arranged in five rows and six columns in the memory element portion 602.

The first driver circuit 604 and the second driver circuit 606 control supply of signals to the memory elements 608, and obtain signals from the memory elements 608 in reading. For example, the first driver circuit 604 serves as a word line driver circuit and the second driver circuit 606 serves as a bit line driver circuit. Note that one embodiment of the present invention is not limited thereto, and the first driver circuit 604 and the second driver circuit 606 may serve as a bit line driver circuit and a word line driver circuit, respectively.

The first driver circuit 604 and the second driver circuit 606 are each electrically connected to the memory elements 608 by wirings.

The memory elements 608 each include a volatile memory and a non-volatile memory. FIG. 25B illustrates a specific example of a circuit configuration of the memory element 608. The memory element 608 illustrated in FIG. 25B includes a first memory circuit 610 and a second memory circuit 612.

The first memory circuit 610 includes a first transistor 614, a second transistor 616, a third transistor 618, a fourth transistor 620, a fifth transistor 622, and a sixth transistor 624.

First, a configuration of the first memory circuit 610 is described. One of a source and a drain of the first transistor 614 is electrically connected to a first terminal 630, and a gate of the first transistor 614 is electrically connected to a second terminal 632. One of a source and a drain of the second transistor 616 is electrically connected to a high potential power supply line Vdd. The other of the source and the drain of the second transistor 616 is electrically connected to the other of the source and the drain of the first transistor 614, one of a source and a drain of the third transistor 618, and a first data holding portion 640. The other of the source and the drain of the third transistor 618 is electrically connected to a low potential power supply line Vss. A gate of the second transistor 616 and a gate of the third transistor 618 are electrically connected to a second data storage portion 642.

One of a source and a drain of the fourth transistor 620 is electrically connected to a third terminal 634. A gate of the fourth transistor 620 is electrically connected to a fourth terminal 636. One of a source and a drain of the fifth transistor 622 is electrically connected to the high potential power supply line Vdd. The other of the source and the drain of the fifth transistor 622 is electrically connected to the other of the source and the drain of the fourth transistor 620, one of a source and a drain of the sixth transistor 624, and the second data holding portion 642. The other of the source and the drain of the sixth transistor 624 is electrically connected to the low potential power supply line Vss. A gate of the fifth transistor 622 and a gate of the sixth transistor 624 are electrically connected to the first data holding portion 640.

The first transistor 614, the third transistor 618, the fourth transistor 620, and the sixth transistor 624 are n-channel transistors.

The second transistor 616 and the fifth transistor 622 are p-channel transistors.

The first terminal 630 is electrically connected to a bit line. The second terminal 632 is electrically connected to a first word line. The third terminal 634 is electrically connected to an inverted bit line. The fourth terminal 636 is electrically connected to the first word line.

The first memory circuit 610 having the above-described configuration is an SRAM. In other words, the first memory circuit 610 is a volatile memory. In the memory device 600, which is one embodiment of the present invention, the first data holding portion 640 and the second data holding portion 642, which are provided in the first memory circuit 610, are electrically connected to the second memory circuit 612.

The second memory circuit 612 includes a seventh transistor 626 and an eighth transistor 628.

Next, a configuration of the second memory circuit 612 is described. One of a source and a drain of the seventh transistor 626 is electrically connected to the second data holding portion 642. The other of the source and the drain of the seventh transistor 626 is electrically connected to one electrode of a first capacitor 648. The other electrode of the first capacitor 648 is electrically connected to the low potential power supply line Vss. One of a source and a drain of the eighth transistor 628 is electrically connected to the first data holding portion 640. The other of the source and the drain of the eighth transistor 628 is electrically connected to one electrode of a second capacitor 650. The other electrode of the second capacitor 650 is electrically connected to the low potential power supply line Vss. A gate of the seventh transistor 626 and a gate of the eighth transistor 628 are electrically connected to a fifth terminal 638.

The fifth terminal 638 is electrically connected to a second word line. Note that a signal of one of the first word line and the second word line may be controlled by the operation of the other, or alternatively, they may be controlled independently from each other.

The seventh transistor 626 and the eighth transistor 628 are each a transistor having low off-state current. In the configuration illustrated in FIG. 25B, the seventh transistor 626 and the eighth transistor 628 are n-channel transistors; however, one embodiment of the present invention is not limited thereto.

A third data storage portion 644 is provided between the seventh transistor 626 and the one electrode of the first capacitor 648. A fourth data holding portion 646 is provided between the eighth transistor 628 and the one electrode of the second capacitor 650. Since the seventh transistor 626 and the eighth transistor 628 each have low off-state current, charge in the third data holding portion 644 and the fourth data holding portion 646 can be held for a long period. In other words, the second memory circuit 612 is a non-volatile memory.

As described above, the first memory circuit 610 is a volatile memory and the second memory circuit 612 is a non-volatile memory. The first data storage portion 640 and the second data storage portion 642, which are the data storage portions in the first memory circuit 610, are electrically connected to the third data storage portion 644 and the fourth data storage portion 646, which are the data storage portions in the second memory circuit 612, through the transistors each having low off-state current. Thus, by controlling the gate potentials of the transistors each having low off-state current, the data in the first memory circuit 610 can be stored also in the data holding portion of the second memory circuit 612. Moreover, the use of the transistors each having a small off-state current enables stored data to be held in the third data holding portion 644 and the fourth data holding portion 646 for a long period even when power is not supplied to the storage element 608.

Figure 25B:
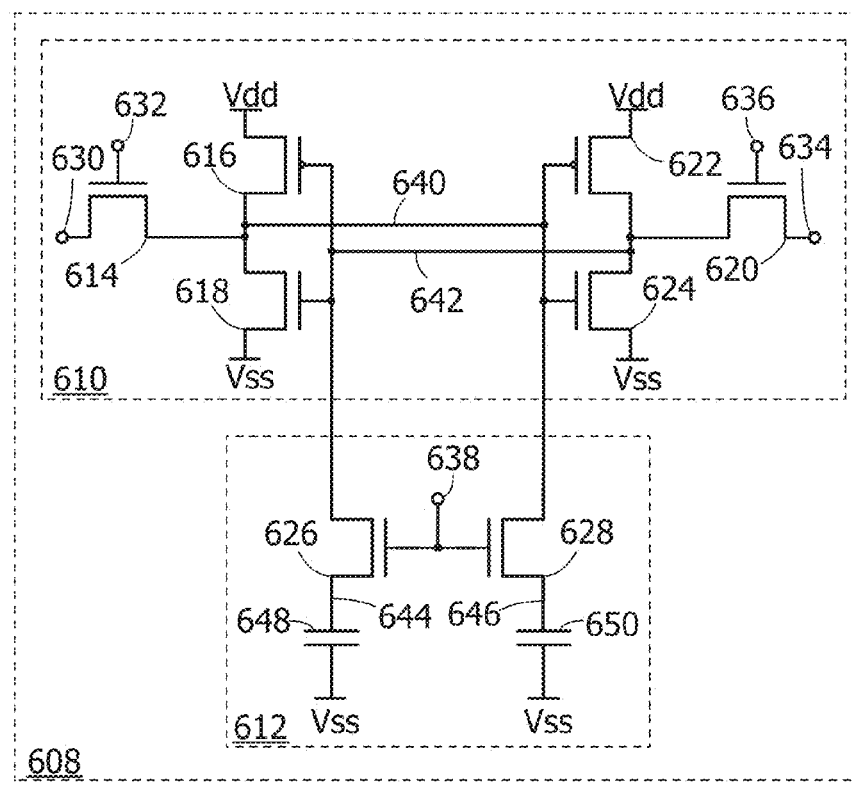

In this way, in the memory element 608 illustrated in FIG. 25B, data in the volatile memory can be stored in the non-volatile memory.

The first memory circuit 610 is an SRAM, and thus needs to operate at high speed. On the other hand, the second memory circuit 612 is required to hold data for a long period after supply of power is stopped. Such requirements can be satisfied by forming the first memory circuit 610 using transistors which are capable of high speed operation and forming the second memory circuit 612 using transistors which have low off-state current. For example, the first memory circuit 610 may be formed using transistors each formed using silicon, and the second memory circuit 612 may be formed using transistors each formed using an oxide semiconductor film.

In the memory device 600, which is one embodiment of the present invention, when the first transistor 614 and the fourth transistor 620 are turned on so that data is written to the data holding portions in the first memory circuit 610, which is a volatile memory, in the case where the seventh transistor 626 and the eighth transistor 628, which are included in the second memory circuit 612, are on, it is necessary to accumulate charge in the first capacitor 648 and the second capacitor 650, which are included in the second memory circuit 612, in order that the data holding portions (the first data holding portion 640 and the second data holding portion 642) in the first memory circuit 610 each hold a predetermined potential. Therefore, the seventh transistor 626 and the eighth transistor 628 which are on when data is written to the data holding portions in the first memory circuit 610 prevent the memory element 608 from operating at high speed. In a case of the second memory circuit 612 formed using transistors each formed using silicon, it is difficult to sufficiently reduce the off-state current and hold stored data in the second memory circuit 612 for a long period.

Thus, in the semiconductor memory device that is one embodiment of the present invention, when data is written to the data holding portions in the first memory circuit 610 (the volatile memory), transistors (i.e., the seventh transistor 626 and the eighth transistor 628) which are positioned between the data holding portions in the first memory circuit 610 and the data holding portions in the second memory circuit 612 are turned off. In this manner, high speed operation of the memory element 608 can be achieved. Furthermore, when neither writing nor reading to/from the data holding portions in the first memory circuit 610 is performed (that is, the first transistor 614 and the fourth transistor 620 are off), the transistors which are positioned between the data holding portions in the first memory circuit 610 and the data holding portions in the second memory circuit 612 are turned on.

A specific operation of data writing to the volatile memory in the memory element 608 is described below. First, the seventh transistor 626 and the eighth transistor 628 which are on are turned off. Next, the first transistor 614 and the fourth transistor 620 are turned on to supply a predetermined potential to the data holding portions (the first data holding portion 640 and the second data holding portion 642) in the first memory circuit 610, and then the first transistor 614 and the fourth transistor 620 are turned off. After that, the seventh transistor 626 and the eighth transistor 628 are turned on. In this manner, data corresponding to data held in the data holding portions in the first memory circuit 610 is held in the data holding portions in the second memory circuit 612.

When the first transistor 614 and the fourth transistor 620 are turned on at least for data writing to the data holding portions in the first memory circuit 610, it is necessary to turn off the seventh transistor 626 and the eighth transistor 628, which are included in the second memory circuit 612. Note that the seventh transistor 626 and the eighth transistor 628, which are included in the second memory circuit 612, may be either on or off when the first transistor 614 and the fourth transistor 620 are turned on for data reading from the data holding portions in the first memory circuit 610.

In the case where supply of power to the storage element 608 is stopped, the transistors positioned between the data holding portions in the first memory circuit 610 and the data holding portions in the second memory circuit 612 (i.e., the seventh transistor 626 and the eighth transistor 628) are turned off just before supply of power to the storage element 608 is stopped, so that the data held in the second memory circuit 612 becomes non-volatile. A means for turning off the seventh transistor 626 and the eighth transistor 628 just before supply of power to the volatile memory is stopped may be mounted on the first driver circuit 604 and the second driver circuit 606, or may alternatively be provided in another control circuit for controlling these driver circuits.

Note that here, whether the seventh transistor 626 and the eighth transistor 628, which are positioned between the data holding portions in the first memory circuit 610 and the data holding portions in the second memory circuit 612, are turned on or off may be determined in each memory element or may be determined in each block in the case where the memory element portion 602 is divided into blocks.

When the first memory circuit 610 operates as an SRAM, the transistors which are positioned between the data holding portions in the first memory circuit 610 and the data holding portions in the second memory circuit 612 are turned off; accordingly, data can be stored in the first memory circuit 610 without accumulation of electrical charge in the first capacitor 648 and the second capacitor 650, which are included in the second memory circuit 612. Thus, the storage element 608 can operate at high speed.

In the storage device 600 of one embodiment of the present invention, before supply of power to the storage device 600 is stopped (a power source of the storage device 600 is turned off), only the transistors which are positioned between the data holding portions in the first memory circuit 610 and the data holding portions in the second memory circuit 612 in the storage element 608 to which data has been rewritten lastly may be turned on. In that case, an address of the storage element 608 to which data has been rewritten lastly is preferably stored in an external memory, in which case the data can be stored smoothly.

Note that the driving method of the semiconductor memory device that is one embodiment of the present invention is not limited to the above description.

As described above, the memory device 600 can operate at high speed. Since data storing is performed only by part of the memory elements, power consumption can be reduced.

Here, an SRAM is used for the volatile memory: however, one embodiment of the present invention is not limited thereto, and other volatile memories may be used.

<CPU>

Figure 26A:
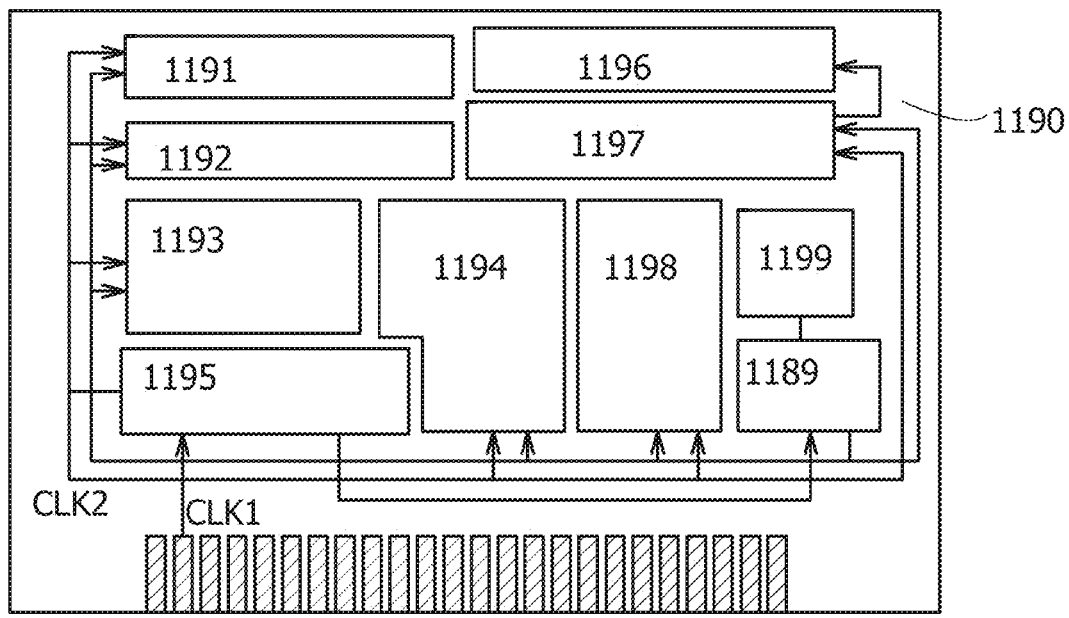
FIGS. 26A to 26C are block diagrams illustrating an example of a CPU of one embodiment of the present invention.
Figure 26B:
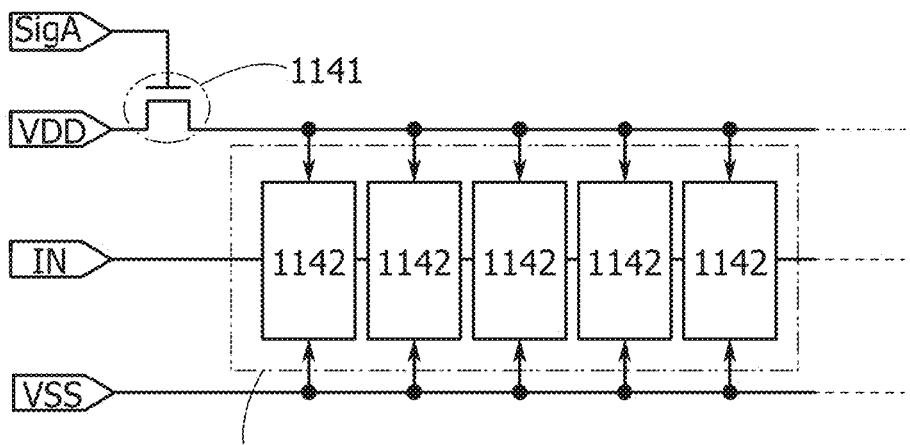
Figure 26C:
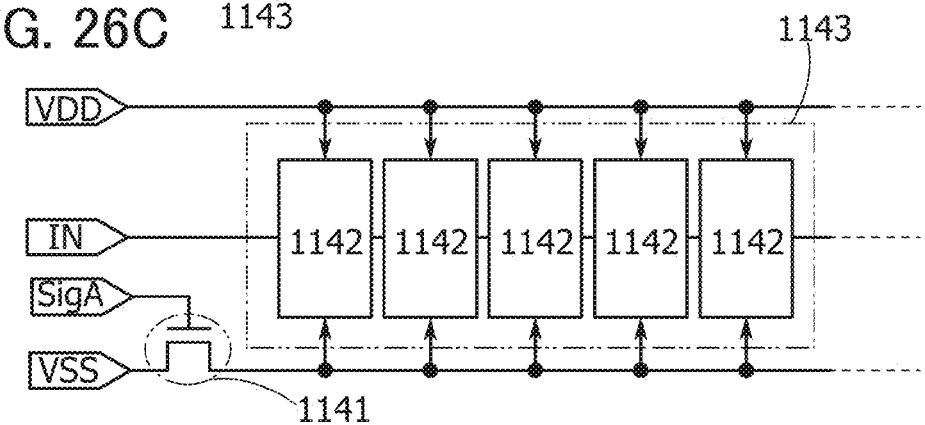

FIGS. 26A to 26C are block diagrams illustrating a specific configuration of a CPU at least partly including the above transistor or semiconductor memory device.

The CPU illustrated in FIG. 26A includes an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189 over a substrate 1190. A semiconductor substrate, an SOI substrate, a glass substrate, or the like is used as the substrate 1190. The ROM 1199 and the ROM interface 1189 may be provided over a separate chip. Obviously, the CPU shown in FIG. 26A is just an example in which the structure is simplified, and an actual CPU may have various structures depending on the application.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 26A, a memory cell is provided in the register 1196. As the memory cell of the register 1196, the above-described transistor can be used.

In the CPU illustrated in FIG. 26A, the register controller 1197 selects an operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of power supply voltage to the memory cell in the register 1196 can be stopped.

The power supply can be stopped by providing a switching element between a memory cell group and a node to which a high power supply potential VDD or a low power supply potential VSS is supplied, as illustrated in FIG. 26B or FIG. 26C. Circuits illustrated in FIGS. 26B and 26C are described below.

FIGS. 26B and 26C are each a memory device in which the above transistor is used as a switching element for controlling power supply potential supplied to memory cells.

The memory device illustrated in FIG. 26B includes a switching element 1141 and a memory cell group 1143 including a plurality of memory cells 1142. Specifically, as each of the memory cells 1142, the above transistor can be used. Each of the memory cells 1142 included in the memory cell group 1143 is supplied with the high power supply potential VDD via the switching element 1141. Furthermore, each of the memory cells 1142 included in the memory cell group 1143 is supplied with a potential of a signal IN and the low power supply potential VSS.

In FIG. 26B, any of the above transistors is used as the switching element 1141, and the switching of the transistor is controlled by a signal SigA supplied to a gate electrode layer thereof.

Note that FIG. 26B illustrates the structure in which the switching element 1141 includes only one transistor, however, without particular limitation thereon, the switching element 1141 may include a plurality of transistors. The switching element 1141 may include a plurality of transistors. In the case where the switching element 1141 includes a plurality of transistors which serves as switching elements, the plurality of transistors may be connected to each other in parallel, in series, or in combination of parallel connection and serial connection.

Although the switching element 1141 controls the supply of the high power supply potential VDD to each of the memory cells 1142 included in the memory cell group 1143 in FIG. 26B, the switching element 1141 may control the supply of the low power supply potential VSS.

In FIG. 26C, an example of a memory device in which each of the memory cells 1142 included in the memory cell group 1143 is supplied with the low power supply potential VSS via the switching element 1141 is illustrated. The supply of the low power supply potential VSS to each of the memory cells 1142 included in the memory cell group 1143 can be controlled by the switching element 1141.

When a switching element is provided between a memory cell group and a node to which the high power supply potential VDD or the low power supply potential VSS is supplied, data can be held even in the case where an operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Installation Example>

Figure 27A:
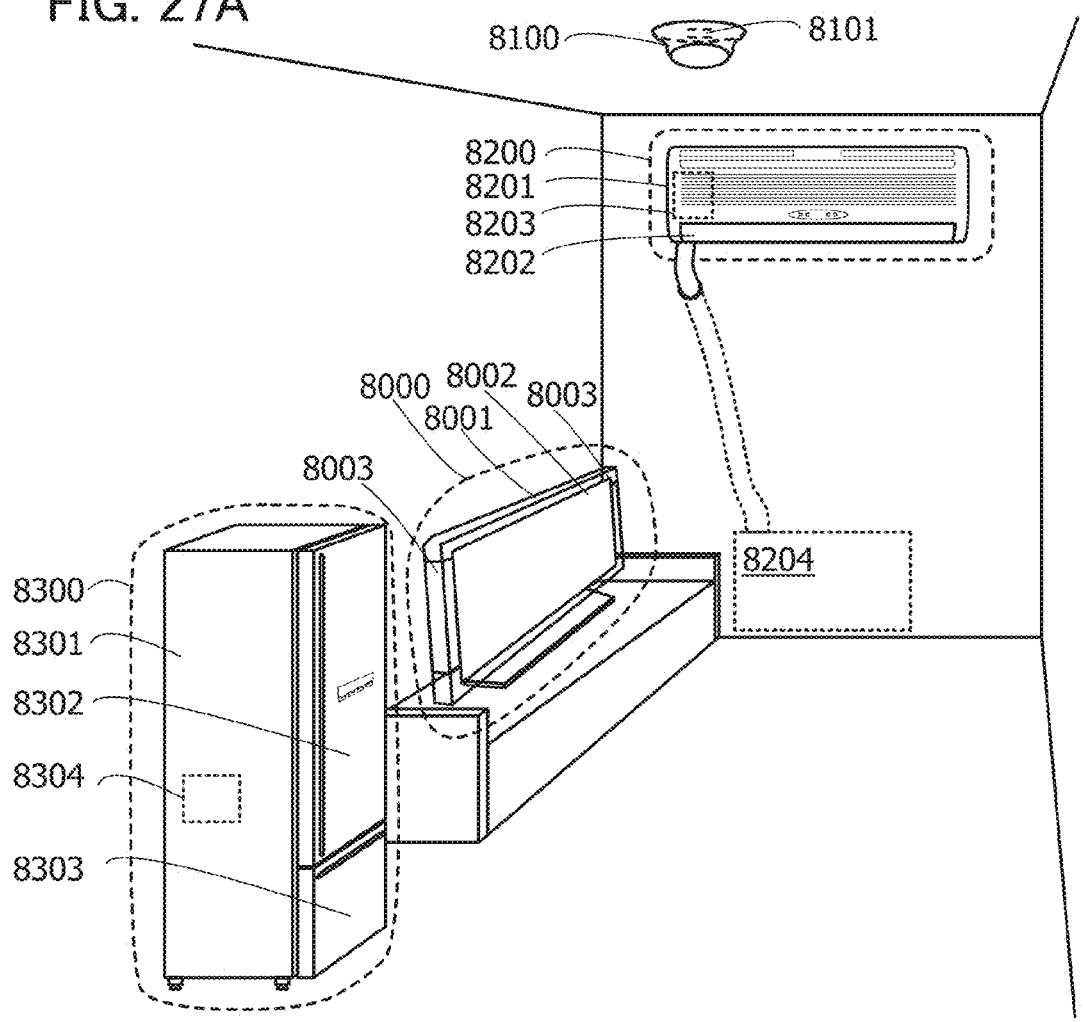
FIGS. 27A to 27C illustrate installation examples of a semiconductor device of one embodiment of the present invention.

In a television set 8000 in FIG. 27A, a display portion 8002 is incorporated in a housing 8001. The display portion 8002 displays an image and a speaker portion 8003 can output sound.

The television set 8000 may be provided with a receiver, a modem, and the like. With the receiver, the television set 8000 can receive general television broadcasting. Furthermore, when the television set is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The above display device, memory, or CPU can be used for the television set 8000.

In FIG. 27A, an alarm device 8100 is a residential fire alarm which includes a sensor portion and a microcomputer 8101. Note that the microcomputer 8101 includes a CPU in which the above transistor is used.

In FIG. 27A, a CPU that uses the above-described transistor is included in an air conditioner which includes an indoor unit 8200 and an outdoor unit 8204. Specifically, the indoor unit 8200 includes a housing 8201, an air outlet 8202, a CPU 8203, and the like. Although the CPU 8203 is provided in the indoor unit 8200 in FIG. 27A, the CPU 8203 may be provided in the outdoor unit 8204. Alternatively, the CPU 8203 may be provided in both the indoor unit 8200 and the outdoor unit 8204. When the air conditioner includes the CPU in which the above transistor is used, a reduction in power consumption of the air conditioner can be achieved.

In FIG. 27A, an electric refrigerator-freezer 8300 includes the CPU in which the above transistor is used. Specifically, the electric refrigerator-freezer 8300 includes a housing 8301, a door for a refrigerator 8302, a door for a freezer 8303, a CPU 8304, and the like. In FIG. 27A, the CPU 8304 is provided in the housing 8301. When the electric refrigerator-freezer 8300 includes the CPU 8304 in which the above transistor is used, a reduction in power consumption of the electric refrigerator-freezer 8300 can be achieved.

Figure 27B:
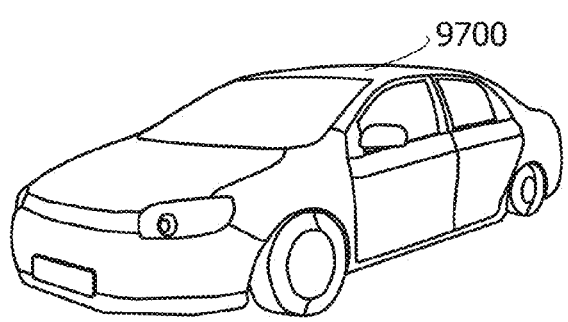
Figure 27C:
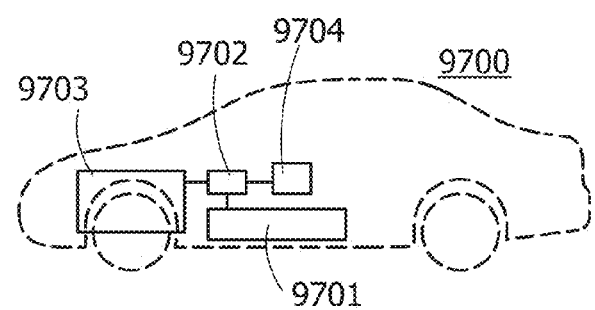

FIGS. 27B and 27C illustrate an example of an electric vehicle. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated. When the electric vehicle 9700 includes the CPU in which the above transistor is used, a reduction in power consumption of the electric vehicle 9700 can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment shows an example of a basic principle. Thus, part or the whole of this embodiment can be freely combined with, applied to, or replaced with part or the whole of another embodiment.

Example 1

In this example, deposition of a variety of In—Ga—Zn oxide films is described.

First, samples formed in this example are described.

Samples 1 to 7 were each formed in such a manner that a 100-nm-thick In—Ga—Zn oxide film was deposited on a glass substrate using a sputtering apparatus A. The In—Ga—Zn oxide film in each of Samples 1 to 7 was deposited under the conditions where an In—Ga—Zn oxide target (having an atomic ratio of In:Ga:Zn=1:3:6) was used and a distance d between the target and the substrate was set to 160 mm.

Sample 1 was formed under the conditions where oxygen and argon were used as a deposition gas; the proportion of oxygen was 10 vol %; the pressure was 0.6 Pa; the power density was 1.658 W/cm$^2$ (an AC power source was used); and the substrate temperature was 170° C. Sample 2 was formed under the conditions where oxygen and argon were used as a deposition gas; the proportion of oxygen was 50 vol %; the pressure was 0.6 Pa; the power density was 1.658 W/cm$^2$ (an AC power source was used); and the substrate temperature was 170° C. Sample 3 was formed under the conditions the proportion of oxygen in the deposition gas was 100 vol %; the pressure was 0.6 Pa; the power density was 1.658 W/cm$^2$ (an AC power source was used); and the substrate temperature was 170° C. Sample 4 was formed under the conditions where the proportion of oxygen in the deposition gas was 100 vol %; the pressure was 0.3 Pa; the power density was 2.984 W/cm$^2$ (an AC power source was used); and the substrate temperature was 170° C. Sample 5 was formed under the conditions where the proportion of oxygen in the deposition gas was 100 vol %; the pressure was 0.15 Pa; the power density was 1.658 W/cm$^2$ (an AC power source was used); and the substrate temperature was 170° C. Sample 6 was formed under the conditions where the proportion of oxygen in the deposition was 100 vol %; the pressure was 0.15 Pa; the power density was 1.658 W/cm$^2$ (an AC power source was used); and the substrate temperature was 200° C. Sample 7 was formed under the conditions where oxygen and argon were used as a deposition gas; the proportion of oxygen was 50 vol %; the pressure was 0.3 Pa; the power density was 1.658 W/cm$^2$ (an AC power source was used); and the substrate temperature was 170° C.

Sample 8 was obtained in such a manner that a 100-nm-thick In—Ga—Zn oxide film was deposited on a glass substrate using a sputtering apparatus B. The In—Ga—Zn oxide film of Sample 8 was deposited under the conditions where an In—Ga—Zn oxide target (having an atomic ratio of In:Ga:Zn=1:3:6) was used, oxygen and argon were used as a deposition gas, the proportion of oxygen was 33 vol %, the pressure was 0.4 Pa, the power density was 4.933 W/cm$^2$ (a DC power source was used), the distance d between the target and the substrate was 0.13 m, and the substrate temperature was 200° C.

Table 2 shows the deposition conditions of Samples 1 to 8.

TABLE 2

| Sample | Apparatus | O$_2$ [vol %] | Pressure [Pa] | Power density [W/cm$^2$] | T-S distance d [m] | Substrate temperature [° C.] |
|---|---|---|---|---|---|---|
| Sample 1 | A | 10 | 0.6 | 1.658 | 0.16 | 170 |
| Sample 2 | A | 50 | 0.6 | 1.658 | 0.16 | 170 |
| Sample 3 | A | 100 | 0.6 | 1.658 | 0.16 | 170 |
| Sample 4 | A | 100 | 0.3 | 2.984 | 0.16 | 170 |
| Sample 5 | A | 100 | 0.15 | 1.658 | 0.16 | 170 |
| Sample 6 | A | 100 | 0.15 | 1.658 | 0.16 | 200 |
| Sample 7 | A | 50 | 0.3 | 1.658 | 0.16 | 170 |
| Sample 8 | B | 33 | 0.4 | 4.933 | 0.13 | 200 |

Next, plan-view TEM images of Samples 1 to 3 obtained at magnification of 4000000 times and 8000000 times were observed (see FIG. 28).

According to FIG. 28, Samples 1 to 3 include a region having a structure which is peculiar to a CAAC-OS film, and a region having a different structure from the region. The results indicate the possibility that formation of these regions was caused by columnar zinc oxide clusters that were taken in the films owing to deposition of Samples 1 to 3 at a relatively high pressure.

Next, to check whether the samples have a blocking function against copper, samples were formed in such a manner that a copper film was formed on the In—Ga—Zn oxide film of each of Samples 1 to 3. After formation of the copper film, heat treatment was performed at 350° C. for one hour in an atmosphere containing nitrogen and oxygen at a volume ratio of 2:8, and then diffusion of copper was evaluated.

Figure 29A:
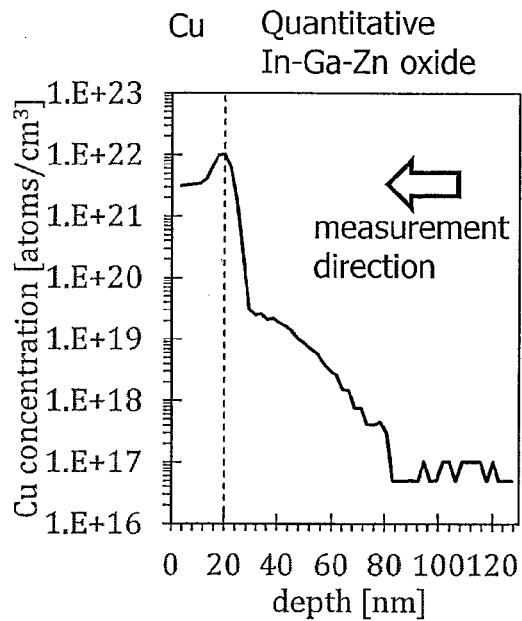
FIGS. 29A to 29C each show a profile of copper concentration with respect to the depth of a sample.
Figure 29C:
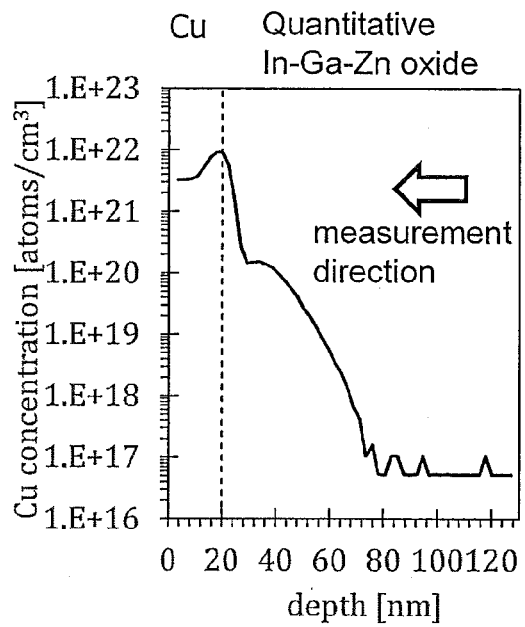
Figure 29B:
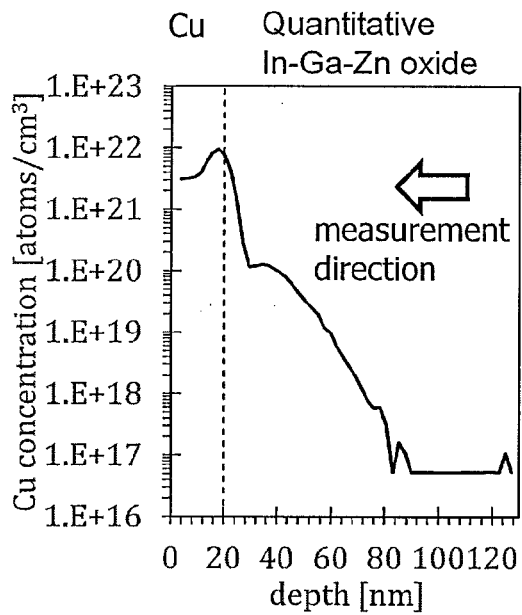

To evaluate diffusion of copper, the samples were subjected to SIMS while the films were etched from the glass substrate side. FIGS. 29A to 29C shows copper concentration profiles with respect to the depth. Note that FIGS. 29A, 29B, and 29C correspond to Sample 1, Sample 2, and Sample 3, respectively.

It was found that copper was diffused from the copper film to the In—Ga—Zn oxide film within the range of several tens nanometers in any sample. Therefore, for example, to block diffusion of copper under the condition (to make a concentration less than $1 \times 10^{18}$ atoms/cm$^3$), the thickness of the In—Ga—Zn oxide film in each of Samples 1 to 3 needs to be greater than or equal to 50 nm.

In this manner, a possible reason why Samples 1 to 3 have low ability to block diffusion of copper is because deposition is performed at a relatively high pressure and thus columnar zinc oxide clusters are taken in the films.

Figure 30:
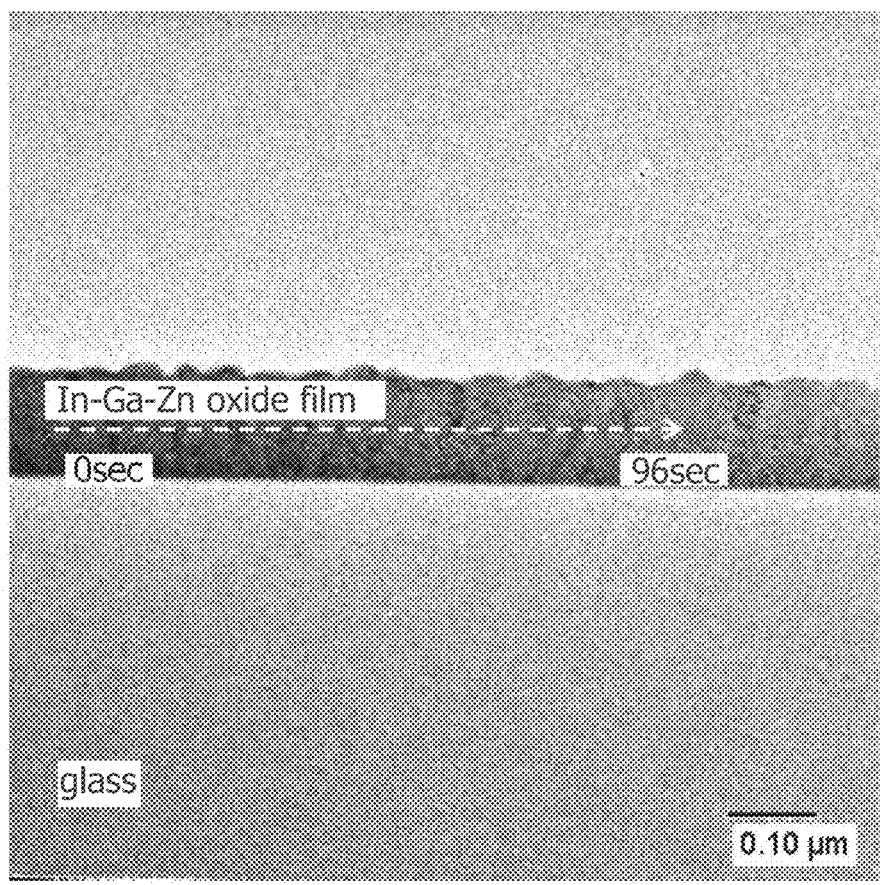
FIG. 30 is a cross-sectional TEM image of a sample and shows a measurement range of a transmission electron diffraction pattern.

Next, structural analysis on a minute region in Sample 2 was performed. The structural analysis was performed in such a manner that a transmission electron diffraction pattern was obtained while the measurement region was changed at a certain speed along a dashed line arrow in the cross-sectional TEM image shown in FIG. 30. Note that Sample 2 was thinned to a thickness (approximately 50 nm) which allows electrons to pass therethrough. The start time of measurement was 0 sec, and the finished time was 96 sec. The apparatus described in the above embodiment was used for measuring the transmission electron diffraction pattern. The probe diameter of an electron beam was 1 nm, the accelerating voltage was 200 kV, and the camera length was 0.4 m.

Figure 31:
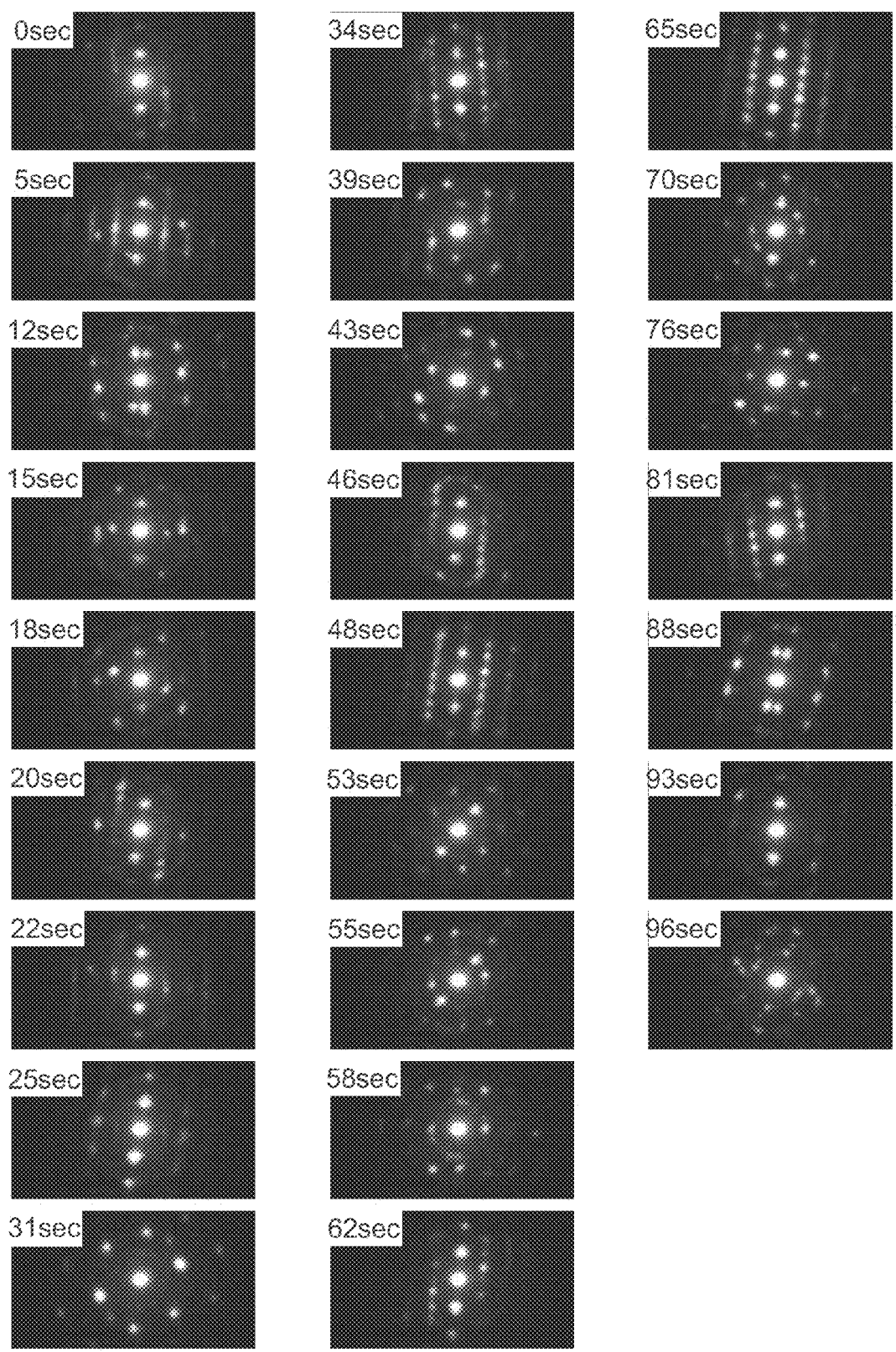
FIG. 31 shows transmission electron diffraction patterns of a sample.

The transmission electron diffraction pattern at each time is shown in FIG. 31. As shown in FIG. 31, after 12 sec and 88 sec, a transmission electron diffraction pattern showing at least two kinds of structures was observed. Furthermore, after 31 sec, 39 sec, 43 sec, 53 sec, 55 sec, 70 sec, 76 sec, and 96 sec, a transmission electron diffraction pattern showing a structure different from that of the structure peculiar to a CAAC-OS film was observed.

Therefore, it turned out that the measurement area (approximately 700 nm) of Sample 2 had two grain boundaries and eight regions that had a structure different from the structure peculiar to a CAAC-OS film.

As described in the above embodiment, formation of the region which has a grain boundary and a structure different from the structure peculiar to a CAAC-OS film is probably caused owing to columnar zinc oxide clusters generated at the time of deposition. That is, there is a possibility that an In—Ga—Zn oxide film which blocks copper can be deposited by effective discharge of columnar zinc oxide clusters at the time of deposition.

Next, a minute region of each of Samples 7 and 8, which were deposited at lower pressures than those of Samples 1 to 3, was subjected to structural analysis. Columnar zinc oxide clusters are assumed to be less likely to be taken in the films in Samples 7 and 8, than in Samples 1 to 3.

Figure 32:
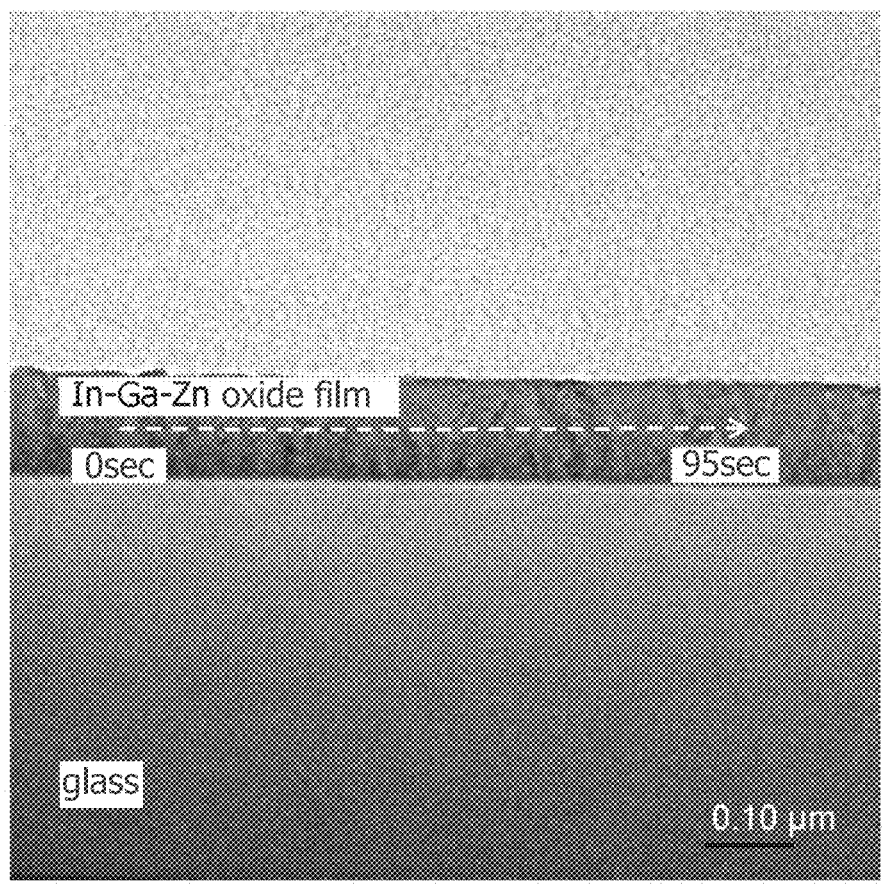
FIG. 32 is a cross-sectional TEM image of a sample and shows a measurement range of a transmission electron diffraction pattern.

The structural analysis of Sample 7 was performed in such a manner that a transmission electron diffraction pattern was obtained while the measurement region was changed at a certain speed along a dashed line arrow in the cross-sectional TEM image shown in FIG. 32. Note that Sample 7 was thinned to a thickness (approximately 50 nm) which allows electrons to pass therethrough. The start time of measurement was 0 sec, and the finished time was 92 sec. The apparatus described in the above embodiment was used for measuring the transmission electron diffraction pattern. The probe diameter of an electron beam was 1 nm, the accelerating voltage was 200 kV, and the camera length was 0.4 m.

Figure 33:
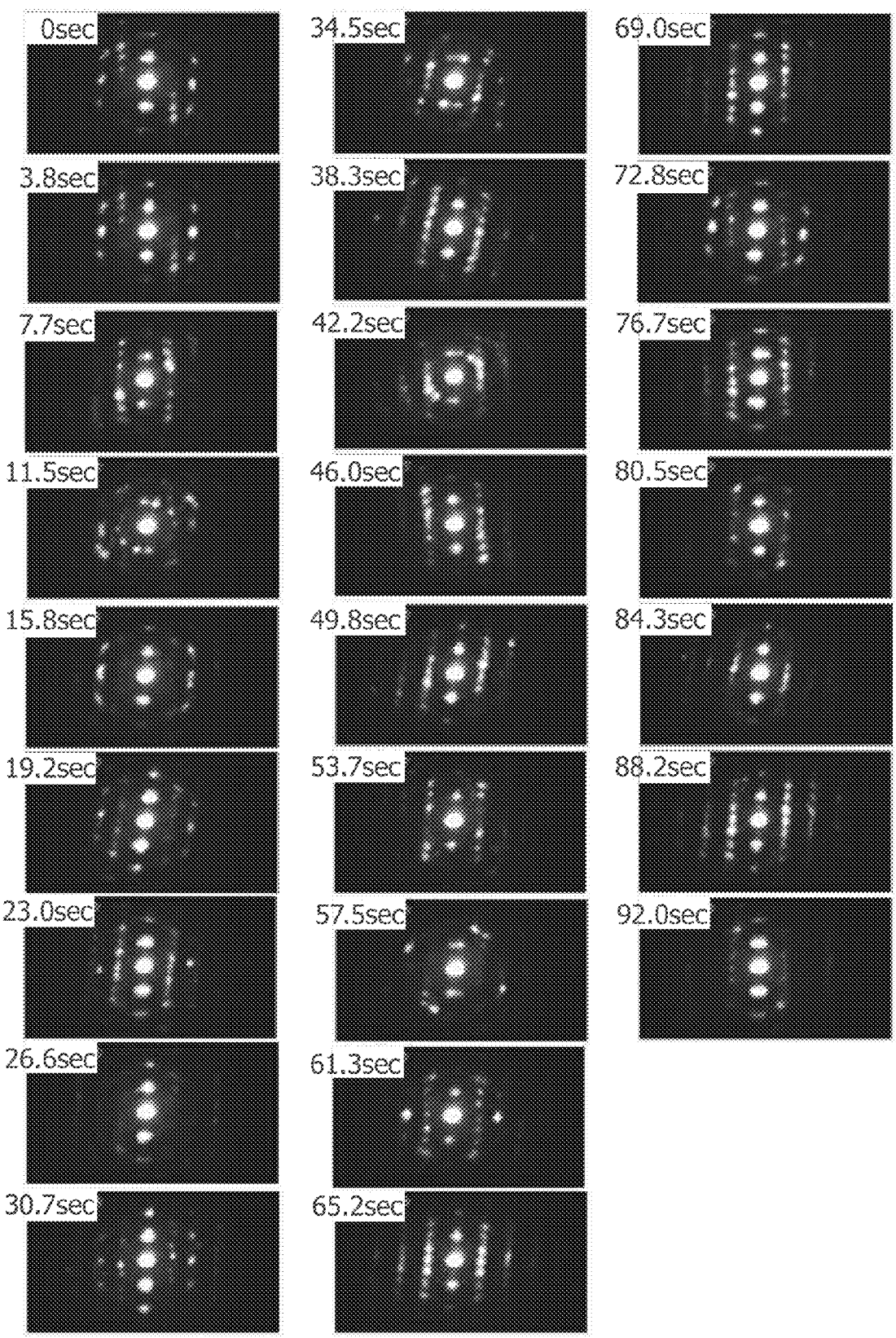
FIG. 33 shows transmission electron diffraction patterns of a sample.

The transmission electron diffraction pattern at each time is shown in FIG. 33. As shown in FIG. 33, a transmission electron diffraction pattern showing at least two kinds of structures was not observed. Furthermore, after 11.5 sec and 34.5 sec, a transmission electron diffraction pattern showing a structure different from that of the structure peculiar to a CAAC-OS film was observed.

Therefore, it turned out that the measurement area (approximately 700 nm) of Sample 7 did not have any clear grain boundary and had two regions that had a structure different from the structure peculiar to a CAAC-OS film. It was found that Sample 7 had a small number of grain boundaries and a small number of regions having a structure different from the structure peculiar to a CAAC-OS film, as compared to Sample 2.

Figure 34:
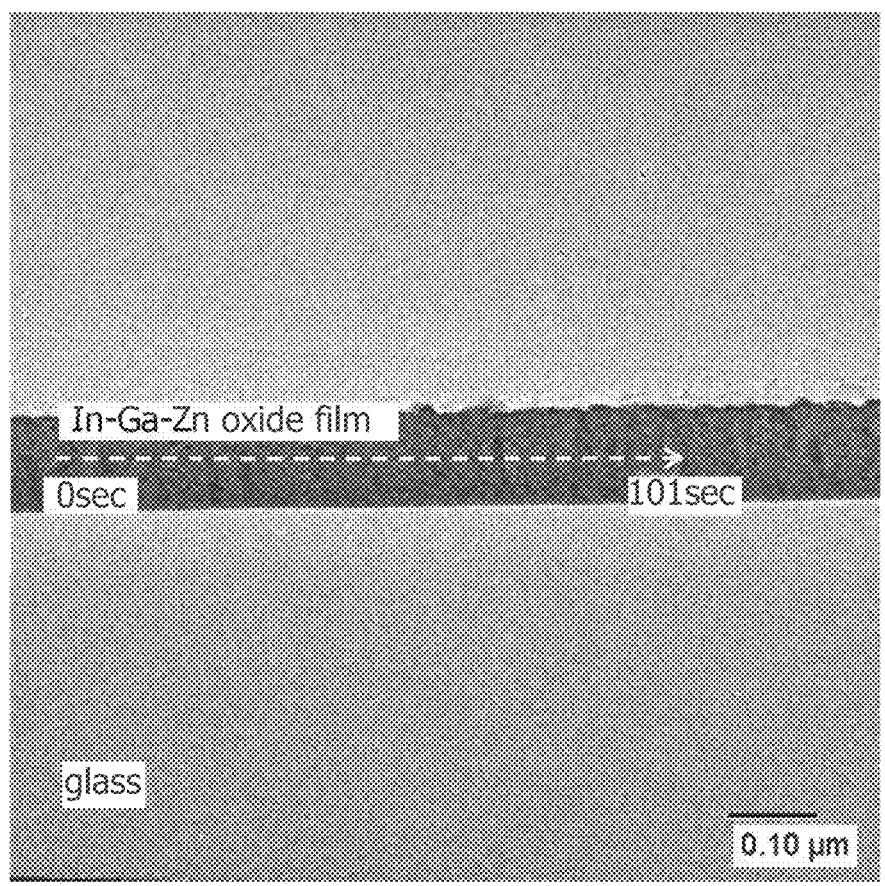
FIG. 34 is a cross-sectional TEM image of a sample and shows a measurement range of a transmission electron diffraction pattern.

The structural analysis of Sample 8 was performed in such a manner that a transmission electron diffraction pattern was obtained while the measurement region was changed at a certain speed along a dashed line arrow in the cross-sectional TEM image shown in FIG. 34. Note that Sample 8 was thinned to a thickness (approximately 50 nm) which allows electrons to pass therethrough. The start time of measurement was 0 sec, and the finished time was 101 sec. The apparatus described in the above embodiment was used for measuring the transmission electron diffraction pattern. The probe diameter of an electron beam was 1 nm, the accelerating voltage was 200 kV, and the camera length was 0.4 m.

Figure 35:
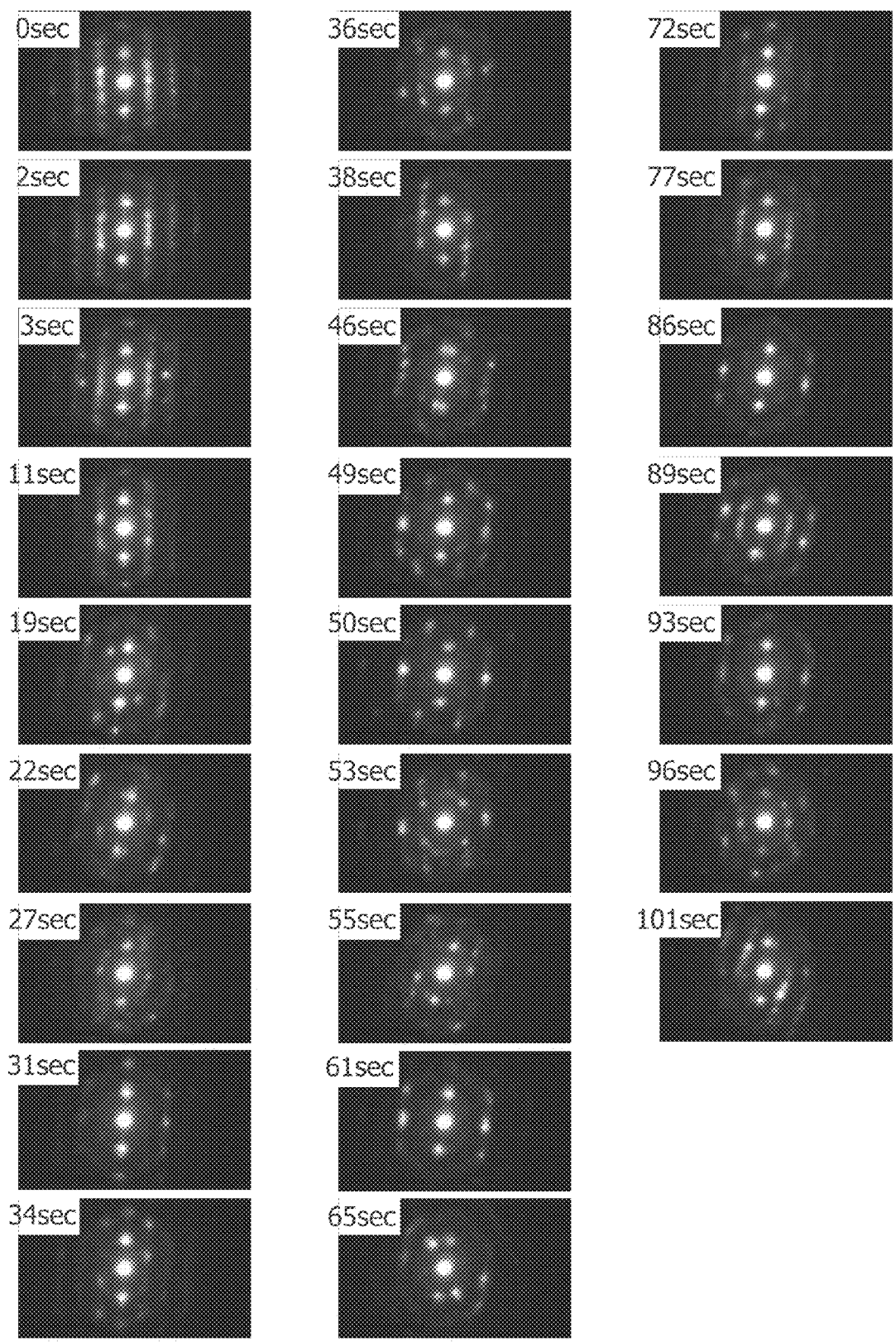
FIG. 35 shows transmission electron diffraction patterns of a sample.
Figure 36A:
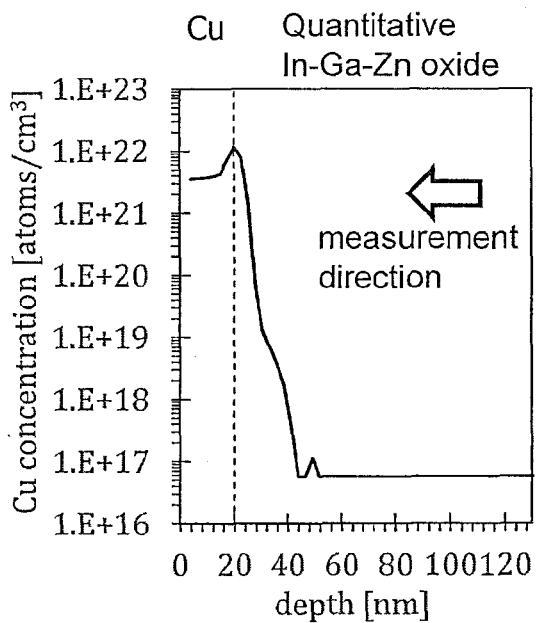
FIGS. 36A to 36D each show a profile of copper concentration with respect to the depth of a sample.
Figure 36B:
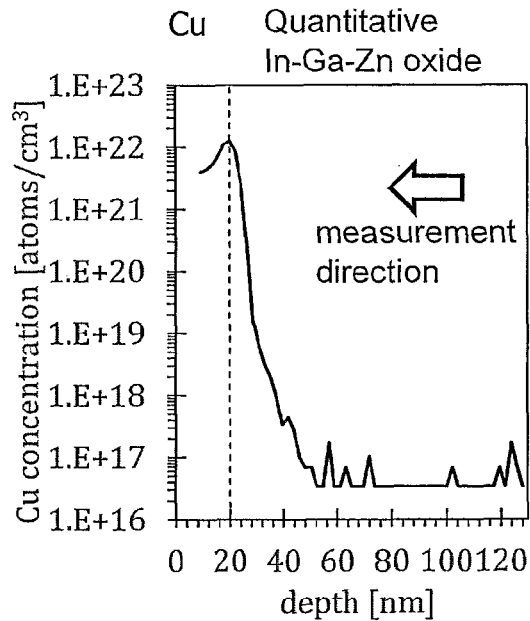
Figure 36C:
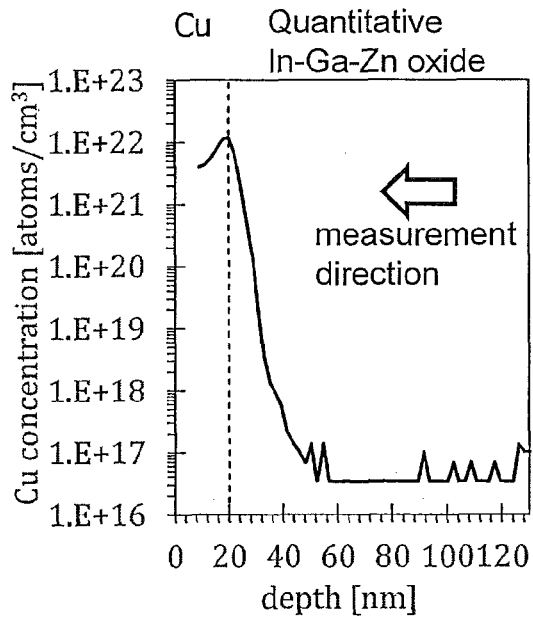
Figure 36D:
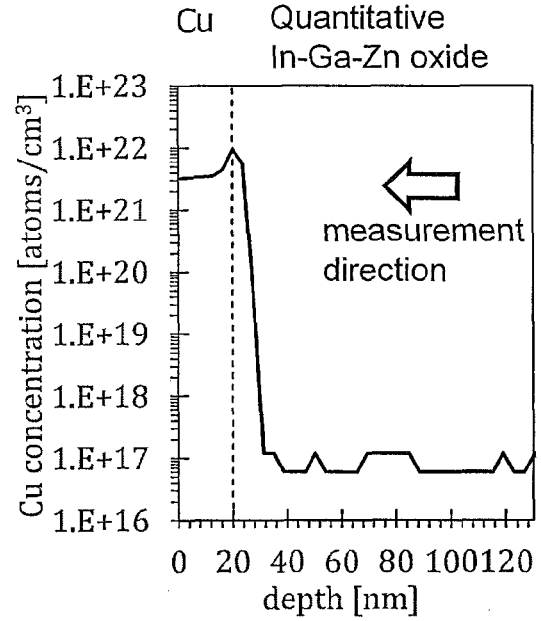

The transmission electron diffraction pattern at each time is shown in FIG. 35. As shown in FIG. 35, after 65 sec, a transmission electron diffraction pattern showing at least two kinds of structures was observed. Furthermore, after 36 sec and 53 sec, a transmission electron diffraction pattern showing a structure different from that of the structure peculiar to a CAAC-OS film was observed.

Therefore, it turned out that Sample 8 had one grain boundary and two regions having a structure different from the structure peculiar to a CAAC-OS film in the measurement area (approximately 700 nm). It was found that Sample 8 had a small number of grain boundaries and a small number of regions having a structure different from the structure peculiar to a CAAC-OS film, as compared to Sample 2.

A possible reason why Samples 7 and 8 have a reduced number of defects such as grain boundaries as compared to Samples 1 to 3 is because under the conditions, the columnar zinc oxide clusters are less likely to be taken in the films.

Next, diffusion of copper in the following samples including Sample 8 was evaluated.

First, samples were formed in such a manner that a copper film was formed on the In—Ga—Zn oxide film of each of Samples 4, 5, 6, or 8. After formation of the copper film, heat treatment was performed at 350° C. for one hour at an atmosphere containing nitrogen and oxygen at a volume ratio of 2:8, and then diffusion of copper was evaluated. Note that Samples 4, 5, 6, and 8 were deposited at a pressure lower than that of Sample 2, and thus generation of a defect due to a columnar zinc oxide cluster taken in the film is less likely to occur in such conditions.

To evaluate diffusion of copper, the samples were subjected to SIMS while the films were etched from the glass substrate side. FIGS. 36A to 36D show copper concentration profiles with respect to the depth. Note that FIGS. 36A, 36B, 36C, and 36D correspond to Sample 4, Sample 5, Sample 6, and Sample 8, respectively.

The results indicate that diffusion of copper was reduced in any sample as compared to FIGS. 29A to 29C. Therefore, it is found that, for example, in order to block diffusion of copper (make the copper concentration less than $1 \times 10^{18}$ atoms/cm$^3$) in the conditions, the thickness of the In—Ga—Zn oxide film of each of Samples 4, 5, 6, and 8 needs to be greater than or equal to 20 nm.

Therefore, like in Sample 8, the In—Ga—Zn oxide film in which defects such as grain boundaries are reduced has a function of blocking diffusion of copper. Moreover, since defects are reduced, when the In—Ga—Zn oxide film is used as a semiconductor film of a transistor, an excellent electrical characteristics and high reliability can be achieved.

This application is based on Japanese Patent Application serial no. 2013-161427 filed with Japan Patent Office on Aug. 2, 2013, the entire contents of which are hereby incorporated by reference.

What is claimed is:

1. An oxide semiconductor film over a substrate, the oxide semiconductor film comprising a region having five or less areas,
   wherein the oxide semiconductor film is a crystalline oxide semiconductor film, and
   wherein a transmission electron diffraction pattern showing discontinuous points is observed in the five or less areas when an observation area is changed one-dimensionally within a range of 700 nm, using a transmission electron diffraction apparatus with an electron beam having a probe diameter of 1 nm.

2. The oxide semiconductor film according to claim 1, wherein the oxide semiconductor film comprises indium.

3. The oxide semiconductor film according to claim 1, wherein the oxide semiconductor film comprises indium, gallium, and zinc.

4. The oxide semiconductor film according to claim 1, wherein the oxide semiconductor film comprises a crystal in which a c-axis is substantially perpendicular to a surface of the oxide semiconductor film.

5. The oxide semiconductor film according to claim 4, wherein an angle between the c-axis and the surface of the oxide semiconductor film is greater than or equal to 80° and less than or equal to 100°.

6. An oxide semiconductor film over a substrate, the oxide semiconductor film comprising alignment at a (00x) plane,
   wherein x is a natural number,
   wherein the oxide semiconductor film is a crystalline oxide semiconductor film,
   wherein the oxide semiconductor film comprises a region having eight or less areas, and
   wherein a transmission electron diffraction pattern including a plane other than the (00x) plane with respect to an incident direction <010> is observed in the eight or less areas, when an observation area is changed one-dimensionally within a range of 700 nm, using a transmission electron diffraction apparatus with an electron beam having a probe diameter of 1 nm.

7. The oxide semiconductor film according to claim 6, wherein the oxide semiconductor film comprises indium.

8. The oxide semiconductor film according to claim 6, wherein the oxide semiconductor film comprises indium, gallium, and zinc.

9. The oxide semiconductor film according to claim 6, wherein the oxide semiconductor film comprises a crystal in which a c-axis is substantially perpendicular to a surface of the oxide semiconductor film.

10. The oxide semiconductor film according to claim 9, wherein an angle between the c-axis and the surface of the oxide semiconductor film is greater than or equal to 80° and less than or equal to 100°.

11. A semiconductor device comprising:
    a substrate;
    a gate electrode over the substrate;
    an oxide semiconductor film; and
    a gate insulating film between the gate electrode and the oxide semiconductor film,
    wherein the oxide semiconductor film is a crystalline oxide semiconductor film,
    wherein the oxide semiconductor film comprises a region having five or less areas, and
    wherein a transmission electron diffraction pattern showing discontinuous points is observed in the five or less areas when an observation area is changed one-dimensionally within a range of 700 nm, using a transmission electron diffraction apparatus with an electron beam having a probe diameter of 1 nm.

12. The semiconductor device according to claim 11, wherein the oxide semiconductor film comprises indium.

13. The semiconductor device according to claim 11, wherein the oxide semiconductor film comprises indium, gallium, and zinc.

14. The semiconductor device according to claim 11, wherein the oxide semiconductor film comprises a crystal in which a c-axis is substantially perpendicular to a surface of the oxide semiconductor film.

15. The semiconductor device according to claim 14, wherein an angle between the c-axis and the surface of the oxide semiconductor film is greater than or equal to 80° and less than or equal to 100°.

16. A semiconductor device comprising:
a substrate;
a gate electrode over the substrate;
an oxide semiconductor film; and
a gate insulating film between the gate electrode and the oxide semiconductor film,
wherein the oxide semiconductor film is a crystalline oxide semiconductor film,
wherein the oxide semiconductor film comprises alignment at a (00x) plane,
wherein x is a natural number,
wherein the oxide semiconductor film comprises a region having eight or less areas, and
wherein a transmission electron diffraction pattern including a plane other than the (00x) plane with respect to an incident direction <010> is observed in the eight or less areas, when an observation area is changed one-dimensionally within a range of 700 nm, using a transmission electron diffraction apparatus with an electron beam having a probe diameter of 1 nm.

17. The semiconductor device according to claim 16, wherein the oxide semiconductor film comprises indium.

18. The semiconductor device according to claim 16, wherein the oxide semiconductor film comprises indium, gallium, and zinc.

19. The semiconductor device according to claim 16, wherein the oxide semiconductor film comprises a crystal in which a c-axis is substantially perpendicular to a surface of the oxide semiconductor film.

20. The semiconductor device according to claim 19, wherein an angle between the c-axis and the surface of the oxide semiconductor film is greater than or equal to 80° and less than or equal to 100°.

* * * * *